United States Patent
Bhatia et al.

(10) Patent No.: US 12,020,774 B2
(45) Date of Patent: Jun. 25, 2024

(54) METHODS AND SYSTEMS FOR SELECTIVELY ENABLING/DISABLING MEMORY DIES

(71) Applicant: SanDisk Technologies LLC, Addison, TX (US)

(72) Inventors: Sneha Bhatia, Bangalore (IN); Sajal Mittal, Bangalore (IN); Venkatesh Prasad Ramachandra, San Jose, CA (US); Anil Pai, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 185 days.

(21) Appl. No.: 17/832,479

(22) Filed: Jun. 3, 2022

(65) Prior Publication Data
US 2023/0395108 A1 Dec. 7, 2023

(51) Int. Cl.
*G11C 7/22* (2006.01)
*G11C 7/10* (2006.01)

(52) U.S. Cl.
CPC ............ *G11C 7/222* (2013.01); *G11C 7/1039* (2013.01); *G11C 7/1063* (2013.01); *G11C 7/109* (2013.01)

(58) Field of Classification Search
CPC ...... G11C 7/222; G11C 7/1039; G11C 7/1063
USPC ........................................................ 365/233.1
See application file for complete search history.

(56) References Cited

U.S. PATENT DOCUMENTS

| | | | | |
|---|---|---|---|---|
| 10,504,606 | B2 * | 12/2019 | Kwon | G11C 29/38 |
| 2002/0003748 | A1 * | 1/2002 | Fujita | G11C 7/1072 365/233.1 |
| 2007/0280032 | A1 * | 12/2007 | Kwak | G11C 8/10 365/233.5 |

\* cited by examiner

*Primary Examiner* — Anthan Tran
(74) *Attorney, Agent, or Firm* — Sheppard, Mullin, Richter & Hampton LLP

(57) ABSTRACT

Systems and methods disclosed herein provide for selectively activating or deactivating one or more memory of a memory array, such that related data path logic of deactivated memory dies neither detects nor processes control signals or data signals for data operations. Examples of the systems and methods provided herein operate to detect a first enable signal at a memory die and detect a first data signal on input/output (I/O) receivers of the memory die. Responsive to detecting at least the first enable signal, a bit value encoded in the first data signal is latched to obtain a first bit pattern. A second bit pattern is obtained, and, based on a comparison of the first bit pattern to the second bit pattern, the I/O receivers of the memory die are activated.

20 Claims, 25 Drawing Sheets

METHODS AND SYSTEMS FOR SELECTIVELY ENABLING/DISABLING MEMORY DIES

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Flash memories may employ die stacking to achieve increased capacities per a flash memory package. Die stacking generally includes stacking a plurality of silicon wafers or memory dies and interconnecting them, for example, using through-silicon vias or copper to copper connections. Die stacking in this way enables the dies to behave as a single device to achieve performance improvements at reduced power and smaller footprint than conventional two dimensional processes.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
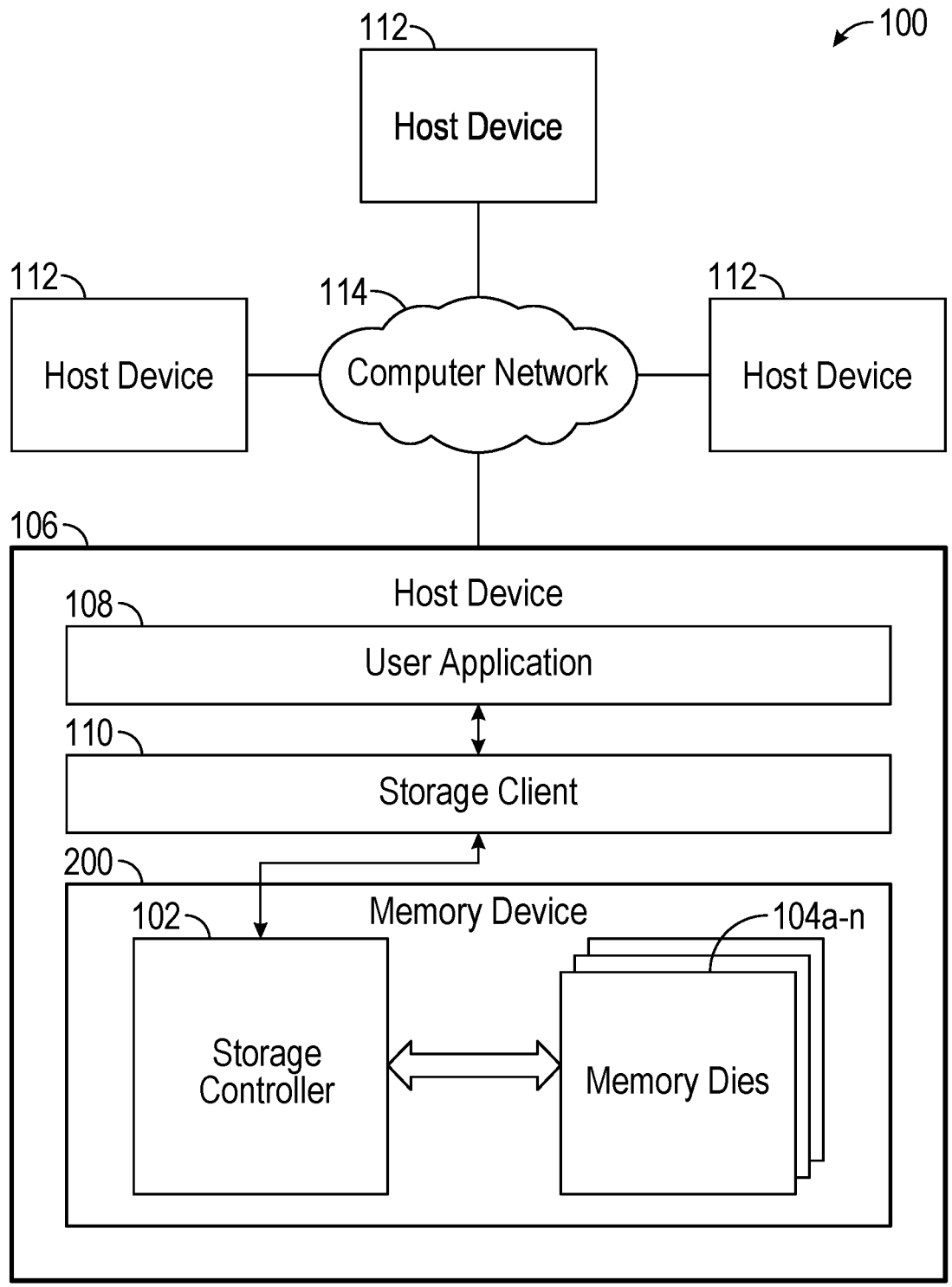
FIG. 1 is a block diagram of an example memory system, in connection with which, example embodiments of the disclosed technology can be implemented.

The figures are not exhaustive and do not limit the present disclosure to the precise form disclosed.

DETAILED DESCRIPTION

As introduced above, die stacking enables the memory dies to behave as a single memory device to achieve performance improvements at reduced power and smaller footprint than conventional two dimensional processes. Die stacking generally uses control signals provided by a controller to enable memory dies and related data path logic using control signals, such as a chip enable (CE) signal. However, current implementations utilize control signals applied to the entire stack (or memory array as used herein), which are received by each memory die and processed using the related data path logic of each memory die. In the current state of non-volatile flash memory technologies, this operation consumes approximately 5 mW of power per memory die. For an eight die stack, this translates to at least 40 mW of power consumed by the stack. Furthermore, as the state of the technology advances from one generation to the next, the power consumed per memory die is expected to increase, at least because the circuitry and complexity is expanded, thereby consuming increasing amounts of power to maintain the standby state as described above.

Embodiments of the disclosed technology relate to systems, devices, circuits, methods, computer-readable media, and techniques for selectively activating or deactivating one or more memory of a memory array, such that the related data path logic of deactivated memory dies neither detects nor processes control signals or data signals for data operations. That is, the deactivated memory devices are unresponsive to command/address sequencing operations or data in (DIN)/data out (DOUT) operations for data operations.

According to example embodiments of the disclosed technology, one or more enable signals are detected at memory dies of a memory array. Responsive to the one or more enable signals, the memory dies obtain a first bit pattern encoded into a first data signal, which is detected on input/output (I/O) receivers of each memory die. A second bit pattern for each memory die is detected, and based on a comparison of the first bit pattern to the second bit pattern, the I/O receivers of each memory die are activated or deactivated. For example, the first bit pattern may be indicative of one or more selected memory dies and the second bit pattern identifies a memory die. The comparison of the first bit pattern to the second bit pattern includes a determination as to whether a memory die identified by the first bit pattern is one of the memory dies indicated in the first bit pattern. If the determination is affirmative, then embodiments herein activate the I/O receivers of the memory dies. However, if the determination is negative, then embodiments herein deactivate the I/O receivers. In some embodiments, the one or more enable signals are provided in a die switch command (referred to herein as a die switch operation code or die switch opcode), and includes a command latch enable signal and an address latch enable signal set to logic HIGH level. The first bit pattern may be representative of an address code indicative of one or more selected memory dies of the memory array for executing data operations and the second bit pattern identifies each respective memory die. As such, the selected memory dies are activated or enabled for data operations, while unselected memory dies are deactivated.

By deactivating the I/O receivers unselected memory dies, power consumption during idle or standby is reduced (or eliminated). That is, power consumption by data path logic of unselected memory dies in processing control signals can avoided by deactivating the unselected memory dies, and ensuring that data path logic of the unselected memory dies are unresponsive to incoming control signals.

Accordingly, embodiments disclosed herein provide a technical solution by selectively enabling or disabling one or more memory dies, of a memory array, such that only selected memory dies process incoming control signals while unselected dies are unresponsive to incoming the data operations. The embodiments herein provide for generating an additional control signal (referred to herein as a die switch opcode signal) that enables or disables one or more memory dies of the memory array without requiring command/address sequencing. As used herein, "enable" and/or "activate" refers to connecting power to the memory die so that it can accept the incoming data and perform data operations (e.g., command/address sequencing operations or data in (DIN)/data out (DOUT) operations). For example, a storage controller transmits the die switch opcode identifying one or more memory dies for executing the forthcoming data operation. A new decoder (referred to herein as die enable decoder block) can be provided in each memory die, which enables selected memory die(s) and disables unselected memory die(s) based on the die switch opcode. By disabling unselected memory dies according to embodiments of the technology disclosed herein, power consumption during an idle or standby state can be reduced per each die, while at the same time, reducing the chip foot-print (e.g., reduced impact on chip real-estate). For example, power savings of approximately 80% per die were observed from analysis using the disclosed technology. Further, as the state of the art advances, the power savings achieved by the disclosed technology will similarly increase. [[***Inventors: I will update the above following the answer to my earlier question.]]

FIGS. 1 to 4G depict an example memory system that can be used to implement the technology disclosed herein. FIG. 1 is a schematic block diagram illustrating a memory system 100. The memory system 100 includes a memory device 200 (also referred to herein as a storage device), a host device 106, at least one host device 112, and a computer network 114.

The host device 106 may be a computing device (e.g., laptop, desktop, smartphone, tablet, digital camera, wearable smart device, and so on) that includes one or more processors and readable storage devices (such as, but not limited to, RAM, ROM, flash memory, hard disk drive, solid state memory) that store processor readable code (also referred to herein as instructions or software) for programming storage controller 102 to perform the methods described herein. The host device 106 may also include additional system memory, one or more input/output interfaces, and/or one or more input/output devices in communication with the one or more processors, as well as other components well known in the art.

The memory system 100 includes at least one memory device 200, comprising the storage controller 102 and a plurality of memory dies 104. "Storage controller" refers to any hardware, device, component, element, or circuit configured to manage data operations on non-volatile memory media, and may comprise one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

In some embodiments, the memory system 100 may include two or more memory devices. Each memory device 200 may include a plurality of memory dies 104, such as flash memory, nano random access memory ("nano RAM or NRAM"), magneto-resistive RAM ("MRAM"), dynamic RAM ("DRAM"), phase change RAM ("PRAM"), etc. The data memory device 200 may also include other types of non-volatile and/or volatile data storage, such as dynamic RAM ("DRAM"), static RAM ("SRAM"), magnetic data storage, optical data storage, and/or other data storage technologies.

The memory device 200 may be a component within a host device 106 as depicted in FIG. 1, and may be connected using a system bus, such as a peripheral component interconnect express ("PCI-e") bus, a Serial Advanced Technology Attachment ("serial ATA") bus, or the like. In another embodiment, the memory device 200 may be external to the host device 106 and is connected via a wired connection, such as, but not limited to, a universal serial bus ("USB") connection, an Institute of Electrical and Electronics Engineers ("IEEE") 1394 bus ("FireWire"), or the like. In other embodiments, the memory device 200 may be connected to the host device 106 using a peripheral component interconnect ("PCI") express bus using external electrical or optical bus extension or bus networking solution such as Infiniband or PCI Express Advanced Switching ("PCIe-AS"), or the like.

In various embodiments, the memory device 200 may be in the form of a dual-inline memory die ("DIMM"), a daughter card, or a micro-module. In another embodiment, the memory device 200 may be a component within a rack-mounted blade. In another embodiment, the memory device 200 may be contained within a package that is integrated directly onto a higher level assembly (e.g., mother-board, laptop, graphics processor, etc.). In another embodiment, individual components comprising the memory device 200 may be integrated directly onto a higher level assembly without intermediate packaging.

In some embodiments, instead of directly connected to the host device 106 via a wired connection, the data memory device 200 may be connected to the host device 106 over a wireless connection. For example, the data memory device 200 may include a storage area network ("SAN") storage device, a network attached storage ("NAS") device, a network share, or the like. In some embodiments, the memory system 100 may be connected to the host via a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host device 106 and the data memory device 200.

The memory system 100 includes at least one host device 106 connected to the memory device 200. Multiple host devices may be used and may comprise a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. "Computer" refers to any computing device. Examples of a computer include, but are not limited to, a personal computer, a laptop, a tablet, a desktop, a server, a main frame, a supercomputer, a computing node, a virtual computer, a hand held device, a smart phone, a cell phone, a system on a chip, a single chip computer, and the like. In another embodiment, a host device 106 may be a client and the memory device 200 may operate autonomously to service data requests sent from the host device 106. In this embodiment, the host device 106 and memory device 200 may be connected using a computer network, system bus, DAS or other communication means suitable for connection between a computer and an autonomous memory device 200.

The illustrative example shown in FIG. 1, the memory system 100 includes a user application 108 in communication with a storage client 110 as part of the host device 106. "Application" refers to any software that is executed on a device above a level of the operating system. An application will typically be loaded by the operating system for execution and will make function calls to the operating system for lower-level services. An application often has a user interface, but this is not always the case. Therefore, the term 'application' includes background processes that execute at a higher level than the operating system.

"Operating system" refers to logic, typically software, that supports a device's basic functions, such as scheduling tasks, managing files, executing applications, and interacting with peripheral devices. In normal parlance, an application is said to execute "above" the operating system, meaning that the operating system is necessary in order to load and execute the application and the application relies on modules of the operating system in most cases, not vice-versa. The operating system also typically intermediates between applications and drivers. Drivers are said to execute "below" the operating system because they intermediate between the operating system and hardware components or peripheral devices.

In various embodiments, the user application 108 may be a software application operating on or in conjunction with the storage client 110. The storage client 110 manages files and data and utilizes the functions and features of the storage controller 102 and associated memory dies 104. "File" refers to a unitary data structure for storing, retrieving, and communicating data and/or instructions. A file is distinguished from other types of packaging by having associated management metadata utilized by the operating system to identify, characterize, and access the file. Representative examples of storage clients include, but are not limited to, a server, a file system, an operating system, a database management system ("DBMS"), a volume manager, and the like. The storage client 110 may be in communication with the storage controller 102 within the memory device 200.

In various embodiments, the memory system 100 may include one or more clients connected to one or more host device 112 through one or more computer networks 114. A host device 112 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 114 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 114 may also include a network from the IEEE 802 family of network technologies, such Ethernet, token ring, Wi-Fi, WiMax, and the like.

The computer network 114 may include servers, switches, routers, cabling, radios, and other equipment used to facilitate networking the host device 106 or host devices and host devices 112 or clients. In some embodiments, the memory system 100 may include one or more host devices 112 and host device 106 that communicate as peers over a computer network 114. In other embodiments, the memory system 100 may include multiple memory devices 200 that communicate as peers over a computer network 114. One of skill in the art will recognize other computer networks comprising one or more computer networks and related equipment with single or redundant connection(s) between one or more clients or other computer with one or more memory devices 200 or one or more memory devices 200 connected to one or more host devices. In one embodiment, the memory system 100 may include two or more memory devices 200 connected through the computer network 114 to a host device 112 without a host device 106.

In some embodiments, the storage client 110 communicates with the storage controller 102 through a host device interface comprising an Input/Output (I/O) interface. "Interface" refers to a protocol and associated circuits, circuitry, components, devices, systems, sub-systems, and the like that enable one device, component, or apparatus to interact and/or communicate with another device, component, or apparatus. For example, the memory device 200 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

In certain embodiments, the storage media of a memory device is divided into volumes or partitions. Each volume or partition may include a plurality of sectors. A sector of data is typically 512 bytes, corresponding to the size of a sector in magnetic disk drives.

In various embodiments number of sectors form a block (or data block), anywhere from 8 sectors, which is 4 KB, for example, up to 32, 64, 128 or more sectors. Different sized blocks and sectors can also be used. In certain storage systems, such as those interfacing with the Windows® operating systems, the data blocks may be referred to as clusters. In other storage systems, such as those interfacing with UNIX, Linux, or similar operating systems, the data blocks may be referred to simply as blocks. A block or data block or cluster represents a smallest physical amount of storage space on the storage media that is managed by a storage manager, such as a storage controller, storage system, storage unit, storage device, or the like.

In some embodiments, the storage controller 102 may be configured to store data on one or more asymmetric, write-once storage media, such as solid-state storage memory cells within the memory die(s) 104. As used herein, a "write once" storage media refers to storage media that is reinitialized (e.g., erased) each time new data is written or programmed thereon. As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media).

Management of a data block by a storage manager may include specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition. In conventional block storage devices, a logical address, also referred to as a logical block address (LBA), maps directly to a particular data block on physical storage media. In conventional block storage devices, each data block maps to a particular set of physical sectors on the physical storage media.

However, certain storage devices need not directly or necessarily associate logical addresses with particular physical data blocks. These storage devices may emulate a conventional block storage interface to maintain compatibility with a block storage client 110.

In some embodiments, the storage controller 102 may provide a block I/O emulation layer, which serves as a block device interface, or API. In these embodiments, the storage client 110 communicates with the storage device through this block device interface. The block I/O emulation layer may receive commands and logical addresses from the storage client 110 in accordance with this block device interface. As a result, the block I/O emulation layer may provide the storage device compatibility with a block storage client 110.

In some embodiments, a storage client 110 communicates with the storage controller 102 through a host device interface comprising a direct interface. In these embodiments, the memory device 200 directly exchanges information specific to non-volatile storage devices. Memory device 200 using direct interface may store data in the memory die(s) 104 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die(s) 104.

The storage controller 102 may receive a logical address and a command from the storage client 110 and perform the corresponding operation in relation to the memory die(s) 104. The storage controller 102 may support block I/O emulation, a direct interface, or both.

Figure 2A:
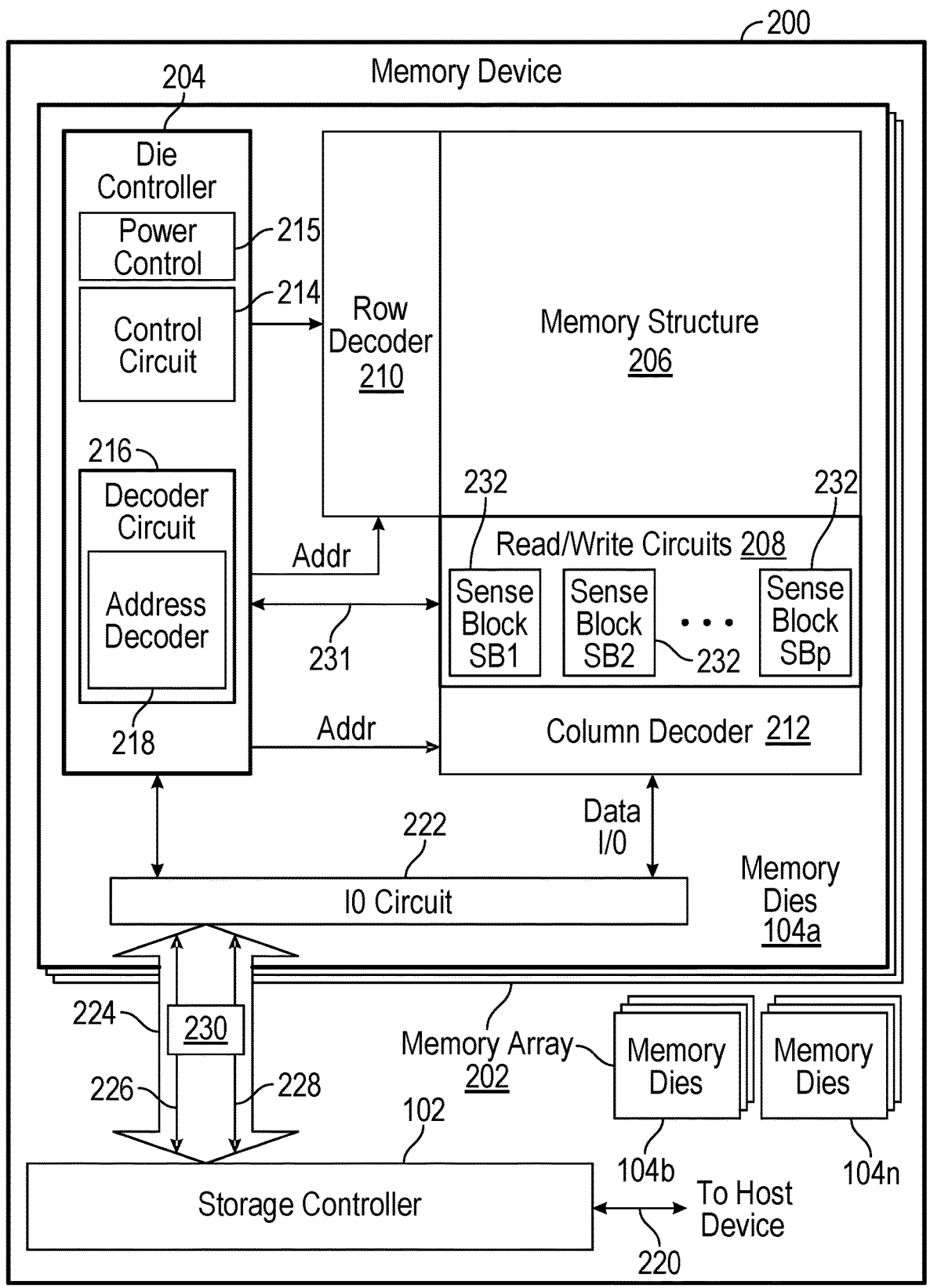
FIG. 2A is a block diagram of an example memory device, in connection with which, example embodiments of the disclosed technology can be implemented.

FIG. 2A is a functional block diagram of an example memory device 200. The components depicted in FIG. 2A are electrical circuits.

The memory device 200 may include a storage controller 102 and a memory array 202 comprised of a number of memory dies 104a-n, the storage controller 102 and memory dies 104a-n being effectively as described with regard to FIG. 1. Each memory die 104a-n can be a complete memory die or a partial memory die and may include a die controller 204, at least one memory structure 206, and read/write circuits 208. The following description will be made with reference to memory die 104a as an example of memory dies 104a-n, where each memory die may include same or similar components and function in the same or similar way. Thus, while reference herein is made to memory die 104a, the same description may be applied equally to memory dies 104b-n.

In this context, "memory array" refers to a set of memory cells (also referred to as storage cells) organized into an array structure having rows and columns. A memory array is addressable using a row identifier and a column identifier, each represented as part of an address, such as a column or row address. A non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

Those of skill in the art recognize that a memory array may comprise the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

In the context of FIG. 2A, memory structure 206 may be addressable by wordlines via a row decoder 210 and by bitlines via a column decoder 212. The read/write circuits 208 include multiple sense blocks 232 including SB1, SB2, . . . , SBp (sensing circuitry) and allow a pages of memory cells to be read or programmed in parallel. Also, many strings of memory cells can be erased in parallel.

"Circuitry", as used herein, refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

A physical page may include memory cells along a row of the memory array for a single plane or for a single memory die. In some embodiments, each memory die 104*a-n* includes a memory array made up of two equal sized planes. A plane is a division of the memory array that permits certain storage operations to be performed on both places using certain physical row addresses and certain physical column addresses. In one embodiment, a physical page of one plane of a memory die includes four data blocks (e.g., 16 KB). In one embodiment, a physical page (also called a "die page") of a memory die includes two planes each having four data blocks (e.g., 32 KB).

The memory structure 206 can be two-dimensional (2D—laid out in a single fabrication plane) or three-dimensional (3D—laid out in multiple fabrication planes). The non-volatile memory array 202 may comprise one or more arrays of memory cells including a 3D array. In one embodiment, the non-volatile memory array 202 may comprise a monolithic three-dimensional memory structure (3D array) in which multiple memory levels are formed above (and not in) a single substrate, such as a wafer, with no intervening substrates. The non-volatile memory array 202 may comprise any type of non-volatile memory that is monolithically formed in one or more physical levels of arrays of memory cells having an active area disposed above a silicon substrate. The non-volatile memory array 202 may be in a non-volatile solid state drive having circuitry associated with the operation of the memory cells, whether the associated circuitry is above or within the substrate. Word lines may comprise sections of the layers containing memory cells, disposed in layers above the substrate. Multiple word lines may be formed on single layer by means of trenches or other non-conductive isolating features.

The die controller 204 (also referred to as a die control circuitry) cooperates with the read/write circuits 208 to perform memory operations on memory cells of the non-volatile memory array 202 and includes a control circuit 214 (also referred to as a state machine), a decoder circuit 216 that may incorporate an address decoder 218, and a power control circuit 215. The control circuit 214 provides chip-level control of memory operations on the memory die 104*a*. The die controller 204 may also include power control circuit 215 that controls the power and voltages supplied to the wordlines, bitlines, and select lines during memory operations. The power control circuit 215 may include voltage circuitry, in one embodiment. Power control circuit 215 may include charge pumps for creating voltages. The sense blocks 232 include bitline drivers. The power control circuit 215 executes under control of the control circuit 214, in various embodiments.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. In one example, the die controller may include buffers such as registers, read-only memory (ROM) fuses and other storage devices for storing default values such as base voltages and other parameters.

"Control circuit" refers to a device, component, element, module, system, sub-system, circuitry, logic, hardware, or circuit configured and/or operational to manage one or more other circuits. For example, a controller programmed by firmware to perform the functions described herein is one example of a control circuit. A control circuit can include a processor, a PGA (Programmable Gate Array), an FPGA (Field Programmable Gate Array), an ASIC (Application Specific Integrated Circuit), or another type of integrated circuit or circuit more generally. In certain embodiments, a control circuit is responsible to ensure that primary features and functionality of a larger circuit, die, or chip, that includes the control circuit, perform properly. The address decoder 218 provides an address interface between that used by the host or a storage controller 102 to the hardware address used by the row decoder 210 and column decoder 212. Power control circuit 215 controls the power and voltages supplied to the wordlines, bitlines, and select lines during memory operations. The power control circuit 215 includes voltage circuitry, in one embodiment. The power control circuit 215 executes under control of the control circuit 214, in one embodiment.

Commands and data are transferred between the host device and storage controller 102 via a data bus 220, and between the storage controller 102 and an input/output (IO) circuit 222 on each of the memory dies 104*a-n* via a memory interface 224. The memory interface 224 may be a type of communication bus, comprising a control bus 226 and a data bus 228 (also referred to herein as I/O data bus), over which fixed length command sequences 230 may be transmitted. The command bus may comprise, for example but not limited to, a command bus over which commands are transmitted to the memory die 104*a* and an address bus over which addresses are transmitted to the memory die 104*a*. "Memory interface" refers to an interface between a memory die and a storage controller. Examples of memory interface that may be used in connection with the disclosed solution include Toggle Mode ("TM"), Toggle NAND 2.0, Open NAND Flash Interface (ONFI) NAND, a vendor specific interface, a proprietary interface, and the like. In the depicted embodiment, the memory interface 224 is a proprietary interface configured to transfer fixed length command sequences 230.

"Communication bus" refers to hardware, software, firmware, logic, control line(s), and one or more associated communication protocols, that are configured to enable a sender to send data to a receiver. A communication bus may include a data bus and/or a control bus.

"Firmware" refers to logic embodied as processor-executable instructions stored on volatile memory media and/or non-volatile memory media.

"Data bus" refers to a communication bus used to exchange one or more of data bits between two electronic circuits, components, chips, die, and/or systems. A data bus may include one or more signal/control lines. A sender, such as a controller, may send data signals over one or more control lines of the data bus in parallel (operating as a parallel bus) or in series (operating as a serial bus). A data bus may include the hardware, control line(s), software, firmware, logic, and/or the communication protocol used to operate the data bus.

Examples data buses may include 8-bit buses having 8 control lines, 16-bit buses having 16 control lines, 32-bit buses having 32 control lines, 64-bit buses having 64 control lines, and the like. Control lines may carry exclusively communication data, exclusively address data, exclusively control data, or any combination of these types of data.

In various embodiments, a single data bus may be shared by a plurality of components, such as memory die. When multiple chips or memory dies share a data bus, that data may be accessed or transferred by a single memory die or by all the memory dies in parallel based on signals on a chip enable control line.

A data bus may operate, and be configured, according to an industry standard or based on a proprietary protocol and design. Multiple control line of a data bus may be used in parallel and may latch data into latches of a destination component according to a clocking signal, data strobe signal ("DQS"), or clock, such as strobe signal. In certain embodiments, a control bus and a data bus together may form a communication bus between a sender and a receiver.

"Control bus" refers to a communication bus used to exchange one or more of data, address information, control signals, clock signals, and the like, between two electronic circuits, components, chips, die, and/or systems. A control bus may comprise 1 or more control lines, be configured to operate as a parallel bus or a serial bus, and may include the hardware, control line(s), software, firmware, logic, and/or the communication protocol used to operate the control bus. Typically, a control bus sends control signals to one or more memory die to manage operations on the memory die.

In certain embodiments, the control bus sends control signals such as, for example, one or more of, a write enable ("WEn"), chip enable ("CEn"), read enable ("REn"), a clock signal, strobe signal ("DQS"), command latch enable ("CLE"), address latch enable ("ALE"), and the like.

In certain embodiments, the control bus may not transfer data relating to a storage operation, such as write data or read data. Instead, write data and read data may be transferred over a data bus. In certain embodiments, a control bus and a data bus together may form a communication bus between a sender and a receiver.

The address decoder 218 of the die controller 204 may be coupled to the memory structure 206 in order to identify a location within the memory structure 206 for a storage command. In particular, the address decoder 218 determines a row identifier and a column identifier which together identifies the location within the memory structure 206 that applies to a storage command associated with a command address. The storage command and command address are received in a fixed length command sequence.

The input/output (IO) circuit 222 may be coupled, through the memory interface 224 and to the memory interface circuit 234 of the storage controller 102, to a data bus 220 in order to receive a fixed length command sequence 230. The decoder circuit 216 of the die controller 204 may be coupled through the input/output (IO) circuit 222 to a control bus 226 to receive fixed length command sequences 230 over the data bus 220 via memory interface circuit 234. In one embodiment, the data bus 220 may comprise eight control lines, each configured to transfer one bit in parallel across the data bus 220.

The decoder circuit 216 may decode a command address and a storage command from a fixed length command sequence. The control circuit 214 of the die controller 204 may be coupled to the input/output (IO) circuit 222 and decoder circuit 216 and may generate control signals 231 to execute storage commands decoded by the decoder circuit 216. "Control signal" refers to an electrical signal (wired or wireless) sent from one device, component, manager, or controller to another device, component, manager, or controller configured to act in response to the control signal.

The read/write circuits 208 may be coupled to the non-volatile memory array 202 and the control circuit 214 in order to transfer data between the non-volatile memory array 202 and the input/output (IO) circuit 222 in response to the storage commands.

In some implementations, some of the components can be combined. In various designs, one or more of the components (alone or in combination), other than memory structure 206, can be thought of as at least one control circuit or storage controller which is configured to perform the techniques described herein. For example, a control circuit may include any one of, or a combination of, storage controller 102, die controller 204, read/write circuits 208, column decoder 212, control circuit 214, decoder circuit 216, address decoder 218, sense blocks SB1, SB2, . . . , SBp, and so forth.

Associated circuitry may be required for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

In various embodiments, memory structure 206 comprises a three-dimensional (3D) memory array of non-volatile memory cells in which multiple memory levels are formed above a single substrate, such as a wafer. The memory structure may comprise any type of non-volatile memory monolithically formed in one or more physical levels of arrays of memory cells having an active area disposed above a silicon (or other type of) substrate. In one example, the non-volatile memory cells comprise vertical NAND strings with charge-trapping material. In another embodiment, memory structure 206 comprises a two-dimensional (2D) memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 206 is not limited to the examples above. Many different types of memory array architectures or memory technologies can be used to form memory structure 206. No particular non-volatile memory technology is required for purposes of the new claimed embodiments proposed herein. Other examples of suitable technologies for memory cells of the memory structure 206 include resistive random access memory (ReRAM) memories, magnetoresistive RAM (MRAM) memory (e.g., MRAM, Spin Transfer Torque MRAM, Spin Orbit Torque MRAM), phase change memory (PCM), and the like. Examples of suitable technologies for memory cell architectures of the memory structure 206 include 2D arrays, 3D arrays, cross-point arrays, stacked 2D arrays, vertical bitline arrays, and the like.

Cross point memory—one example of a ReRAM or PCM RAM—includes reversible resistance-switching elements arranged in cross point arrays accessed by X lines and Y lines (e.g., wordlines and bitlines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one that is relatively inert (e.g., tungsten) and the other of which is electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

MRAM stores data within magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device can be built from a grid of such memory cells. In one embodiment for programming, each memory cell lies between a pair of write lines arranged at right angles to each other, parallel to the cell, one above and one below the cell. When current is passed through them, an induced magnetic field is created.

PCM exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). As such, the programming doses are laser pulses. The memory cells can be inhibited by blocking the memory cells from receiving the light. Note that the use of "pulse" in this document does not require a square pulse, but also includes a continuous (or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
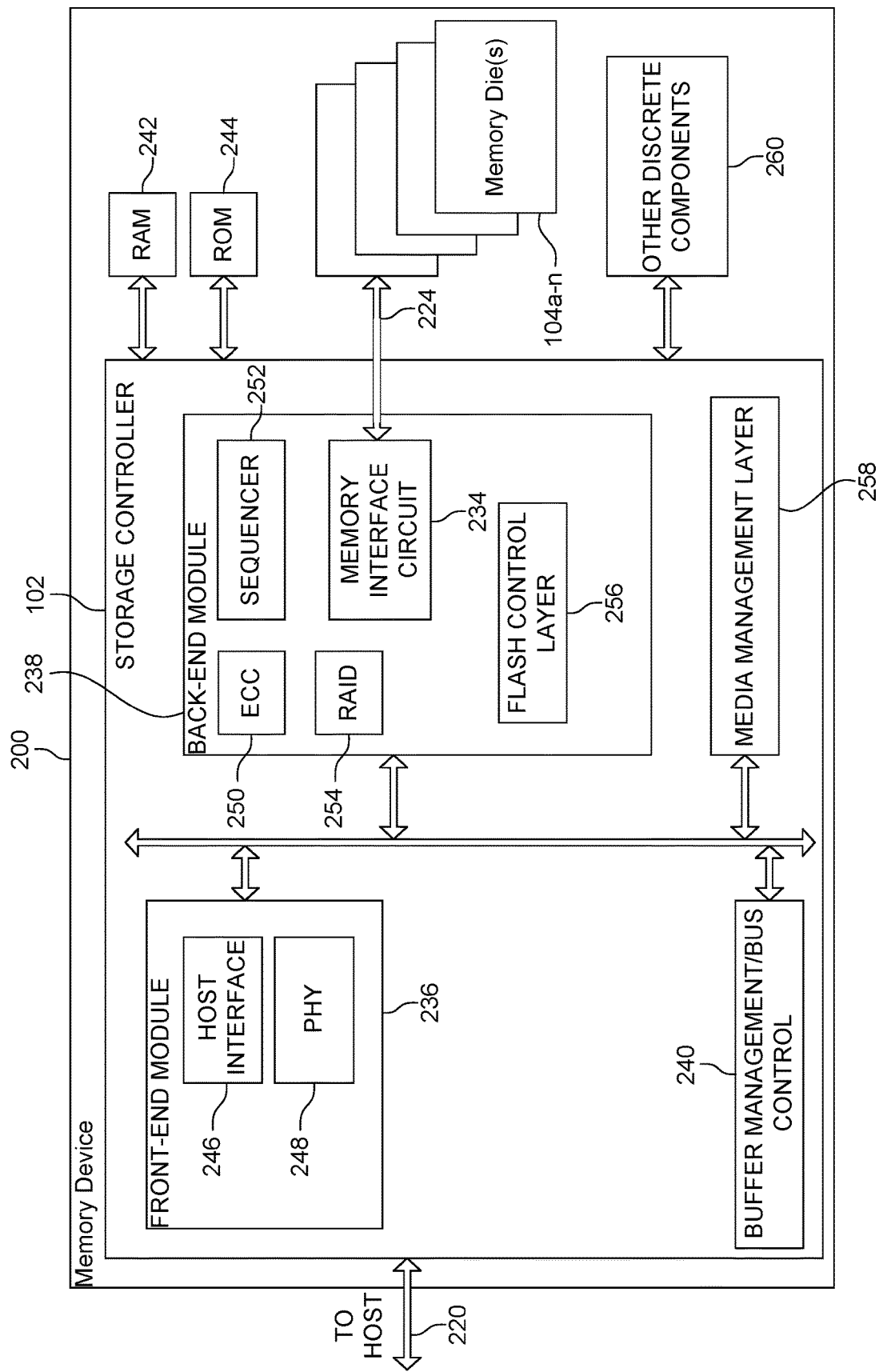
FIG. 2B is a block diagram of an example memory device that depicts more details of an example controller, in connection with which, example embodiments of the disclosed technology can be implemented.

FIG. 2B is a block diagram of example memory device 200 that depicts more details of one embodiment of controller 102. While the storage controller 102 in the embodiment of FIG. 2B is a flash memory controller, it should be appreciated that memory device 200 is not limited to flash memory. Thus, the storage controller 102 is not limited to the particular example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In an example operation, when a host needs to read data from or write data to the flash memory, it will communicate with the flash memory controller. If the host provides a logical address to which data is to be read/written, the flash memory controller can convert the logical address received from the host to a physical address in the flash memory. Alternatively, the host itself can provide the physical address. The flash memory controller can also perform various memory management functions including, but not limited to, wear leveling (distributing writes to avoid wearing out specific blocks of memory that would otherwise be repeatedly written to) and garbage collection (after a block is full, moving only the valid pages of data to a new block, so that the full block can be erased and reused).

The interface between storage controller 102 and memory dies 104 may be any suitable flash interface, such as Toggle Mode 200, 400, or 800. In one embodiment, memory device 200 may be a card-based system, such as a secure digital (SD) or a micro secure digital (micro-SD) card. In an alternate embodiment, memory system 100 may be part of an embedded memory system. For example, the flash memory may be embedded within the host. In other examples, memory device 200 can be a solid state drive (SSD).

In some embodiments, memory device 200 includes a single channel between storage controller 102 and memory die 108. However, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if only a single channel is shown in the drawings.

As depicted in FIG. 2B, storage controller 102 includes a front-end module 236 that interfaces with a host, a back-end module 238 that interfaces with the memory die 108, and various other modules that perform functions which will now be described in detail. The components of storage controller 102 depicted in FIG. 2B may take various forms including, without limitation, a packaged functional hardware unit (e.g., an electrical circuit) designed for use with other components, a portion of a program code (e.g., software or firmware) executable by a (micro) processor or processing circuitry that usually performs a particular function of related functions, a self-contained hardware or software component that interfaces with a larger system, or the like. For example, each module may include an ASIC, an FPGA, a circuit, a digital logic circuit, an analog circuit, a combination of discrete circuits, gates, or any other type of hardware or combination thereof. Alternatively or additionally, each module may include software stored in a processor readable device (e.g., memory) to program a processor to enable storage controller 102 to perform the functions described herein.

Referring again to modules of the storage controller 102, a buffer manager/bus control 240 manages buffers in RAM 242 and controls the internal bus arbitration of storage controller 102. ROM 244 stores system boot code. Although illustrated in FIG. 2B as located separately from the storage controller 102, in other embodiments, one or both of RAM 242 and ROM 244 may be located within the storage controller 102. In yet other embodiments, portions of RAM 242 and ROM 244 may be located within the storage controller 102, while other portions may be located outside the controller. Further, in some implementations, the storage controller 102, RAM 242, and ROM 244 may be located on separate semiconductor dies.

Front-end module 236 includes a host interface 246 and a physical layer interface (PHY) 248 that provide the electrical host interface via bus 220 with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back-end module 238 includes an error correction code (ECC) engine 250 that encodes the data bytes received from the host, and decodes and error corrects the data bytes read from the memory dies 104. A command sequencer 252 generates command sequences, such as program and erase command sequences, to be transmitted to memory dies 104. A RAID (Redundant Array of Independent Dies) module 254 manages generation of RAID parity and recovery of failed data. The RAID parity may be used as an additional level of integrity protection for the data being written into the memory device 200. In some cases, the RAID module 254 may be a part of the ECC engine 250. Note that the RAID parity may be added as one or more extra dies, or may be added within the existing die, e.g., as an extra plane, an extra block, or extra WLs within a block. As described above in connection with FIG. 2A, the memory interface circuit 234 provides command sequences 230 to memory die 104 and receives status information from memory die 104, via memory interface 224. A flash control layer 256 controls the overall operation of back-end module 238.

Additional components of memory device 200 illustrated in FIG. 2B include media management layer (MML) 258, which performs wear leveling of memory cells of memory dies 104, as well as, other discrete components 260, such as external electrical interfaces, external RAM, resistors, capacitors, or other components that may interface with storage controller 102. In alternative embodiments, one or more of the physical layer interface 248, RAID module 254, MML 258, or buffer management/bus controller 240 are optional components.

MML 258 (e.g., Flash Translation Layer (FTL)) may be integrated as part of the flash management for handling flash errors and interfacing with the host. In particular, MML 258 may be a module in flash management and may be responsible for the internals of NAND management. In particular, MML 258 may include an algorithm in the memory device firmware which translates writes from the host into writes to the memory structure 205 of each memory die 104. MML 258 may be needed because: 1) the memory structure 206 may have limited endurance; 2) the memory structure 206 may only be written in multiples of pages; and/or 3) the memory structure 206 may not be written unless it is erased as a block (or a tier within a block in some embodiments). MML 258 understands these potential limitations of the memory structure 206 which may not be visible to the host. Accordingly, MML 258 attempts to translate the writes from host into writes into the memory structure 206.

Storage controller 102 may interface with one or more memory dies 104. In one embodiment, storage controller 102 and multiple memory dies (together comprising non-volatile storage system 100) implement an SSD, which can emulate, replace, or be used in place of a hard disk drive inside a host, as a network access storage (NAS) device, in a laptop, in a tablet, in a server, etc. Additionally, the SSD need not be made to work as a hard drive.

Some embodiments of the memory device 200 may include one memory dies 104 connected to one storage controller 102. Other embodiments may include multiple memory dies 104 in communication with one or more controllers 102. In one example, the multiple memory dies 104 can be grouped into a set of memory packages. Each memory package may include one or more memory dies 104 in communication with storage controller 102. In one embodiment, a memory package includes a printed circuit board (or similar structure) with one or more memory dies 104 mounted thereon. In some embodiments, a memory package can include molding material to encase the memory dies 104 of the memory package. In some embodiments, storage controller 102 is physically separate from any of the memory packages.

Figure 2C:
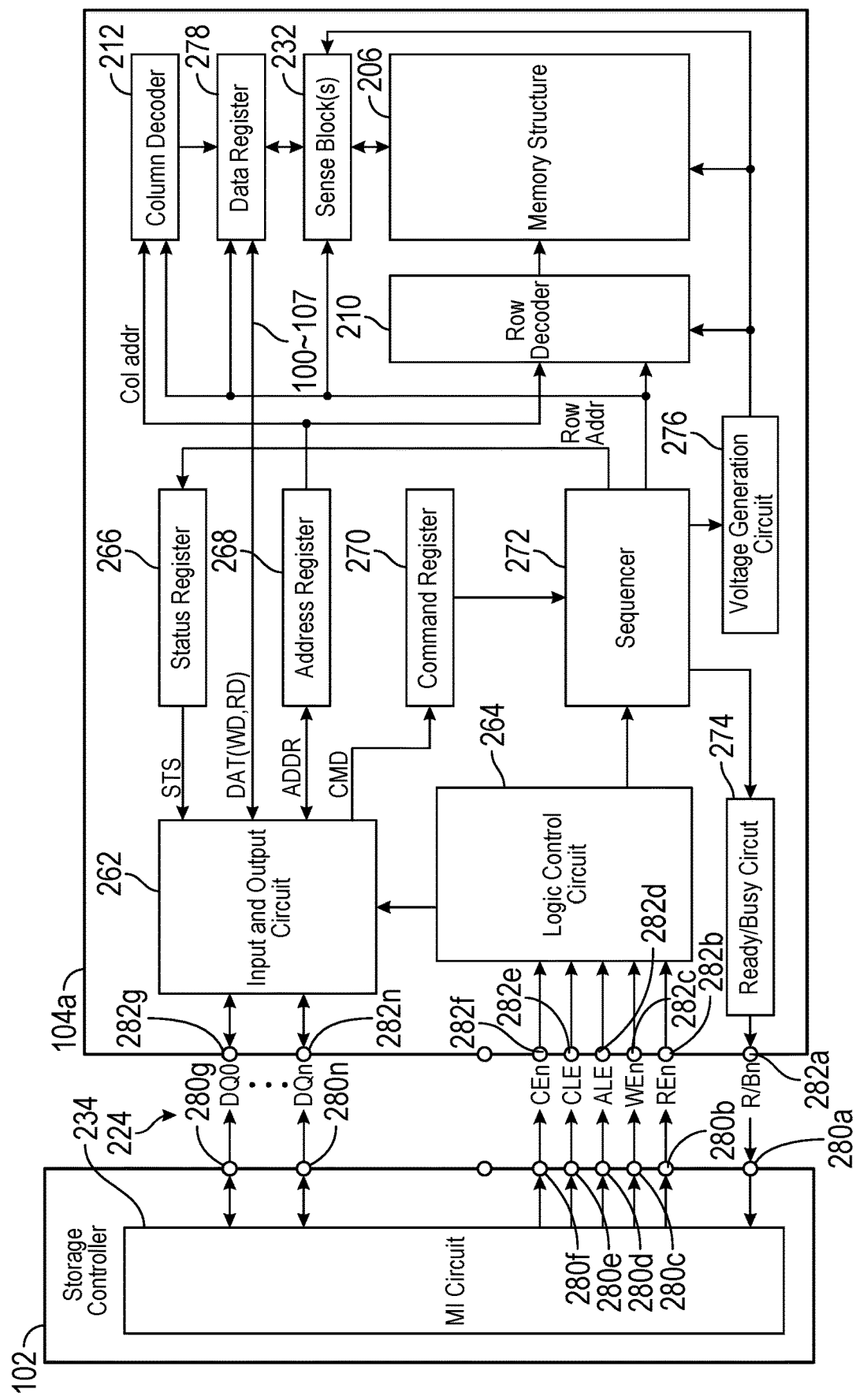
FIG. 2C is a block diagram of example memory system that depicts more details of an example embodiment of memory die, in connection with which, example embodiments of the disclosed technology can be implemented.

FIG. 2C is a block diagram of example memory system 200 that depicts more details of one embodiment of memory die 104a. With reference to FIG. 2B above, the memory die 104a is connected to the storage controller 102 via the memory interface 224 and operates based on commands from the storage controller 102.

For example, the memory die 104a transmits and receives, for example, DQ0 to DQn (hereinafter simply referred to as signals DQ or signals DQ[0:n], where n is an integer of the number of lines) to and from the storage controller 102. The DQ[0:n] signals may be an n-bit wide Signa, where each DQ signal is a 1-bit wide signal. In various embodiments, n may be 7, thus DQ[7:0] signals is an 8-bit wide signal. The DQ[0:n] signals may be encoded with input/output (I/O) data, for example, data in (DIN)/data out (DOUT) for data operations (e.g., read operations, write operations, erase operations, etc.) and address data (e.g., address codes) and command data (e.g., command codes) for command/address sequencing of for the data operations. Data sent over the DQ[0:n] signals is latched with respect to a rising edge or a falling edge of a clock signal or data strobe (DQS) signal. In a single data rate ("SDR") mode, the data is latched on either the rising edge or the falling edge of the clock signal. In a double data rate ("DDR") mode (also referred to herein as toggle mode), the data is latched on both the rising and falling edges of the clock signal.

The memory die 104a also receives control signals, such as, but not limited to, CEn signal, CLE signal, ALE signal, WEn signal, REn signal, DQS signal, and the like from the storage controller 102 via the control bus 226 of the memory interface 224. Then, the memory die 104a also transmits control signals, for example but not limited to, a ready/busy signal (R/Bn) to the storage controller 102. In some embodiments, each of control signals may be a one-bit wide signal. In other embodiments, the control signals may have other bit-widths as desired.

The CEn signal is a signal for enabling the memory die 104a. In various embodiments, the CEn signal is an active-low CEn, such that the CEn is asserted at a logic LOW level (e.g., logic level 0 or low voltage (0 volt)) to enable the memory die 104a. A memory array 202 may include a plurality of memory dies 104, each of which may be substantially similar to memory die 104a and activated based on receiving the CEn signal. In some embodiments, memory dies that are not used for a specific task may remain in a standby state. In the standby state, the memory dies do not respond to control signals from the storage controller 102. After asserting the CEn signal, the activated memory die starts responding to the control signals from the storage controller 102. For example, when the storage controller 102 desires to activate memory die 104a, the storage controller 102 asserts the CEn signal at a logic LOW level.

The CLE signal is an active-high signal, according to various embodiments, for enabling command sequencing, for example, by indicating that the DQ[0:n] signal is encoded with a command code (also referred to as CMD) and is asserted, for example, at a logic HIGH level (e.g., logic level 1 or high voltage (e.g., 5 volts)), according to some embodiments. The CLE signal may be used to activate a command bus (e.g., of control bus 226) between the storage controller 102 and the memory die 104*a*, for example, when the CLE signal is asserted at a logic HIGH level.

The ALE signal is an active-high signal, according to various embodiments, for enabling address sequencing, for example, by indicating that the signal DQ is encoded with an address code (also referred to as ADDR) and is asserted, for example, at the logic HIGH level. The ALE signal may be used to activate an address bus (e.g., of control bus 226) between the storage controller 102 and the memory die 104*a*, for example, when the ALE signal is asserted at a logic HIGH level.

When the memory die 104*a* receives the ALE signal that is at a logic LOW level and the CLE signal that is at a logic HIGH level, the memory die 104*a* knows that the storage controller 102 is sending command data on the DQ[0:n] signals, which is latched into a command register 270. Similarly, when the memory die 104*a* receives the ALE signal at a logic HIGH level and the CLE signal at a logic LOW level, the memory die 104*a* knows that address data is being sent by the storage controller 102 and the address data is latched into an address register 268 of the memory die 104*a*.

The WEn signal is a clock signal for sampling a received signal into the memory die 104*a*. For example, a signal received by the memory die 104*a* is sampled and latched at each rising or falling edge of the WEn signal to obtain a bit pattern encoded into the received signal. Accordingly, DQ[0:n] signals are received in the memory die 104*a* when the WEn signal is toggled. For example, command data and/or address data sent to the memory die 104*a* may be latched with respect to a rising edge and/or a falling edge of the WEn signal. In various embodiments, WEn signal may be latched in SDR mode or DDR mode.

The REn signal is a signal used for the storage controller 102 to read data from the memory die 104*a*. For example, data is read out of the memory die 104*a* at each rising or falling edge of the REn signal. Accordingly, the memory die 104*a* outputs the DQ[0:n] signals to the storage controller 102 based on the toggled REn signal. The R/Bn signal is a signal indicating whether the memory die 104*a* is in a busy state or a ready state (in a state in which a command is not receivable or receivable from the storage controller 102) and is considered to be at the logic LOW level, for example, when the memory die 104*a* is in the busy state.

While the above example provides the CEn signal as an active-low signal and the CLE and ALE signals as active-high signals, other implementations are possible. In some embodiments, the active states may be reversed. For example, the CEn signal may be an active-high signal and the CLE and ALE signals may be active-low signals.

The storage controller 102 issues a command to perform a read operation, a command to perform a write operation, a command to perform an erase, or the like to the memory die 104*a* in response to a command from a host device (e.g., host device 106 and/or 112). The storage controller 102 manages the memory space of the memory die 104*a*. As part of the read, write, or erase operations, the memory die 104*a* issues various commands to perform command/address sequencing for a respective operation and the memory die 104*a* and/or storage controller 102 transmit DIN/DOUT to complete the respective operation.

As described above, the memory interface circuit 234 of the storage controller 102 connects to the input/output circuit 222 of the memory die 104*a* via a plurality of electrical contacts. As used herein, electrical contacts may be referred to as pins or pins of a chip for electrically connecting the memory die 104*a* to the storage controller 102. For example, the storage controller 102 includes a plurality of pins 280*a-n* electrically connected to a plurality of pins 282*a-n* of the memory die 104*a*. The memory interface circuit 234 transmits the CEn signal, CLE signal, ALE signal, and WEn signals to the memory die 104*a* over the control bus 226 of the memory interface 224 via respective pins and transmits DQ [0:n] signals over the data bus 228 of the memory interface 224 via respective pins. The input/output circuit 222 transmits the R/Bn signal to the storage controller 102 over the control bus 226 and the DQ [0:n] signals over the data bus 228 via respective pins. The pins may also be referred to as receivers or transmitters. For example, where a signal is transmitted from a pin on the storage controller to a pin of the memory die, the transmitting pin may be referred to as an transmitter and the receiving pin may be referred to as a receiver. Each pin may be referred to as either a receiver or output transmitted based on the scenario, for example, one pin may transmit at a first instance while the pin may also receive at a second instance.

As illustrated in FIG. 2C, the memory die 104*a* includes an input and output circuit 262, a logic control circuit 264, a status register 266, an address register 268, a command register 270, a sequencer 272, a ready/busy circuit 274, a voltage generation circuit 276, and a data register 278. The various components 262-278 may be included as part of the die controller 204, for example, as part of the control circuit 214 and/or decoder circuit 216. FIG. 2C also illustrates the memory structure 206, row decoder 210, a sense blocks 232, and column decoder 212, as described above in connection with FIG. 2B.

The input and output circuit 262 controls input and output of the DQ [0:n] signals to and from the storage controller 102. For example, the input and output circuit 262 transmits data received from the storage controller 102 as DIN to data register 278, transmits an address code to the address register 268, and transmits a command code to the command register 270. DIN, the command code, and the address are transmitted to the memory die 104*a* as DQ [0:n] signals encoded with a bit pattern for the DIN, command, or address. The input and output circuit 262 also transmits status information STS received from the status register 266, data received from the data register 278 to be transmitted to the storage controller 102 as DOUT. STS and DOUT are transmitted as DQ [0:n] signals encoded with a bit pattern for the STS or DOUT. The input and output circuit 262 and the data register 278 are connected via a data bus. For example, the data bus includes eight I/O data lines 100 to 107 corresponding to the 8-bit signals DQ0 to DQ7. The number of I/O data lines is not limited to eight, but may be set to 16, 32, or any number of data lines.

The logic control circuit 264 receives, for example, the CEn signal, the CLE signal, the ALE signal, the WEn signal, and the REn signal from the storage controller 102 via control bus 226. Then, logic control circuit 264 controls the input and output circuit 262 and the sequencer 272 in accordance with a received signal.

The status register 266 temporarily stores status information STS, for example, in a write operation, a read operation, and an erasing operation for data and notifies the storage controller 102 whether the operation normally ends.

The address register 268 temporarily stores the address code received from the storage controller 102 via the input and output circuit 262. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be an address code. The address code is then temporarily stored in the address register 268. Then, the address register 268 transmits a row address (row addr) to the row decoder 210 and transmits a column address (col addr) to the column decoder 212.

The command register 270 temporarily stores the command code received from the storage controller 102 via the input and output circuit 262 and transmits the command code to the sequencer 272. For example, the input and output circuit 262 may detect DQ[0:n] signals and sample the DQ[0:n] signals according to the WEn signal to obtain a bit pattern encoded thereon. The input and output circuit 262 may then decode the bit pattern to obtain the data, which in this case may be a command code. The command code is then temporarily stored in the command register 270.

The sequencer 272 controls operation of the memory die 104a. For example, the sequencer 272 controls the status register 266, the ready/busy circuit 274, the voltage generation circuit 276, the row decoder 210, the sense blocks 232, the data register 278, the column decoder 212, and the like according to a command code stored in the command register 270 to execute the write operation, the read operation, and the erasing operation according to the code.

The ready/busy circuit 274 transmits the R/Bn signal to the storage controller 102 according to an operation state of the sequencer 272. For example, the R/Bn signal is transmitted to the storage controller 102 via the control bus 226 of the memory interface 224.

The voltage generation circuit 276 generates a voltage necessary for an operation (e.g., a write operation, a read operation, or an erasing operation) according to control of the sequencer 272. The voltage generation circuit 276 may be an example of the power control circuit 215 of FIG. 2A. The voltage generation circuit 276 supplies the generated voltage, for example, to the memory structure 206, the row decoder 210, and the sense blocks 232. The row decoder 210 and the sense blocks 232 apply a voltage supplied from the voltage generation circuit 276 to memory cells in the memory structure 206. Details of the memory structure 206 are provided in connection with FIGS. 3-4G below.

The data register 278 includes a plurality of latch circuits. The latch circuit stores the write data WD and the read data RD. For example, in a write operation, the data register 278 temporarily stores the write data WD received from the input and output circuit 262 and transmits the write data WD to the sense blocks 232. For example, in a read operation, the data register 278 temporarily stores the read data RD received from the sense blocks 232 and transmits the read data RD to the input and output circuit 262.

Figure 3:
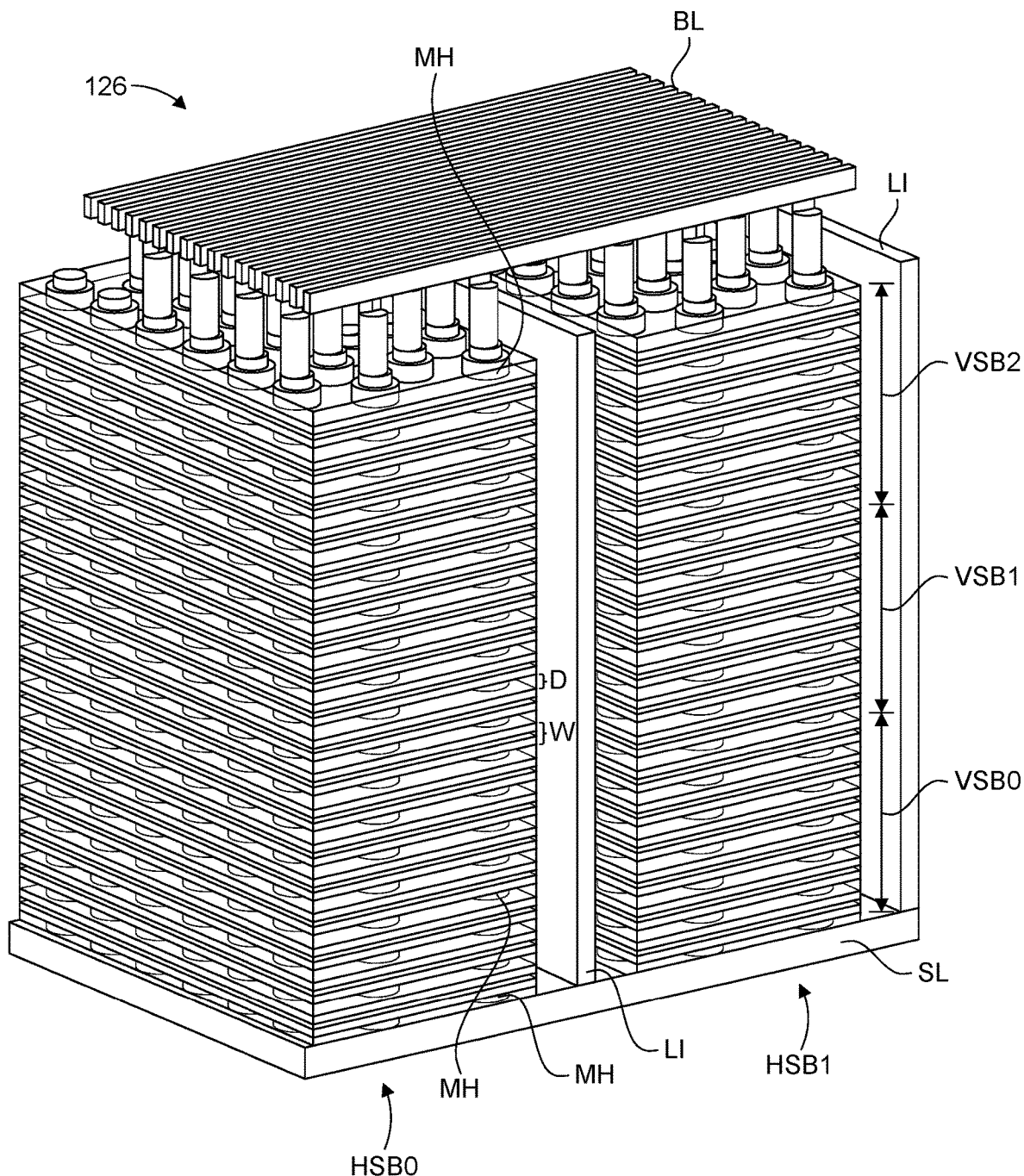
FIG. 3 is a perspective view of a portion of an example monolithic three-dimensional memory structure, in connection with which, example embodiments of the disclosed technology can be implemented.

FIG. 3 is a perspective view of a portion of a monolithic 3D memory array that includes a plurality of non-volatile memory cells, and that can comprise memory structure 206 in one embodiment. FIG. 3 illustrates, for example, a portion of one block of memory. The structure depicted includes a set of bitlines (BLs) positioned above a stack of alternating dielectric layers and conductive layers. For example purposes, one of the dielectric layers is marked as D and one of the conductive layers (also called wordline layers) is marked as W. The number of alternating dielectric and conductive layers can vary based on specific implementation requirements. In some embodiments, the 3D memory array includes between 108-300 alternating dielectric and conductive layers. One example embodiment includes 96 data wordline layers, 8 select layers, 6 dummy wordline layers, and 110 dielectric layers. More or less than 108-300 layers can also be used. Data wordline layers include data memory cells. Dummy wordline layers include dummy memory cells. As will be explained below, the alternating dielectric and conductive layers are divided into four "fingers" by local interconnects LI. FIG. 3 shows two fingers and two local interconnects LI. Below the alternating dielectric layers and wordline layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the 3D monolithic memory array that may comprise memory structure 206 is provided below with respect to FIGS. 4A-4G.

One of the local interconnects LI separates the block into two horizontal sub-blocks HSB0, HSB1. The block comprises multiple vertical sub-blocks VSB0, VSB1, VSB2. The vertical sub-blocks VSB0, VSB1, VSB2 can also be referred to as "tiers." Each vertical sub-block extends across the block, in one embodiment. Each horizontal sub-block HSB0, HSB1 in the block is a part of vertical sub-block VSB0. Likewise, each horizontal sub-block HSB0, HSB1 in the block is a part of vertical sub-block VSB1. Likewise, each horizontal sub-block HSB0, HSB1 in the block is a part of vertical sub-block VSB2. For ease of explanation, vertical sub-block VSB0 will be referred to as a lower vertical sub-block, vertical sub-block VSB1 will be referred to as a middle vertical sub-block, and VSB2 will be referred to as an upper vertical sub-block. In one embodiment, there are two vertical sub-blocks in a block. In other embodiments, there could be four or more vertical sub-blocks in a block.

A memory operation for a vertical sub-block may be performed on memory cells in one or more horizontal sub-blocks. For example, a programming operation of memory cells in vertical sub-block VSB0 may include: programming memory cells in horizontal sub-block HSB0 but not horizontal sub-block HSB1; programming memory cells in horizontal sub-block HSB1 but not horizontal sub-block HSB0; or programming memory cells in both horizontal sub-block HSB0 and horizontal sub-block HSB1.

The different vertical sub-blocks VSB0, VSB1, VSB2 are treated as separate units for erase/program purposes, in one embodiment. For example, the memory cells in one vertical sub-block can be erased while leaving valid data in the other vertical sub-blocks. Then, memory cells in the erased vertical sub-block can be programmed while valid data remains in the other vertical sub-blocks. In some cases, memory cells in the middle vertical sub-block VSB1 are programmed while there is valid data in the lower vertical sub-block VSB0 and/or the upper vertical sub-block VSB2. Programming the memory cells in middle vertical sub-block VSB1 may present challenges due to the valid data in the other vertical sub-blocks VSB0, VSB2.

Figure 4A:
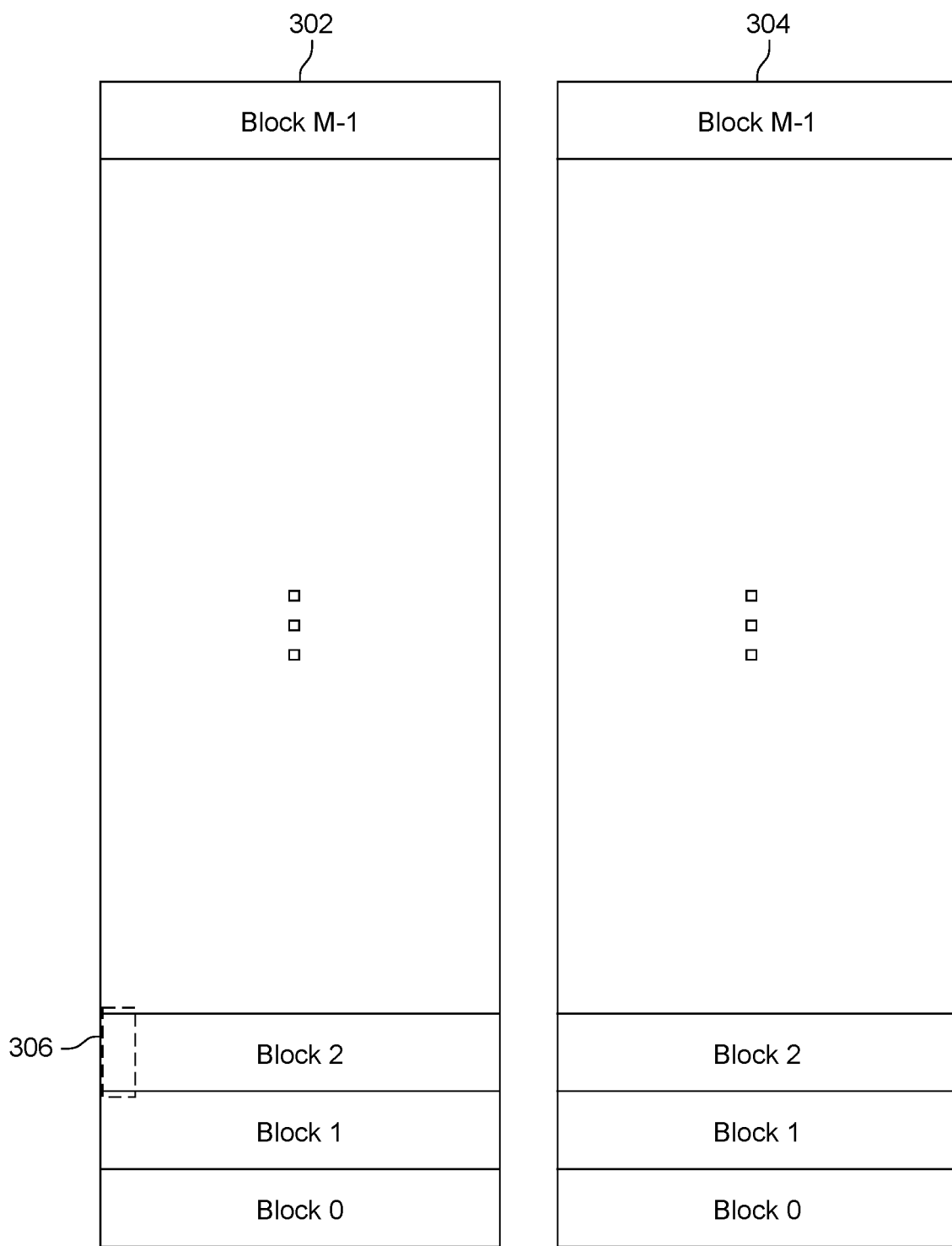
FIG. 4A is a block diagram of an example memory structure having two planes, in connection with which, example embodiments of the disclosed technology can be implemented.

FIG. 4A is a block diagram depicting one example organization of memory structure 206, which is divided into two planes 302 and 304. Each plane is then divided into M blocks. In one example, each plane has about 2000 blocks.

However, different numbers of blocks and planes can also be used. In one embodiment, a block of memory cells constitutes a single unit for an erase operation. That is, in one embodiment, all memory cells of a block are erased together. In other embodiments, memory cells can be grouped into blocks for other reasons, such as to organize the memory structure 206 to enable the signaling and selection circuits. In some embodiments, a block represents a groups of connected memory cells that share a common set of wordlines.

Figure 4B:
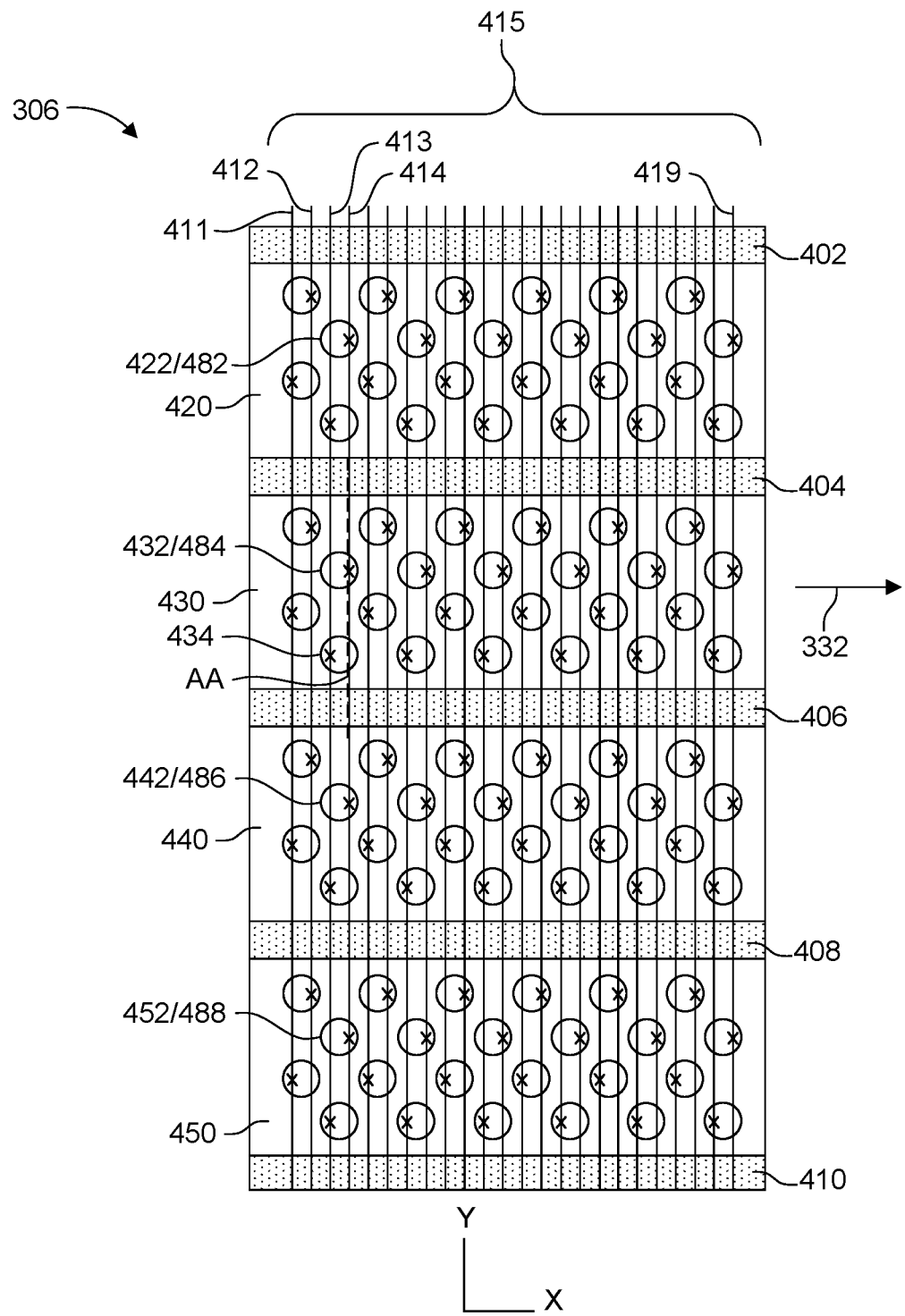
FIG. 4B depicts a top view of a portion of a block of example memory cells, in connection with which, example embodiments of the disclosed technology can be implemented.

FIGS. 4B-4F depict an example 3D NAND structure that corresponds to the structure of FIG. 3 and that can be used to implement memory structure 206 of FIGS. 2A and 2B. Although the example memory system of FIGS. 3-4H is a 3D memory structure that includes vertical NAND strings with charge-trapping material, it should be appreciated that other (2D and 3D) memory structures can also be used with the technology described herein. FIG. 4B is a block diagram depicting a top view of a portion of one block from memory structure 206. The portion of the block depicted in FIG. 4B corresponds to portion 306 in block 2 of FIG. 4A. As can be seen from FIG. 4B, the block depicted in FIG. 4B extends in the direction of 332. While in some embodiments, the memory array may have many layers, FIG. 4B illustrates only the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B.

FIG. 4B also depicts a set of bitlines 415, including bitlines 411, 412, 413, 414, . . . 419. FIG. 4B shows twenty-four bitlines because only a portion of the block is depicted. It is contemplated that more than twenty-four bitlines connected to vertical columns of the block. Each of the circles representing vertical columns has an "x" to indicate its connection to one bitline. For example, bitline 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as wordline fingers that are separated by the local interconnects. In one embodiment, the wordline fingers on a common level of a block connect together to form a single wordline. In another embodiment, the wordline fingers on the same level are not connected together. In one example implementation, a bitline only connects to one vertical column in each of regions 420, 430, 440 and 450. In that implementation, each block has sixteen rows of active columns and each bitline connects to four rows in each block. In one embodiment, all of the four rows connected to a common bitline are connected to the same wordline (via different wordline fingers on the same level that are connected together), in which case, the system uses the source side selection lines and the drain side selection lines to choose one (or another subset) of the four to be subjected to a memory operation (program, verify, read, and/or erase).

Although FIG. 4B shows four regions and sixteen rows of vertical columns in a block, with each region having four rows of vertical columns, those exact numbers are an example implementation. Other embodiments may include more or less regions per block, more or less rows of vertical columns per region, and/or more or less rows of vertical columns per block. FIG. 4B also shows the vertical columns being staggered. In other embodiments, different patterns of staggering can be used. In some embodiments, the vertical columns may not be staggered.

Figure 4C:
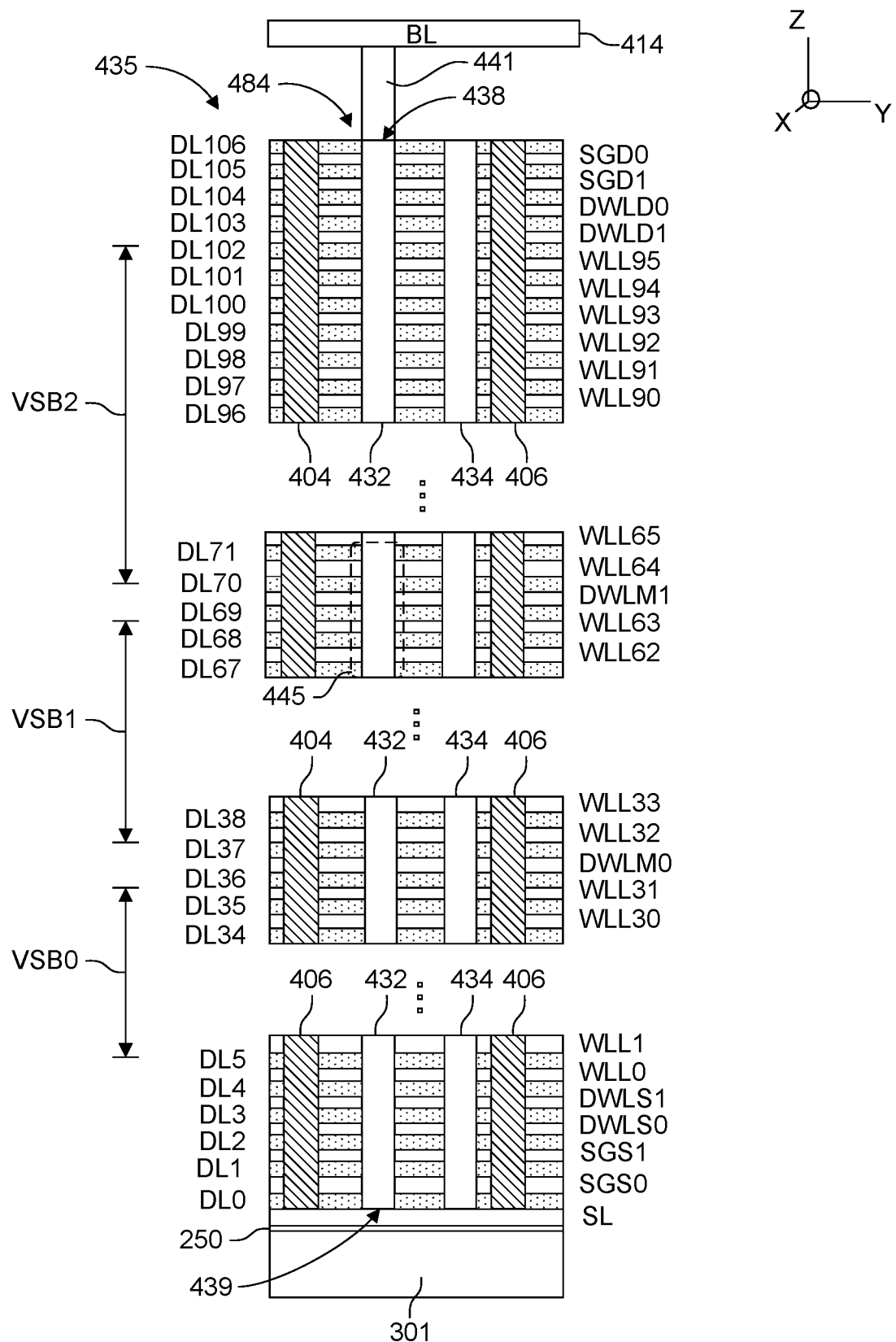
FIG. 4C depicts a stack showing a cross-sectional view along line AA of FIG. 4B.

FIG. 4C depicts an embodiment of a stack 435 showing a cross-sectional view along line AA of FIG. 4B. Two SGD layers (SGD0, SDG1), two SGS layers (SGS0, SGS1) and six dummy wordline layers DWLD0, DWLD1, DWLM1, DWLM0, DWLS0 and DWLS1 are provided, in addition to the data wordline layers WLL0-WLL95. Each NAND string has a drain side select transistor at the SGD0 layer and a drain side select transistor at the SGD1 layer. In operation, the same voltage may be applied to each layer (SGD0, SGD1), such that the control terminal of each transistor receives the same voltage. Each NAND string has a source side select transistor at the SGS0 layer and a drain side select transistor at the SGS1 layer. In operation, the same voltage may be applied to each layer (SGS0, SGS1), such that the control terminal of each transistor receives the same voltage. Also depicted are dielectric layers DL0-DL106.

Columns 432, 434 of memory cells are depicted in the multi-layer stack. The stack includes a substrate 301, an insulating film 250 on the substrate, and a portion of a source line SL. A portion of the bitline 414 is also depicted. Note that NAND string 484 is connected to the bitline 414. NAND string 484 has a source-end 439 at a bottom of the stack and a drain-end 438 at a top of the stack. The source-end 439 is connected to the source line SL. A conductive via 441 connects the drain-end 438 of NAND string 484 to the bitline 414. The metal-filled slits 404 and 406 from FIG. 4B are also depicted.

The stack 435 is divided into three vertical sub-blocks (VSB0, VSB1, VSB2). Vertical sub-block VSB0 includes WLL0-WLL31. Layers SGS0, SGS1, DWLS0, DWLS1 could also be considered to be a part of vertical sub-block VSB0. Vertical sub-block VSB1 includes WLL32-WLL63. Layers SGD0, SGD1, DWLD0, DWLD1 could also be considered to be a part of vertical sub-block VSB2. Vertical sub-block VSB2 includes WLL64-WLL95. Each NAND string has a set of data memory cells in each of the vertical sub-blocks. Dummy wordline layer DMLM0 is between vertical sub-block VSB0 and vertical sub-block VSB1. Dummy wordline layer DMLM1 is between vertical sub-block VSB1 and vertical sub-block VSB2. The dummy wordline layers have dummy memory cell transistors that may be used to electrically isolate a first set of memory cell transistors within the memory string (e.g., corresponding to vertical sub-block VSB0 wordlines WLL0-WLL31) from a second set of memory cell transistors within the memory string (e.g., corresponding to the vertical sub-block VSB1 wordlines WLL32-WLL63) during a memory operation (e.g., an erase operation or a programming operation).

In another embodiment, one or more middle junction transistor layers are used to divide the stack 435 into vertical sub-blocks. A middle junction transistor layer contains junction transistors, which do not necessarily contain a charge storage region. Hence, a junction transistor is typically not considered to be a dummy memory cell. Both a junction transistor and a dummy memory cell may be referred to herein as a "non-data transistor." A non-data transistor, as the term is used herein, is a transistor on a NAND string, where the transistor is either configured to not store user or system data or operated in such a way that the transistor is not used to store user data or system data. A wordline that is connected to non-data transistors is referred to herein as a non-data wordline. Examples of non-data wordlines include, but are not limited to, dummy wordlines, a select line in a middle junction transistor layer, or the like.

The stack 435 may have more than three vertical sub-blocks. For example, the stack 435 may be divided into four, five, or more vertical sub-blocks. Each of the vertical sub-blocks may contain at least one data memory cell. In some embodiments, additional layers similar to the middle dummy wordline layers DWLM may be provided to divide the stack 435 into the additional vertical sub-blocks. In one embodiment, the stack has two vertical sub-blocks.

Figure 4D:
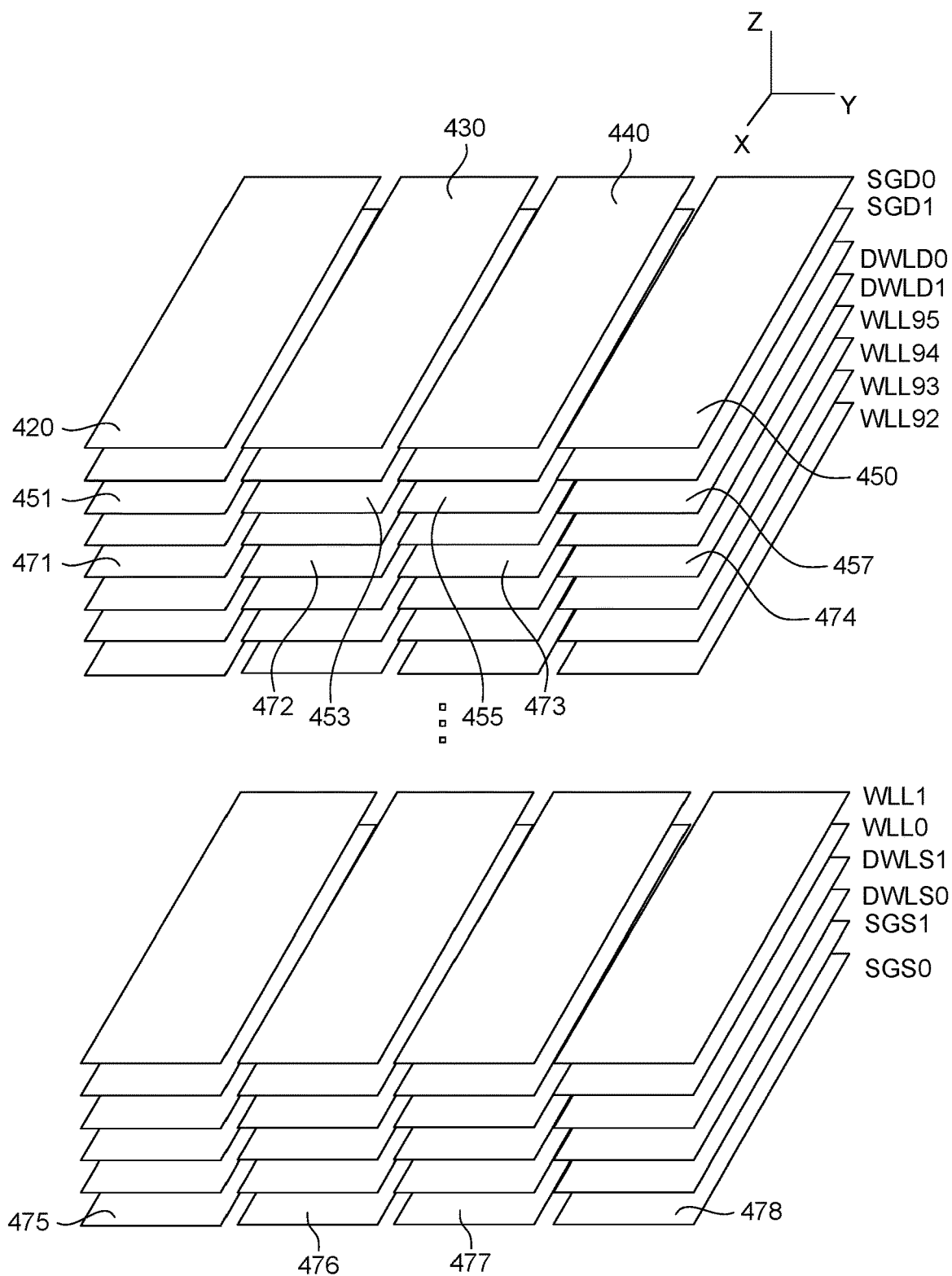
FIG. 4D depicts an alternative view of the select gate layers and wordline layers of the stack of FIG. 4C.

FIG. 4D depicts an alternative view of the SG layers and wordline layers of the stack 435 of FIG. 4C. Each of SGD layers SGD0 and SGD0 (the drain side SG layers) includes parallel rows of SG lines associated with the drain side of a set of NAND strings. For example, SGD0 includes drain side SG regions 420, 430, 440 and 450, consistent with FIG. 4B. Below the SGD layers are the drain side dummy wordline layers. In one implementation, each dummy wordline layer represents a wordline that is connected to a set of dummy memory cells at a given height in the stack. For example, DWLD0 includes wordline layer regions 451, 453, 455 and 457. A dummy memory cell, also referred to herein as a non-data memory cell, does not store data and is ineligible to store data, while a data memory cell is eligible to store data. Moreover, the threshold voltage Vth of a dummy memory cell is generally fixed at the time of manufacture or may be periodically adjusted, while the Vth of the data memory cells changes more frequently, e.g., during erase and programming operations of the data memory cells.

Below the dummy wordline layers are the data wordline layers. For example, WLL95 comprises wordline layer regions 471, 472, 473 and 474. Below the data wordline layers are the source side dummy wordline layers. Below the source side dummy wordline layers are the SGS layers. Each of the SGS layers SGS0 and SGS1 (the source side SG layers) includes parallel rows of SG lines associated with the source side of a set of NAND strings. For example, SGS0 includes source side SG lines 475, 476, 477 and 478. In some embodiments, each SG line is independently controlled, while in other embodiments, the SG lines are connected and commonly controlled.

Figure 4E:
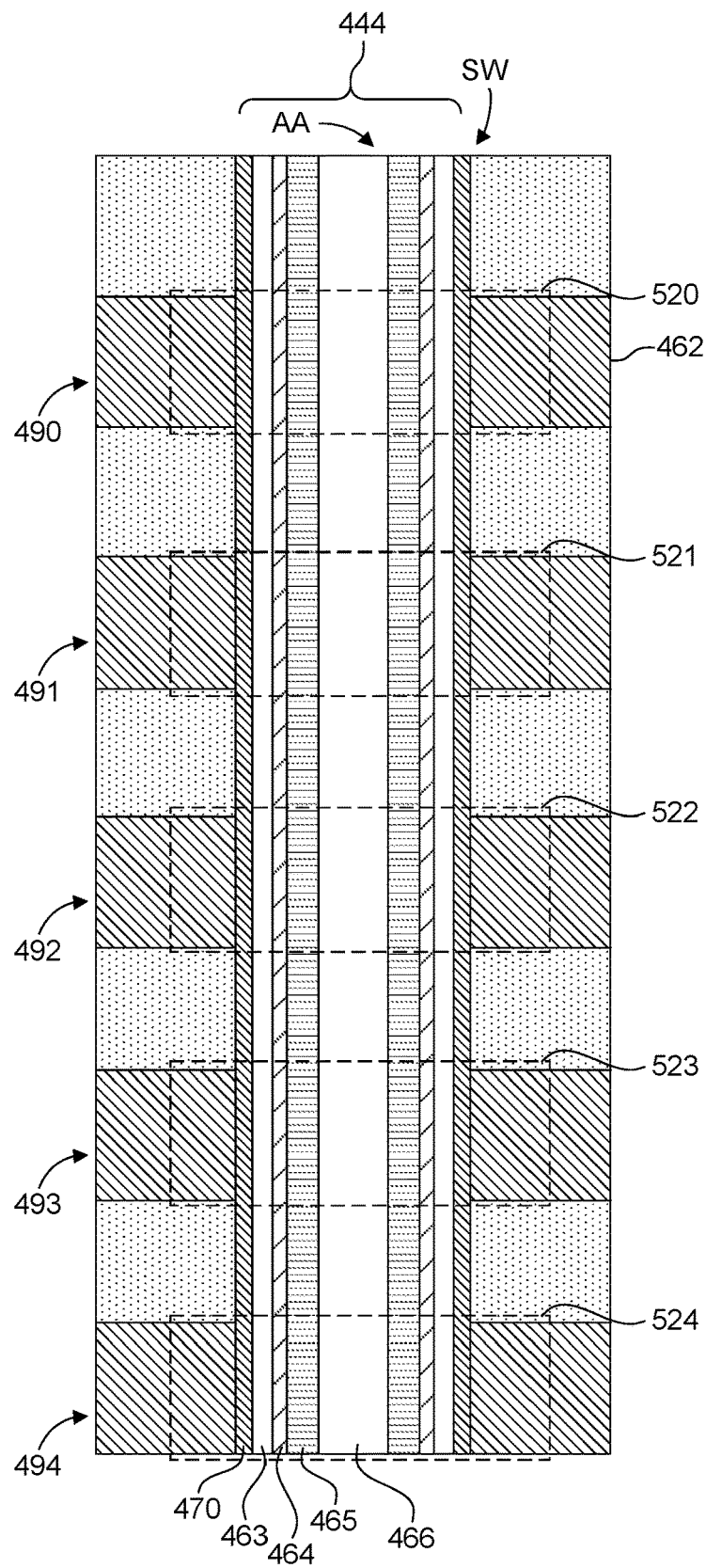
FIG. 4E depicts a view of a region of FIG. 4C.

FIG. 4E depicts a view of the region 445 of FIG. 4C. Data memory cell transistors 520 and 521 are above dummy memory cell transistor 522. Below dummy memory cell transistor 522 are data memory cell transistors 523 and 524. A number of layers can be deposited along the sidewall (SW) of the memory hole 444 and/or within each wordline layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A wordline layer can include a conductive metal 462 such as tungsten as a control gate. For example, control gates 490, 491, 492, 493 and 494 are provided. In this example, all of the layers except the metal are provided in the memory hole. In other approaches, some of the layers may be in the control gate layer. Additional pillars can be similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Non-data transistors (e.g., select transistors, dummy memory cell transistors) may also include the charge trapping layer 463. For example, in FIG. 4E, dummy memory cell transistor 522 includes the charge trapping layer 463. Thus, the Vth of at least some non-data transistors may also be adjusted by storing or removing electrons from the charge trapping layer 463. However, it is not required that all non-data transistors have an adjustable Vth. For example, the charge trapping layer 463 is not required to be present in every select transistor.

Each of the memory holes can be filled with a plurality of annular layers comprising a blocking oxide layer, a charge trapping layer, a tunneling layer, and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4F:
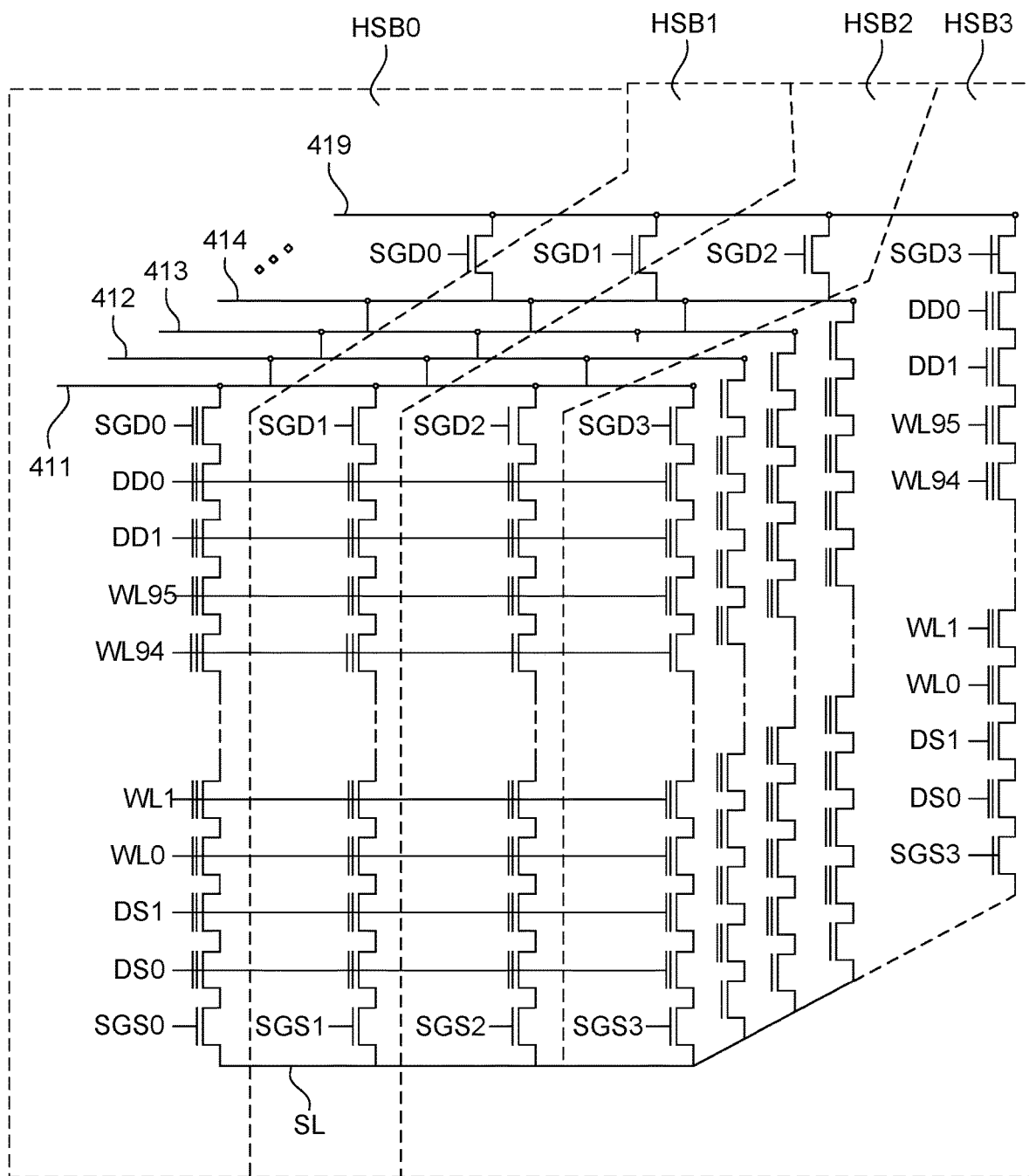
FIG. 4F is a schematic of a plurality of example NAND strings showing multiple horizontal sub-blocks, in connection with which, example embodiments of the disclosed technology can be implemented.

FIG. 4F is a schematic diagram of a portion of the memory depicted in FIGS. 3-4E. FIG. 4F shows physical wordlines WLL0-WLL95 running across the entire block. The structure of FIG. 4F corresponds to portion 306 in Block 2 of FIGS. 4A-E, including bitlines 411, 412, 413, 414, ... 419. Within the block, each bitline is connected to four NAND strings. Drain side selection lines SGD0, SGD1, SGD2 and SGD3 are used to determine which of the four NAND strings connect to the associated bitline(s). Source side selection lines SGS0, SGS1, SGS2 and SGS3 are used to determine which of the four NAND strings connect to the common source line. The block can also be thought of as divided into four horizontal sub-blocks HSB0, HSB1, HSB2 and HSB3. Horizontal sub-block HSB0 corresponds to those vertical NAND strings controlled by SGD0 and SGS0, horizontal sub-block HSB1 corresponds to those vertical NAND strings controlled by SGD1 and SGS1, horizontal sub-block HSB2 corresponds to those vertical NAND strings controlled by SGD2 and SGS2, and horizontal sub-block HSB3 corresponds to those vertical NAND strings controlled by SGD3 and SGS3.

Figure 4G:
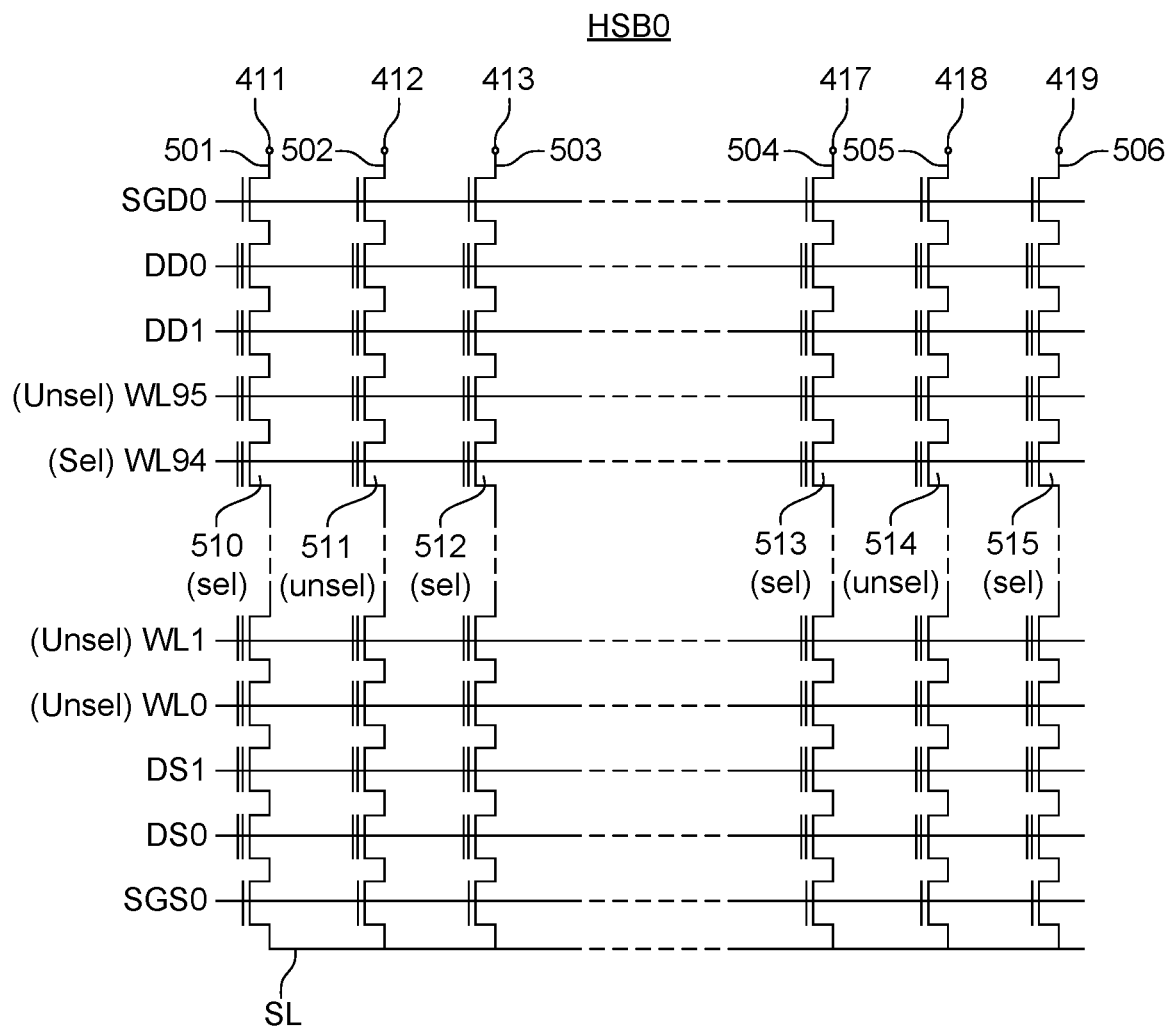
FIG. 4G is a schematic of a plurality of NAND strings showing one example horizontal sub-block, in connection with which, example embodiments of the disclosed technology can be implemented.

FIG. 4G is a schematic of horizontal sub-block HSB0. Horizontal sub-blocks HSB1, HSB2 and HSB3 may have similar structures. FIG. 4G shows physical wordlines WL0-WL95 running across the entire sub-block HSB0. All of the NAND strings of sub-block HSB0 are connected to SGD0 and SGS0. For ease of depiction, FIG. 4G only depicts six NAND strings 501, 502, 503, 504, 505, and 506; however, horizontal sub-block HSB0 may have thousands of NAND strings (e.g., or more).

FIG. 4G is being used to explain the concept of a selected memory cell. A memory operation is an operation designed to use the memory for its purpose and includes one or more of reading data, writing/programming data, erasing memory cells, refreshing data in memory cells, and the like. During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

As an example of selected memory cells and unselected memory cells, during a programming process, the set of memory cells intended to take on a new electrical characteristic (or other characteristic) to reflect a changed programming state are referred to as the selected memory cells, while the memory cells that are not intended to take on a new electrical characteristic (or other characteristic) to reflect a changed programming state are referred to as the unselected memory cells. In certain situations, unselected memory cells may be connected to the same wordline as selected memory cells. Unselected memory cells may also be connected to different wordlines than selected memory cells. Similarly, during a reading process, the set of memory cells to be read are referred to as the selected memory cells, while the memory cells that are not intended to be read are referred to as the unselected memory cells.

To better understand the concept of selected memory cells and unselected memory cells, assume a programming operation is to be performed and, for example purposes only, that wordline WL94 and horizontal sub-block HSB0 are selected for programming (see FIG. 4G). That means that all of the memory cells connected to WL94 that are in horizontal sub-blocks HSB1, HSB2 and HSB3 (the other horizontal sub-blocks) are unselected memory cells. Some of the memory cells connected to WL94 in horizontal sub-block HSB0 are selected memory cells and some of the memory cells connected to WL94 in horizontal sub-block HSB0 are unselected memory cells depending on how the programming operation is performed and the data pattern being programmed. For example, those memory cells that are to remain in the erased state (e.g., state S0) will be unselected memory cells because their programming state will not change in order to store the desired data pattern, while those memory cells that are intended to take on a new electrical characteristic (or other characteristic) to reflect a changed programming state (e.g., programmed to states S1-S7) are selected memory cells. Looking at FIG. 4G, assume for example purposes, that memory cells 511 and 514 (which are connected to wordline WL94) are to remain in the erased state; therefore, memory cells 511 and 514 are unselected memory cells (labeled unset in FIG. 4G). Additionally, assume, for example purposes, that memory cells 510, 512, 513 and 515 (which are connected to wordline WL94) are each to be programmed to a respective one of data states S1-S7; therefore, memory cells 510, 512, 513 and 515 are selected memory cells (labeled sel in FIG. 4G).

Figure 5:
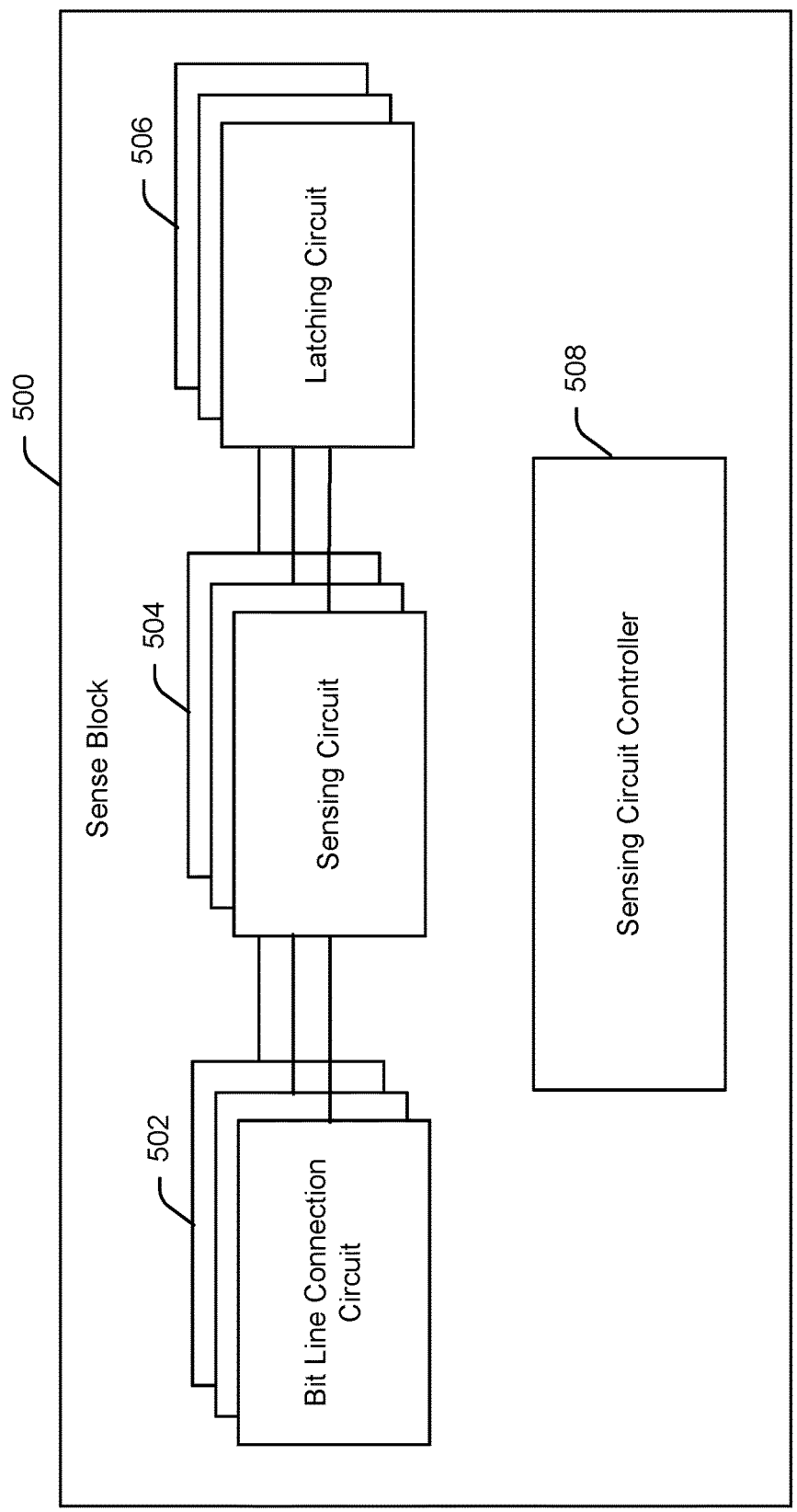
FIG. 5 is a schematic block diagram depicting an example configuration of a sense block of a memory die, in connection with which, example embodiments of the disclosed technology can be implemented.

FIG. 5 is a block diagram of an example configuration of a sense block 500, which may be representative of one of the sense blocks 232 (FIG. 1). The sense block 500 may include a plurality of sense circuits 504 and a plurality of sets of latching circuits 506. For example, there can be 16k sets of sense circuits 504 and latching circuits 506. In other example embodiments, there can be a set of sense circuits 504 and a respective latching circuit 506 for each memory cell in a memory array, for example. In some embodiments, each sense circuit 504 (which may also include sense amplifier circuitry) may be associated with a respective one of the latching circuits 506. That is, each sense circuit 504 may be configured to communicate with and/or perform a sense operation using data and/or storing data into its associated latching circuit 506.

Additionally, the sense block 500 may include a sense circuit controller 508 that is configured to control operation of the sense circuits 504 (and/or the sets of latches 506) of the sense block 500. As described in further detail below, the sense circuit controller 508 may control operation of the sense circuits 504 and the latches 506 by outputting control signals to terminals of the sense circuits 504 and the latches 506. The sense circuit controller 508 may be implemented in hardware, firmware, software, or combinations thereof. For example, the sense circuit controller 508 may include a processor that executes computer instructions stored in a memory to perform at least some of its functions. Controller 508 can be configured with various modules to perform one or more functions. Each module may include one or more instructions for execution of logic of one or more circuits described herein. For example, instructions may include instructions for generating one or more signals or sensing one or more voltage levels. Instructions may further include instructions for executing any of the steps of any of the methods disclosed herein. The controller 508 may send messages and receive data, including program code, through one or more communication interface(s). The received code may be executed by a processor of the controller 508 as it is received, and/or stored in a storage device, or other non-volatile storage for later execution.

Sense circuits 504 described herein can be coupled to bitlines and/or wordlines. Bitline connection circuit 502 is depicted in FIG. 5 as part of sense block 500. It should be appreciated, however, that the bitline connection circuit 502 may be, more generally, part of read/write circuit 128. Bitline connection circuit 502 may be configured to electrically connect and disconnect the ith bitline BL(i) from the sensing circuit 504 (and the latching circuit 506). In the case of a 3D NAND architecture, the ith bitline BL(i) may be connected to a respective memory hole from each NAND string of each NAND block of the 3D structure. In the case of a 2D NAND architecture, the ith bitline BL(i) may be connected to an associated NAND string. The ith bitline BL(i) may be one of a plurality bitlines and the NAND string may be one of a plurality of NAND strings included in a memory cell structure of a memory die. The NAND string can include one or more memory cells. For a read operation, a target memory cell can be a memory cell from which data is to be read, and thus, for which a sense operation is performed. For a verification operation, a target memory cell can be a memory cell being programmed in an associated program-verify operation.

When the bitline connection circuitry 502 connects the ith bitline BL(i) to the sensing circuit 504 (e.g., for a sense operation), current may flow from the sense circuit 504 to the ith bitline BL(i). Alternatively, when the bitline connection circuitry 502 disconnects the ith bitline BL(i) from the sense circuit 504, current may be prevented from flowing from the sensing circuit 504 to the ith bitline BL(i). Bitline connection circuit 502 may include a bitline biasing circuit configured to bias the ith bitline BL(i) by generating a bitline bias voltage at a bitline bias node. The amount of the bitline bias voltage may depend on whether the ith bitline BL(i) is a selected bitline or an unselected bitline. In particular, when the ith bitline BL(i) is a selected bitline, the bitline biasing may allow the bitline bias voltage at the high supply voltage level or a level corresponding to the high supply voltage, and when the ith bitline BL(i) is an unselected bitline, the bitline biasing circuit may generate the bitline bias voltage at the cell source voltage level or a level corresponding to the cell source voltage.

Sensing circuits 504 described herein can include a pre-charge circuit path configured to pre-charge one or more sense node(s) with a voltage at a pre-charge level during a sense operation. A latching circuit 506, in response to receiving a control signal at a high voltage level at a first transistor of the latch circuit 506, can enable a pre-charge circuit path to pre-charge the sense node with the voltage at the pre-charge level.

Figure 6:
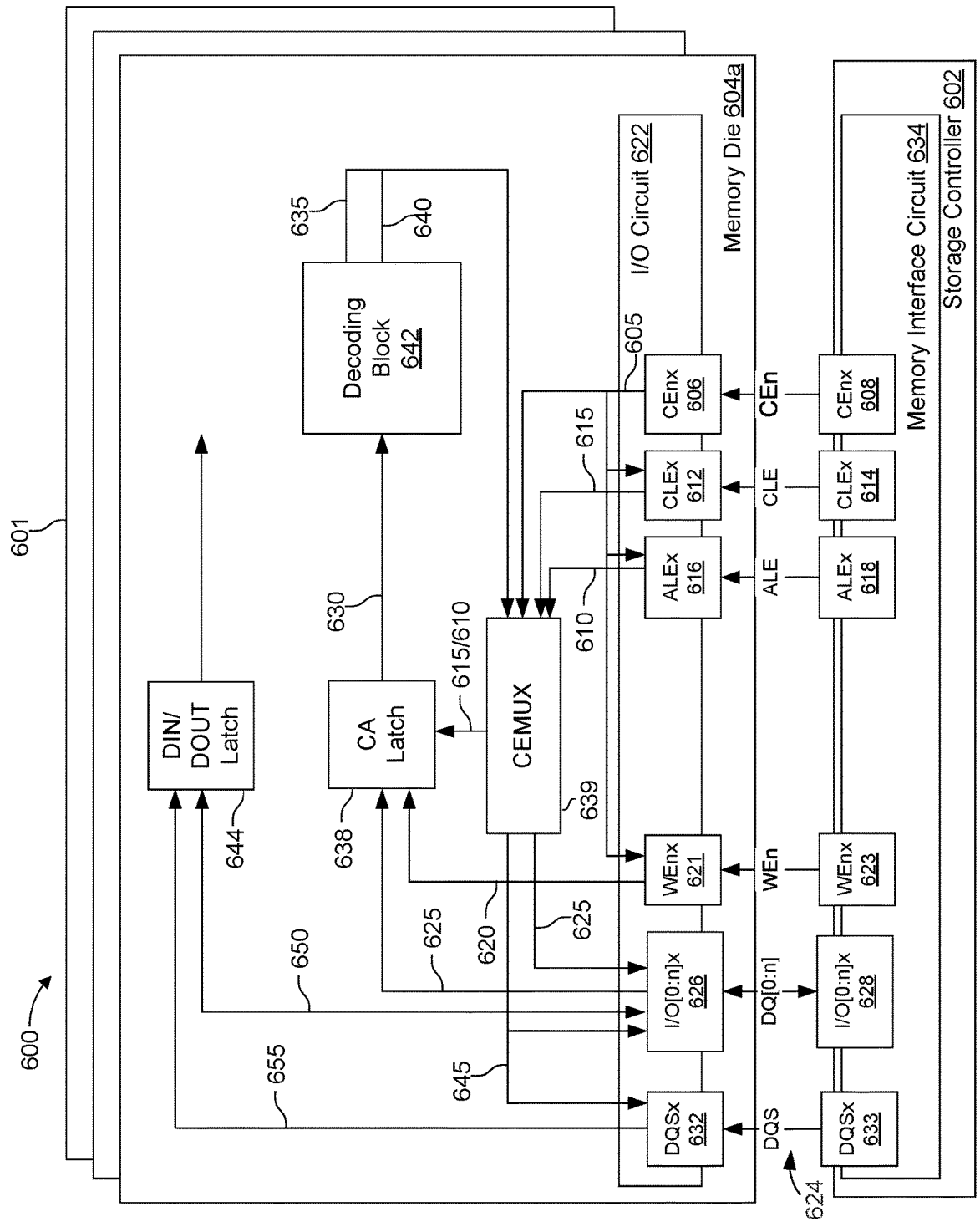
FIG. 6 is a functional block diagram depicting signals for an example data operation performed in a memory device.

FIG. 6 is a functional block diagram depicting signals for an example data operation performed in a memory device 600. FIG. 6 illustrates a flow of control and data signals exchanged between an input/output circuit 634 of storage controller 602 and the input/output circuit 622 of memory die 604a over a memory interface 624. The memory device 600, input/output circuit 634, storage controller 602, the input/output circuit 622, memory die 604a, and memory interface 624 may be implemented, for example, as the memory device 200, the memory interface circuit 234, storage controller 102, the input/output circuit 222, memory die 104a, and memory interface 224, respectively, as described above in connection with FIG. 1-2C. The memory die 604a may be one of a plurality of memory dies contained in a memory array 601 (e.g., memory array 202 of FIG. 2A) communicatively coupled to the storage controller 602. While the following description is made with reference to memory die 604a, such is merely illustrative, and the same or similar functions and/or features may be included with and/or performed by one or more other memory dies of the memory array.

FIG. 6 depicts various pins (as introduced above in connection with FIG. 2C) of the I/O circuit 622 and the memory interface circuit 634. A first subset of pins is used to transmit and/or receive control signals (e.g., CEn, CLE, ALE, and WEn signals to name a few examples) and a second subset of pins are used to transmit and/or receive I/O data (e.g., command data, address data, and DIN/DOUT data, to name a few examples). The character 'x' in each block element following a given acronym indicates that the block element is a pin for the signal identified in the block element. The pins may be referred to as receivers or transmitters, based on whether a pin is receiving or transmitting a signal.

For example, block element CEnx 606 represents CEnx pin or pin 606 of the I/O circuit 622 for receiving the CEn signal and block element CEnx 608 represents CEnx transmitter or pin 608 for transmitting the CEn signal from the storage controller 602. Accordingly, the memory die 604a comprises a first subset of pins including, but not limited to, CEnx pin 606, CLEx pin 612, ALEx pin 616, WEnx pin 621, and DQSx pin 632 for receiving control signals. The storage controller 602 includes corresponding pins, such as CEnx pin 608, CLEx pin 614, ALEx pin 618, WEnx pin 623, and DQSx pin 633. As described above, the control signals may be transmitted from the memory interface circuit 634 over a control bus (e.g., data bus 228) of the memory interface 624 via the above described first subset of pins.

The memory die 604a and the storage controller 602 also comprise a second subset of pins including, but not limited to, I/O[0:n]x pins 626 and I/O[0:n]x pins 628 for exchanging the DQ[0:n] signals. As described above, the DQ[0:n] signals may be transmitted from the memory interface circuit 634 over an I/O data bus (e.g., data bus 228) of the memory interface 624 via the above described second subset of pins. While the FIG. 6 depicts I/O[0:n]x pins 626, it will be appreciated that I/O[0:n]x pins 626 may be divided into two or more two groups of four bits each for transmitting or receiving I/O data via a plurality of I/O[0:n]x pins 626. In some embodiments, each bit of the I/O data sent or received via a DQ signal of the DQ[0:n] signals and may be assigned its own I/Ox pin 626, such that n bits of I/O data are sent/received via I/O[0:n] pins 626. The I/O data may be sent or received in other granularities using one or more I/O pins 628 on the memory interface circuit 634. The I/O data encoded in the DQ signals may be transferred between the storage controller 602 and the memory die 604a sampled according to DQS signal. Also, the command and/or address data in the DQ signals may be transferred between the storage controller 602 and the memory die 604a sampled according to WEnx signal.

To initiate a data operation (e.g., a read operation, write operation, program operation, etc.) on the memory die 604a, the storage controller transmits a CEn signal to CEnx pin 606 to activate the memory die 604a. Upon receiving the CEn signal, the CEnx pin 606 is activated and generates an internal CEn signal 605, which activates other pins of the memory die 604a for responding to control signals received from respective pins of the storage controller 602. For example, the storage controller 602 toggles the CEn signal from a logic HIGH level to a logic LOW level, which sets the internal CEn signal 605 to logic HIGH level, thereby activating the input/output circuit 622 of the memory die 604a. Activating the input/output circuit 622 may include connecting power to the memory die (e.g. power control 215) so that it can accept incoming data and perform data operations. The transition on I/O will be accepted only if the memory die is enabled.

Upon generating the CEn signal 605, the memory die 604a activates or otherwise enables the CLEx pin 612, ALEx pin 616, and WEnx pin 621. The memory die 604a may detect control signals from the storage controller 602 via the activated pins on the memory die 104a before diverting those signals to appropriate logic blocks within the memory die. For example, the ALE signal and the CLE signal are received on the activated (or enabled) ALEx pin 616 and CLEx pin 612, respectively. ALEx pin 616 and CLEx pin 612 generate an internal ALE signal 610 and internal CLE signal 615, respectively. As described above in connection with FIG. 2C, when the storage controller 602 asserts the ALE signal at logic HIGH level, the memory die 604a is instructed that address sequencing is enabled and that I/O data encoded on the DQ signals includes address data (e.g., an address code) as a bit pattern. When the storage controller 602 asserts the CLE signal at logic HIGH level, the memory die 604a is instructed that command sequencing is enabled and that I/O data encoded on the DQ signals includes command data (e.g., a command code) as a bit pattern. The WEnx pin 621 similarly generates an internal WEn signal 620 responsive to activation of the WEnx pin 621, which generates the internal WEn signal 620 based on the WEn signal from the storage controller 602.

The CEn signal 605, CLE signal 615, and ALE signal 610a re directed to a chip enable (CE) multiplexer 639. Based on receiving the CEn signal 605 and at least one of the ALE signal 610 and the CLE signal 615 set at logic HIGH level, the CE multiplexer 639 generates a signal 625 that activates or enables each of the I/O[0:n]x pins 626 of the memory die 604a. The CE multiplexer 639 comprises internal logic gates requiring the CEn signal 605 and at least one of the ALE signal 610 and CLE signal 615 to enable or otherwise activate the I/O[0:n]x pins 626.

Once enabled, the I/O[0:n]x pins 626 detect the DQ signals, encoded with I/O data, from the storage controller 602. In the case where the I/O[0:n]x pins 626 are activated based on the CLE signal 615 and/or ALE signal 610, I/O[0:n]x pins 626 generate signal 625. Signal 625 may be one or more data signal based on the number of I/O[0:n]x pins 262, for example, where there are two such pins, signal 625 may include two data signals 625. Signal 625 is provided to command/address (CA) latch 638 to temporarily store the I/O data, by latching the I/O data using the WEn signal 620, before transmitting it to a decoding block 642. The CA latch 638 may be enabled or be otherwise activated based on receiving the CLE signal 610 and/or ALE signal 615 from the CE multiplexer 639. The I/O data may comprise either command data or address data, as indicated by the storage controller 602 asserting the CLE signal or ALE signal at logic HIGH levels. In some embodiments, the CA latch 638 latches the I/O data at each rising and/or falling edge of the WEn signal 620. In some embodiments, another mechanism may temporarily store the CA data sent via the I/O signals 625 may be used instead of a latch. For example, in some embodiments, flip-flops, buffers, registers, or other temporary storage mechanisms that may be used that sample the I/O data on signal 625 according to the WEn signal 620.

The CA latch 638 may comprise one or more registers, for example, as set forth in connection with FIG. 2C. For example, the CA latch 638 may comprise a command register (e.g., command register 270) that temporarily stores command data sampled from signal 625 according to the WEn signal 620 when the CLE signal is asserted at logic HIGH level. The CA register 683 may also comprise an address register (e.g., address register 268) that temporarily stores address data sampled from signal 625 according to the WEn signal 620 when the ALE signal is asserted at logic HIGH level. In another example, the CA latch 638 may comprise a command/address register that temporarily stores both command data and address data sampled from signal 625 according to the WEn signal 620. In this configuration, the command and address data may be differentiated in the decoding block 642.

The latched I/O data, comprising command and/or address data, is provided to the decoding block 642, along with the CLE signal, ALE signal, and WEn signal as one or more internal signals 630. The decoding block 642 decodes the command data and the address data from the signal 630 and converts the data into a form that is understood by the logic block 425. For example, in the case of I/O data comprising command data, the decoding block 642 converts a bit pattern encoded on the signal 630 into a command code (e.g., "00h" command code, "30h" command code, "05h" command code, "E0h" command code, to name a few example). In the case of I/O data comprising an address code, the decoding block 642 converts a bit pattern encoded on the signal 630 into an address, indicating a memory die of the memory array and location in the memory structure (e.g., memory structure 206).

The decoding block 642 generates a command (CMD) signal 635 responsive to decoding a command/address sequence from latched I/O data on signal 630. For example, for a given data operation (e.g., write operation, read operation, etc.) the command data may include a command code is followed by an address, which may be followed by a suffix command code. For example, for write operation an example sequence may include CMD(80) followed by address data in the format of 6*ADD(xx). For a read operation, an example sequence may include as CMD(05) followed by 6*ADD(xx), which in turn is followed by CMD(E0). Responsive to decoding the command/address sequence for a given data operation from the I/O data on signal 630, the decoding block 642 generates the CMD signal 635 to instruct the memory array (e.g., memory array 202), comprising the memory die 604a, to perform the data operation indicated by the command codes.

The decoding block 642 also generates a chip select (CHPSEL) signal 640 responsive to decoding the address data from the latched I/O data on signal 630. For example, the address data encoded into the DQ signal contains a bit that identifies one or more memory dies from the memory array 601 for performing the CMD signal 635. The decoding block 642 decodes this bit and generates the CHPSEL signal 640 to enable the selected memory dies to perform the data operation of the CMD signal 635. For example, where there are eight memory dies in a given memory array, the address data may identify one or more of the eight memory dies (e.g., one or more of die 0 to die 7) for performing the data operation of the CMD signal 635. The decoding block 642 may then assert the CHPSEL signal 640 as logic HIGH level for the selected memory die and assert the CHPSEL signal 640 as logic LOW level for the unselected memory dies.

The CMD signal 635 and CHPSEL signal 640 are provided to the CE multiplexer 639. Based on the CMD signal 635 and the CHPSEL signal 640, the CE multiplexer 639 generates an active-high signal 645 that activates or enables each of the I/O[0:n]x pins 626 and the DQSx pin 632 of the memory die 604a, in a case that memory die 604a is one of the selected memory dies). For example, in the case that the CHPSEL signal 640 is set to logic HIGH level for memory die 604a and, responsive to the CMD signal 635 and the CHPSEL signal 640, the CE multiplexer 639 asserts signal 645 at logic HIGH level, which activates or enables each of the I/O[0:n]x pins 626 and the DQSx pin 632 of the memory die 604a for performing the DIN/DOUT operation of the data operation. The DQSx pin 632 generates an internal DQS signal 655 responsive to activation of the DQSx pin 632, which generates the internal DQS signal 655 based on the WEn signal from the storage controller 602. The I/O[0:n]x pins 626 detect the DQ signals, encoded with DIN/DOUT data, from the storage controller 602 and generate signal 650, which is provided to DIN/DOUT latch 644 to temporality store the data before transmitting the I/O data to downstream datapaths for execution of the DIN/DOUT operation according to the data operation (e.g., data register 278, sense blocks 232, column decoder 212, row decoder 210, etc.). The DIN/DOUT latch 644 latches the DIN/DOUT data at each rising and/or falling edge of a DQS signal 655. In some embodiments, another mechanism for temporarily storing the DIN/DOUT data sent via the I/O signals 650 may be used instead of a latch. For example, in some embodiments, flip-flops, buffers, registers, or other temporary storage mechanisms may be used that sample the I/O data on signal 650 according to the DQS signal 655.

In the case that the CHPSEL signal 640 is set to logic LOW level for memory die 604a, the CE multiplexer 639 asserts signal 645 at logic LOW level. Thus, the I/O[0:n]x pins 626 and the DQSx pin 632 are not enabled for the DIN/DOUT operation of the data operation. In this case, the memory die 604a enters standby mode, and awaits a subsequent data operation.

Read operations may also be performed in a similar way. Instead of sending data from the storage controller 602 to the memory die 604a, for read operations, the data being read may be transmitted from the DIN/DOUT latch 644 to the storage controller following a reverse route via the I/O signal 650 based on activating a read enable ("REn") pin (or receiver). The data being read may be temporarily stored within the DIN/DOUT latch 644 before being diverted to the storage controller 602.

It is to be understood that only some elements are shown in FIG. 6. However, other logic circuits and/or components that may be needed or considered desirable to have in performing the function described herein may be used in other embodiments.

In the embodiment of FIG. 6, the CEn signal from CEnx pin 608 of the storage controller 602 is provided, not only to memory die 604a, but to each memory die of the memory array 601. Thus, as described above, responsive to the CEn signal set to logic HIGH level and one of the ALE signal and CLE signal set to logic HIGH level, the respective I/O[0:n]x pins 626 of each memory die are activated. The I/O[0:n]x pins 626 of each memory die detect the DQ signals encoded with the command and/or address data, which is then decoded by the decoding block 642 of each memory die in the array 601. It is only once the decoding block 642 of each memory die decodes the address code and asserts the CHPSEL signal 640 as logic HIGH or LOW level, based on the memory die identified in the address data, are the I/O[0:n]x pins deactivated and the respective memory die enters standby mode.

However, each time another control signal or data signal is transmitted to the memory array 601, the I/O[0:n]x pins 626 of each memory die are reactivated so to enable decoding of the I/O signals in the decoding block 642. In the current state of non-volatile flash memory technologies, this operation of reactivating the I/O I/O[0:n]x pins 626 and executing the decoding block 642 consumes approximately 5 mW of power per memory die. Thus, for example, for an eight die stack, the standby state consumes approximately at least 40 mW of power for each data operation provided to the memory array 601. Furthermore, as the state of the technology advances from one generation to the next, the power consumed per memory die is expected to increase, at least because the circuitry and complexity is expanded, thereby consuming increasing amounts of power to maintain the standby state as described above.

One approach to mitigate the technical short coming described above is to generate multiple CEn signals at the storage controller, one for each memory die that is to be activated. For example, if there are eight memory dies, the storage controller may be configured to provide distinct CEn signals, each usable to enable a target memory die. However, such an approach requires significantly more ASIC routing and circuitry on the storage controller, as well as additional overhead in the form of chip real-estate on the memory system. Thus, the memory die specific CEn signal approach is not an ideal solution in terms of cost and system perspectives.

Accordingly, embodiments disclosed herein provide a technical solution to the above technological short comings by selectively enabling or disabling one or more memory dies, of a memory array, such that only selected memory dies process incoming control signals while unselected dies are unresponsive to incoming the data operations. The embodiments herein provide for generating an additional control signal (referred to herein as a die switch opcode signal) that enables or disables one or more memory dies of the memory array without requiring command/address sequencing (e.g., decoding the command/address sequence by the decoder block 642). For example, a storage controller can be configured to transmit the die switch opcode that includes at least address data identifying one or more memory dies for executing the forth coming data operation. A new decoder (referred to herein as die enable decoder block) can be provided in each memory die, which enables selected memory die(s) and disables unselected memory die(s) based on the die switch opcode. For example, the decoder may set a die status state to logic LOW level that may be pulled so to deactivate I/O[0:n]x pins of the unselected memory die(s) and may set a die status state to logic HIGH level that may be pulled so to activate I/O[0:n]x pins of the selected memory die(s). By deactivating the I/O[0:n]x pins of the unselected memory die(s), subsequent DQ signals are not detected and, therefore, are not decoded by the decoding blocks thereof. Meanwhile, I/O[0:n]x pins of the selected memory die(s) detect the subsequent DQ signals and the decoding blocks thereof decodes the DQ signals to perform command/address sequencing and/or DIN/DOUT operations set forth above in connection with FIG. 6.

By disabling unselected memory dies according to embodiments disclosed herein, aspects of the disclosed technology provide for reduced power consumption per each die, while at the same time, reducing the chip foot-print (e.g., reduced impact on chip real-estate). For example, power savings of approximately 80% per die were observed from analysis using the disclosed technology. Further, as the state of the art advances, the power savings achieved by the disclosed technology will similarly increase. [[***Inventors: I included the above discussion of the power savings. However, we discussed using more general numbers, such as percentage of power savings, in place of these specific examples. Thus, please provide the percentages and I will revise the description accordingly.]]

In various embodiments of the disclosed technology, the die switch opcode comprises a state diagram as shown in Table 1 below. For example, the die switch opcode may assert the CEn signal at logic LOW level ("L"), the CLE signal at logic HIGH level ("H"), and the ALE signal at logic HIGH level. The die switch opcode may also set the WEn signal.

TABLE 1

| Event | CEn | CLE | ALE | WEn |
|---|---|---|---|---|
| Die switch opcode | L | H | H | ↑ |

Traditionally, the CLE signal and ALE signals are not set to logic HIGH level simultaneously. As described above, the CLE signal was traditionally asserted as logic HIGH level to indicate that I/O data on the DQ signals includes command data, while the ALE signal was asserted as logic HIGH level to indicate that I/O data on the DQ signals includes address data, both of which would be decoded for command/address sequencing. A state during which both the ALE and CLE signals are asserted at logic HIGH level was not utilized. Accordingly, in some embodiments of the disclosed technology, the availability of this unused state permits the die switch opcode to be implemented without requiring additional pins on the storage controller and/or the memory dies.

When storage controller asserts the die switch opcode (e.g., both ALE and CLE asserted at logic HIGH level), the memory die is that an idle current saving mode is enabled. The die switch opcode enables the die enable decoder block and instructs the memory die that the I/O data encoded on the DQ signals includes address data (e.g., an address code) as a bit pattern. In some embodiments, the address code may be provided as an 8-bit wide DQ signal with each I/O[m] bit corresponding to address of $m^{th}$ die in a die stack. For example, in an 8 die stack I/O[0] can correspond address of Die0 and I/O[7] can correspond address of Die7. During the idle current saving mode, only memory dies selected, for example, as indicated by the address data on the DQ signal, will respond to subsequent control and/or data signal, while other memory dies are inactive and unresponsive. Memory die selection can be switched based on a subsequent die switch opcode that indicates a change in selected memory dies.

In other embodiments, the die switch opcode may be transmitted over a new die switch opcode (DSO) signal. In some implementations, the DSO signal may be transmitted from existing, unused pins on the storage controller and received in an existing, used pin of the memory die. In another implementations, new pins may be physically manufactured into the memory dies and storage controller for transmitting the DSO signal. In either case, the DSO signal may by an active-high signal that, when asserted to logic HIGH level, instructs the memory die that the die enable decoder block is enabled and that address data is provided on the DQ signals via I/O[0:n]x pins 626. In another example, the DSO signal may be an active-low signal. The pin for detecting the DSO signal may be activated responsive to the CEn signal, similar to the CLEx and ALEx pins of FIG. 6 above.

Figure 7A:
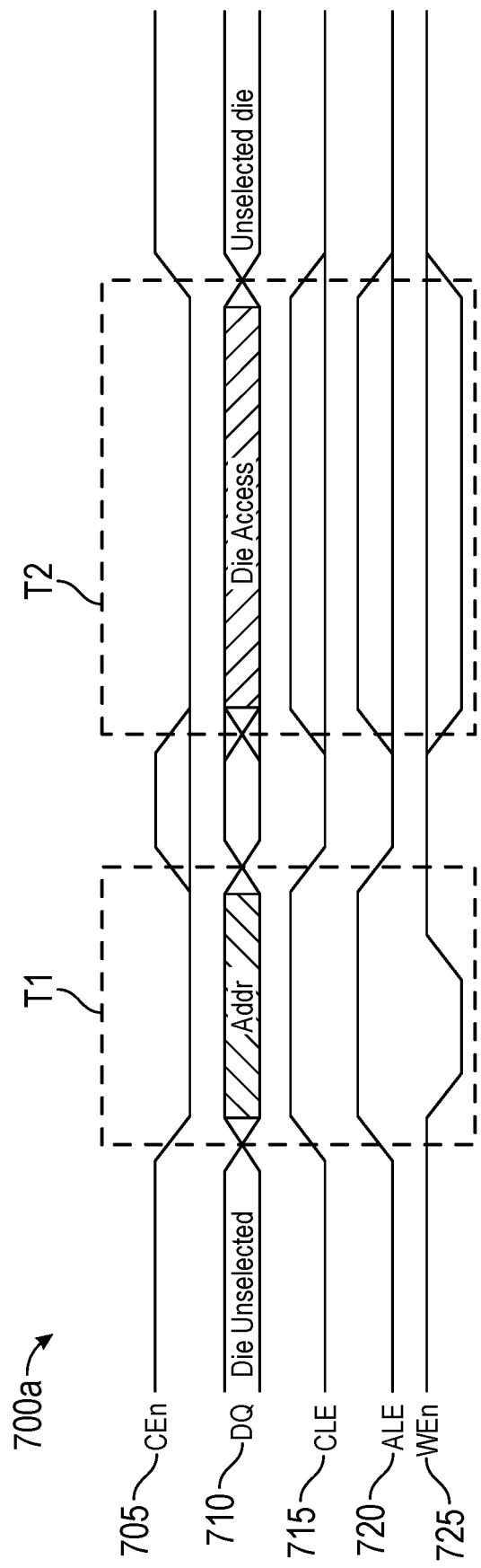
FIGS. 7A and 7B are example timing diagrams of a die switch operation code in accordance with the embodiments of the present disclosure.

FIG. 7A is an example timing diagram 700 of the die switch opcode in accordance with the embodiments of the present disclosure. The timing diagram 700 may be implemented by elements of a memory device (e.g., memory device 200), for example, by the storage controller 102. FIG. 7 includes a plurality of signals, such as CEn signal 705, DQ signal 710, CLE signal 715, ALE signal 720, and WEn signal 725.

A storage controller may assert the die switch opcode, for example, according to Table 1 above. In this case, as time T1, the storage controller asserts CEn signal 705 at logic LOW level and ALE and CLE signals 715 and 720 at logic HIGH level. The storage controller also transmits the DQ signal encoded with address data (e.g., burst mode addr, which may be provided as the code shown in Table 2) and the WEn signal 725. As detailed below, each memory die of a memory array receives the die switch opcode. The CEn signal 705, at logic LOW level, enables each memory die and the ALEx pins and CLEx pins thereon. Then, responsive to the ALE signal 720 and CLE signal 715 asserted at the logic HIGH level as detected on the ALEx pins and CLEx pins, respectively, the WEnx pin and I/O[0:n]x pins of the memory die are activated. Each memory die may then sample the DOsignal 710 on the I/O[0:n]x pins according to the WEn signal 725 (e.g., latch a bit value at each rising and/or falling edge of the WEn signal). Based on sampling the DQ signal 710, the memory die may decode the bit values encoded in the DQ signal 710 to obtain a bit pattern encoded therein. This bit pattern may be decode to obtain an address code that identifies one or more memory dies. Based on the obtained address code, one or more memory dies are then enabled or disabled for further access to the memory structure of the memory die.

For example, at time T2, memory dies identified in the obtained address code are enabled for subsequent data operations (e.g., command/address sequencing and/or DIN/DOUT operations). For example, if a data operation is to be performed on a third memory die of an eight die stack (or array), the storage controller sends the DQ signal 710 encoded with an address code indicative of the third memory die. The address code may be represented as an eight bit sequence, where the third bit is set to logic HIGH level and the other bits set to logic LOW level, for example, a bit pattern 00000100. The encoded address is provided to the die enable decoder block included in each memory die, and each die enable decoder block will decode the address to determine which bit is set to logic HIGH level. The die enable decoder block of the third memory die enables the third memory die based on the decoded address, while die enable decoder blocks of the other memory dies will disable their respective internal logic blocks.

Table 2 below provides example bit patterns for addresses of memory dies in an 8 die array (or stack). Table 2 also illustrates example, chip address (CADD) used for die mapping, which are unchanged as shown below. In various embodiments, the CADD may be hard coded into each memory die, for example, as 3-bit wide bit pattern that identifies memory die within the memory array.

TABLE 2

| Memory Die # | CADD | Address Bit Patterns |
|---|---|---|
| 0 | b'000 | b'00000001 |
| 1 | b'001 | b'00000010 |
| 2 | b'010 | b'00000100 |
| 3 | b'011 | b'00001000 |
| 4 | b'100 | b'00010000 |
| 5 | b'101 | b'00100000 |
| 6 | b'110 | b'01000000 |
| 7 | b'111 | b'10000000 |
| Broadcast | NA | b'11111111 |

Furthermore, the DQ signal 710 may identify one or more selected memory dies for activation while disabling others. For example, the DQ signal 710 may be encoded with a bit pattern in which one or more bits are set logic HIGH level and the rest to logic LOW level. For example, Table 2 shows a case of a broadcast die switch opcode where all bits are set to logic HIGH level. As another example, to select the second and fifth memory die, the die switch opcode could assert a sequence "b'00010010."

Figure 7B:
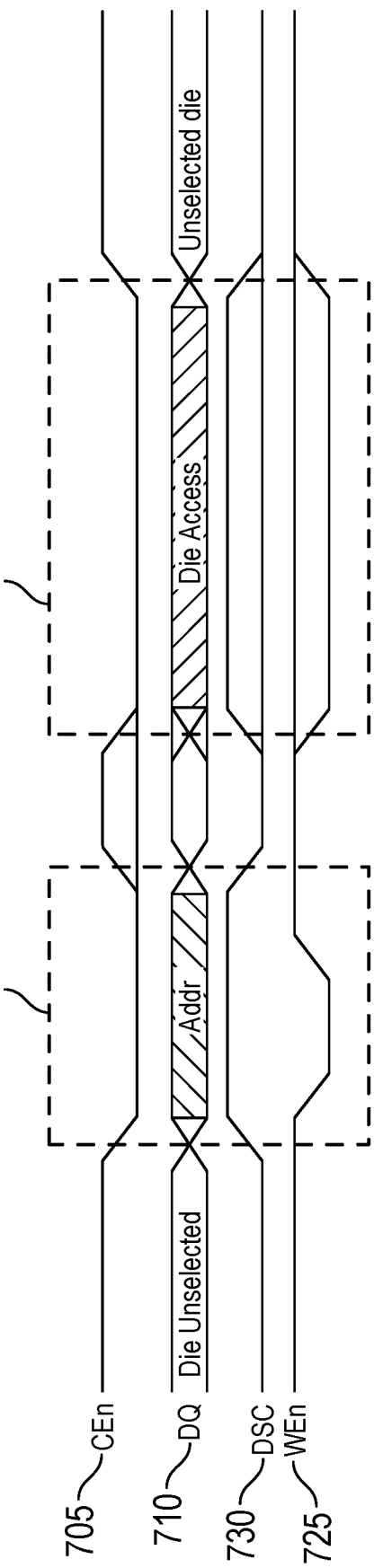

As described above, in some embodiments, the ALE signal 715 and CLE signal 720 may be replaced with a DSO signal. For example, as shown in FIG. 7B, a DSO signal 730 may be asserted at logic HIGH level (or logic LOW level in some embodiments) by the storage controller. DSOx pins on each memory die may be activated responsive to a CEn signal 705. The DSOx pins detect the DSO signal 730, which informs the memory dies to enable the idle current saving mode, that the DQ signal 710 is encoded with address data, and enables the die enable decoder block, as set forth above in connection with FIG. 7A.

FIGS. 8A-8E illustrate a block diagram of an example architecture of a memory device 800 in accordance with various embodiments disclosed herein. FIGS. 8A-8E also illustrate a flow of control signals between a storage controller 802 and a memory die 804a. Control signals are transmitted from a memory interface circuit 834 to a I/O circuit 822, and may be implemented to enable or disable memory dies of the memory array 801 according to embodiments disclosed herein, for example, based on a die switch opcode as described above. The memory device 800, input/output circuit 834, storage controller 802, the input/output circuit 822, memory die 804a, and memory interface 824 may be substantially similar to the memory device 200, the memory interface circuit 234, storage controller 102, the input/output circuit 222, memory die 104a, and memory interface 224, respectively, as described above in connection with FIG. 1-2C. The memory die 804a may be one of a plurality of memory dies contained in a memory array 801 (e.g., memory array 202 of FIG. 2A) coupled to the storage controller 802. While the following description is made with reference to memory die 804a, such is merely illustrative, and the same or similar functions and/or features may be included with and/or performed by one or more of the memory dies of the memory array.

FIG. 8 depicts various pins (e.g., similar to pins described in connection with FIGS. 2C and 6) of the I/O circuit 822 and the memory interface circuit 834. A first subset of pins is used to transmit and/or receive control signals (e.g., CEn, CLE, ALE, and WEn signals to name a few examples) and a second subset of pins are used to transmit and/or receive I/O data (e.g., command data, address data, and DIN/DOUT data, to name a few examples). The character 'x' in each block element following a given acronym indicates that the block element is a pin for the signal identified in the block element. The pins may be referred to as receivers or transmitters, based on whether a pin is receiving or transmitting a signal. Accordingly, the memory die 804a comprises a first subset of pins including, but not limited to, CEnx pin 806, CLEx pin 812, ALEx pin 816, and WEnx pin 821 for receiving control signals. The storage controller 802 includes corresponding pins, such as CEnx pin 808, CLEx pin 814, ALEx pin 818, and WEnx pin 823. As described above, the control signals may be transmitted from the memory interface circuit 834 over a control bus (e.g., data bus 228) of the memory interface 824 via the above described first subset of pins. The various pins of FIGS. 8A-8E may be substantially similar to the pins of FIG. 6, for example, CEnx pin 806 is similar to CEnx pin 606, CLEx pin 812 is similar to CLEx pin 612, ALEx pin 816 is similar to ALEx pin 616, I/O[0:n]x pins 826 are similar to I/O[0:n]x pins 626, and so on.

The memory die 804a and the storage controller 802 also comprise a second subset of pins including, but not limited to, I/O[0:n]x pins 826 and I/O[0:n]x pins 828 for exchanging the DQ[0:n] signals. As described above, the DQ[0:n] signals may be transmitted from the memory interface circuit 834 over an I/O data bus (e.g., data bus 228) of the memory interface 824 via the above described second subset of pins. While the FIG. 8 depicts one I/O[0:n]x pins 826, it will be appreciated that I/O[0:n]x pins 826 may be divided into two or more two groups of four bits each for transmitting or receiving I/O data via a plurality of I/O[0:n]x pins 826. In some embodiments, each bit of the I/O data sent or received via the DQ[0:n] signals may be assigned its own I/Ox pin 826, such that n bits of I/O data are sent/received via I/O[0:n]x pins 826. The I/O data may be sent or received in other granularities using one or more I/O pins 828 on the memory interface circuit 834. The I/O data encoded in the DQ signals may be transferred between the storage controller 802 and the memory die 804a sampled according to DQS signal.

Figure 8A:
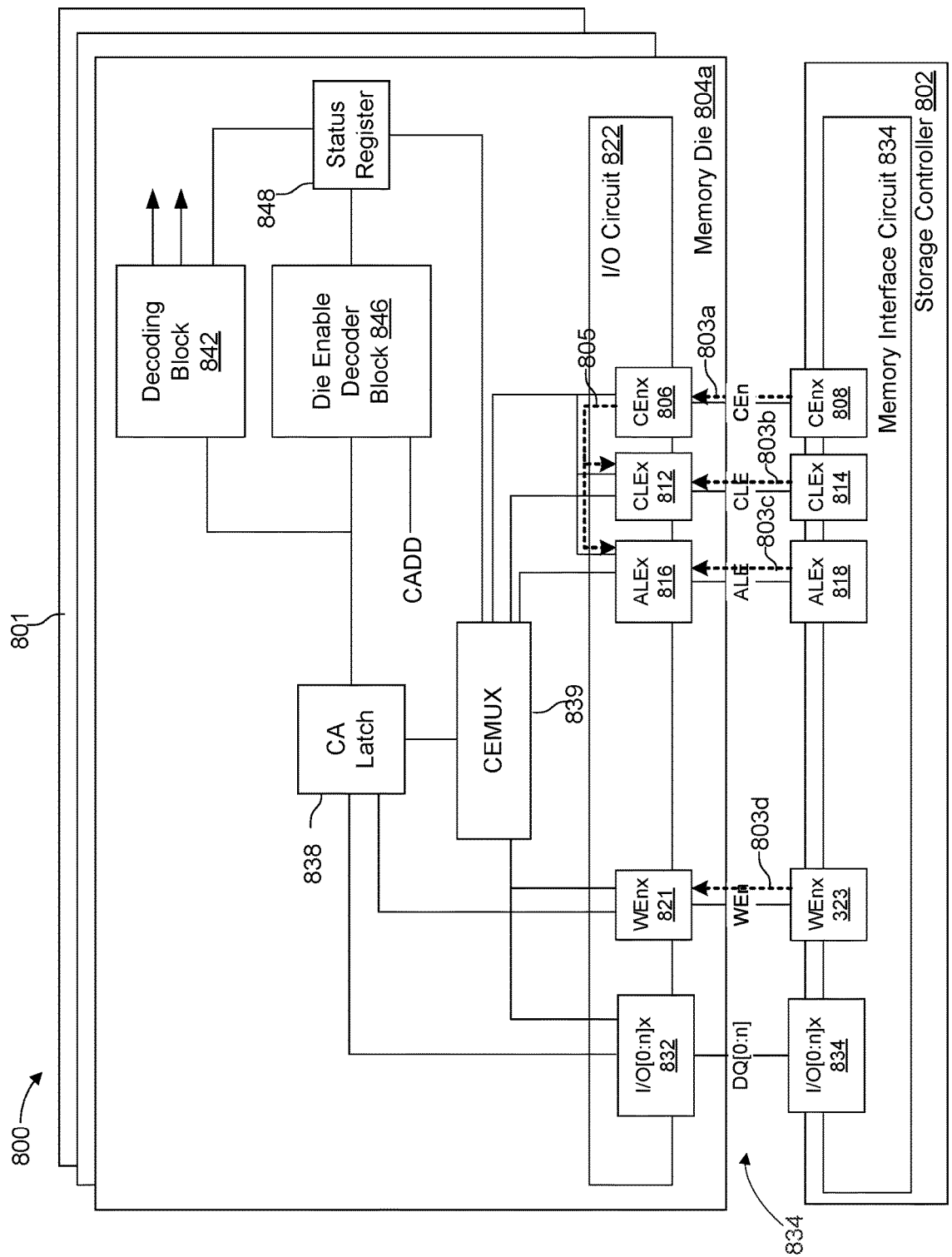
FIGS. 8A-8E illustrate a block diagram of an example architecture of a memory device in accordance with various embodiments disclosed herein.

Referring to FIG. 8A, to initiate a data operation on the memory die 804a, the storage controller 802 transmits a die switch opcode 803. The die switch opcode 803 comprises a CEn signal 803a, CLE signal 803b, ALE signal 803c, and a WEn signal 803d, and is an example implementation of the die switch opcode described above in connection with FIG. 7. For example, the storage controller 802 may issue the die switch opcode by asserting the CEn signal 803a at logic LOW level, the CLE signal 803b at logic HIGH level, and the ALE signal 803c at logic HIGH level.

The CEn signal 803a is provided to CEnx pin 806 to activate the memory die 804a. Upon receiving the CEn signal 803a, the CEnx pin 806 is activated and generates an internal CEn signal 805, which activates other pins of the memory die 804a for responding to control signals received from the storage controller 802. For example, the storage controller 802 toggles the CEn signal 803a from a logic HIGH level to a logic LOW level, which sets the internal CEn signal 805 to logic HIGH level, thereby activating the input/output circuit 822 of the memory die 804a. Along with memory die 804a, the CEn signal 803a is received by a CEnx pin of each memory die of the memory array 801, thereby activating the input/output circuit of each the memory die.

Figure 8B:
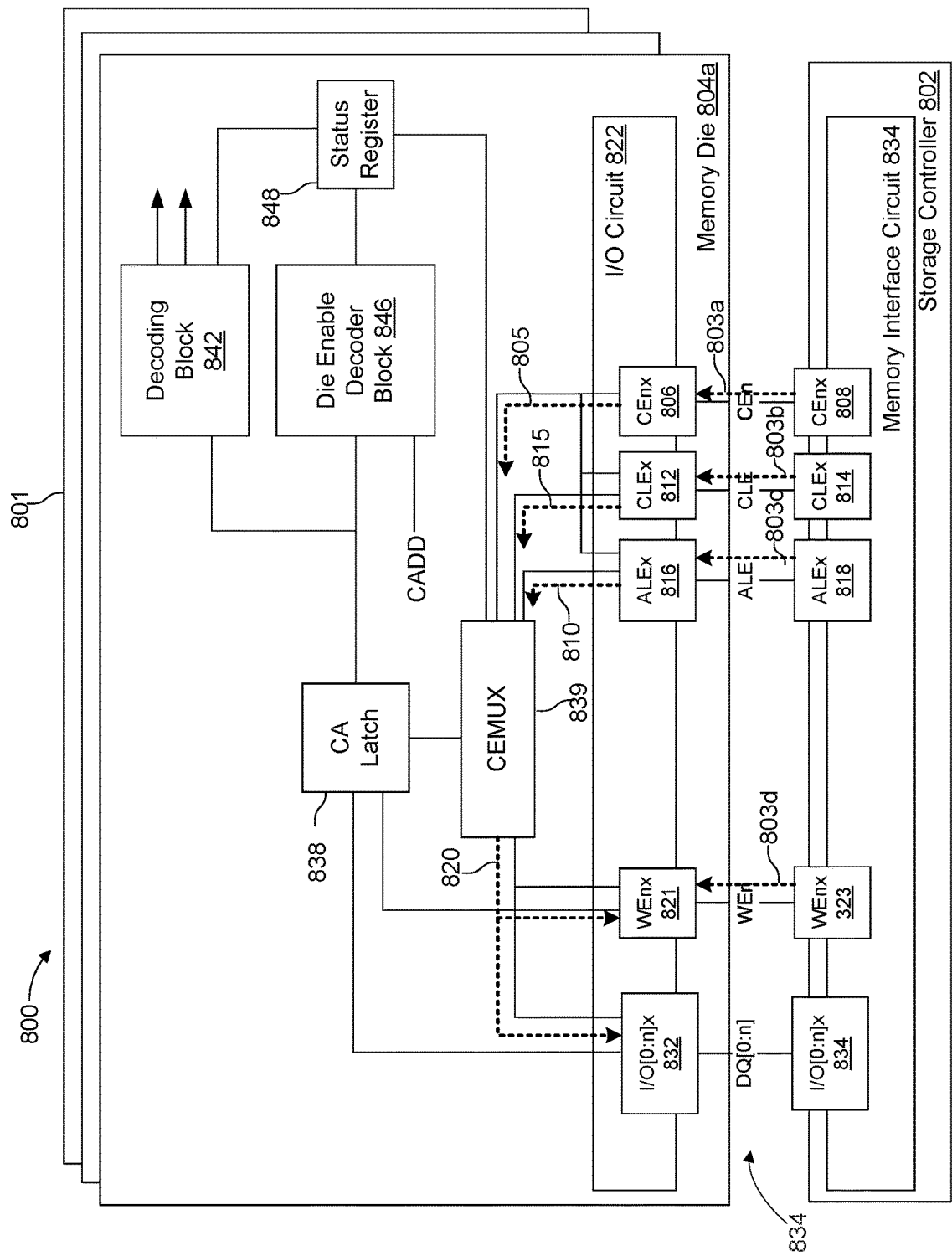

Upon generating the CEn signal 805, the memory die 804a activates or otherwise enables the CLEx pin 812 and the ALEx pin 816. The memory die 604a may detect control signals from the storage controller 802 via the activated pins on the memory die 104a before diverting those signals to appropriate logic blocks within the memory die. For example, as shown in FIG. 8B, the ALE signal 803c and the CLE signal 803b are received on the activated (or enabled) ALEx pin 816 and CLEx pin 812, respectively. ALEx pin 816 and CLEx pin 812 generate an internal ALE signal 810 and internal CLE signal 815, respectively. When the storage controller 802 asserts the ALE signal 803c and the CLE signal 803b at logic HIGH level, the memory die 804a is instructed that the idle current saving mode is enabled, the die enable decoder block 846 is enabled, and that address data (e.g., an address code) is included in I/O data encoded on the DQ signals.

The CEn signal 805, CLE signal 815, and ALE signal 810 are directed to a CE multiplexer 839 (which may be similar to CE multiplexer 639 of FIG. 6), as shown in FIG. 8B. Based on receiving the CEn signal 805 and both the ALE signal 810 and the CLE signal 815 at logic HIGH level, the CE multiplexer 839 generates a signal 820 that activates or enables each of the I/O[0:n]x pins 826 and the WEnx pin 821 of the memory die 804a. The CE multiplexer 839 comprises internal logic gates requiring the CEn signal 805 at logic HIGH level and both ALE signal 610 and CLE signal 615 at logic HIGH level to enable the I/O[0:n]x pins 826 and WEnx pin 821. For example, one or more AND gates may be utilized to gate the enabling of the I/O[0:n]x pins 826 and WEnx pin 821, by ensuring that the CEn signal 805 is at logic HIGH level and both ALE signal 610 and CLE signal 615 are at logic HIGH level.

Figure 8C:
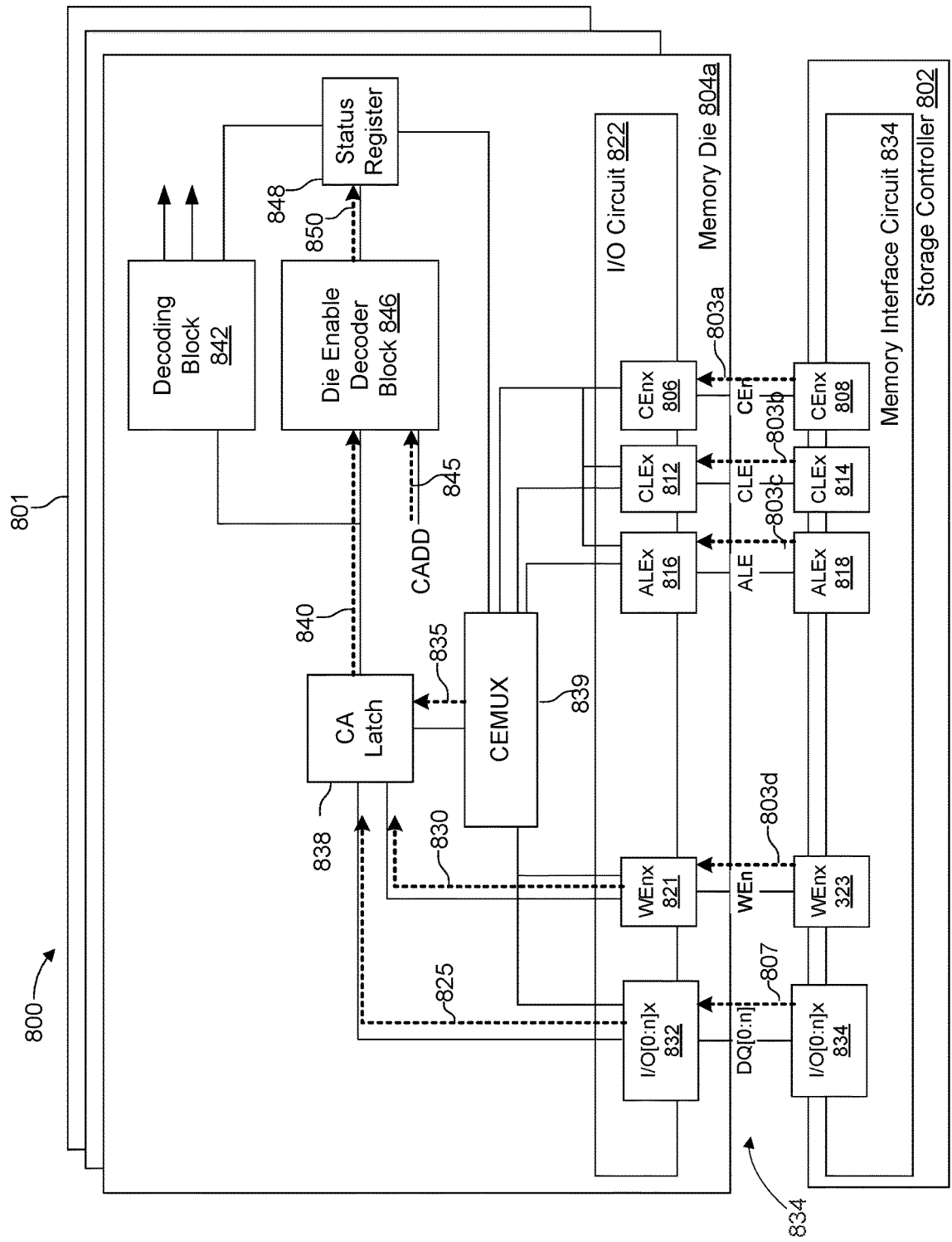

Once enabled, the I/O[0:n]x pins 826 detect the DQ signals 807, encoded with I/O data including address data (e.g., address code), from the storage controller 802, as shown in FIG. 8C. DQ signals 807 may be provided at the same time and/or along with the die switch opcode 803 or may be provided later in time. In the case where the I/O[0:n]x pins 826 are activated based on both CLE signal 815 and ALE signal 810 at logic HIGH level, I/O[0:n]x pins 826 generate data signal 825, which is provided to command/address (CA) latch 838. The I/O[0:n]x pins 826 generate signal 825 based on the number of I/O[0:n]x pins 862, for example, where there are two such pins, data signal 825 may include two data signals 825. The CA latch 838 may be substantially similar to CA latch 638 of FIG. 6. The CA latch 838 may include any type of flip-flop, buffers, registers, or other temporary storage mechanisms that may be used that sample the I/O data on signal 825 according to the WEn signal 821. For example, a D type flip-flop may be implemented as part of the CA latch 838. Thus, CA latch 838 temporarily stores the I/O data before transmitting the I/O data to the die enable decoder block 846. The CA latch 838 may be enabled or be otherwise activated based on receiving the CLE signal 810 and the ALE signal 815 from the CE multiplexer 839 (e.g., signal 835).

The I/O data comprises at least address data indicating one or more memory dies which are to be enabled for a current data operation associated with the die switch opcode 803. The address may be provided, for example, as an address code as shown in Table 2. In some embodiments, the CA latch 838 latches the address data at each rising and/or falling edge of a WEn signal 830. In some embodiments, another mechanism may temporarily store the CA data sent via the I/O signals 825 may be used instead of a latch. For example, in some embodiments, flip-flops, buffers, registers, or other temporary storage mechanisms may be used that sample the I/O data on signal 825 according to the WEn signal 830. The CA latch 838 may comprise one or more registers, for example, as set forth in connection with FIG. 2C. For example, the CA latch 838 may comprise an address register (e.g., address register 268) that temporarily stores address data sampled from signal 825 by the CA register according to the WEn signal 830.

The WEnx pin 821 generates an internal WEn signal 830 responsive to activation of the WEnx pin 821. The WEnx pin 821 generates the internal WEn signal 830 based on the WEn signal 803*d* from the storage controller 802.

Figure 10:
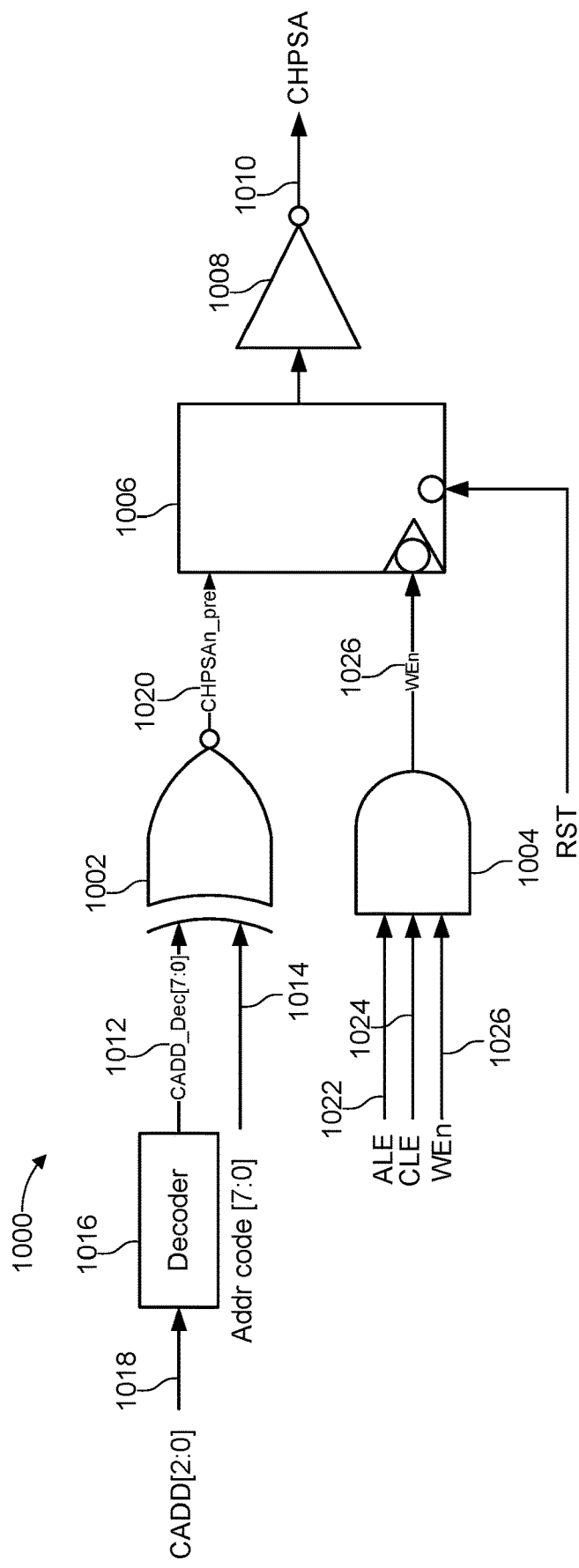
FIG. 10 depicts a schematic diagram of an example circuit implementation of a die enable decoder block according to example embodiments of the disclosed technology.

As shown in FIG. 8C, The latched I/O data, comprising the address data, is provided to the die enable decoder block 846 as signal 840, along with the CLE signal, ALE signal, and WEn signal as one or more internal signals 840, as shown in FIG. 8C. While a one signal 840 is shown, embodiments herein may include one or more signals 840, such as separate signals 840 for each of the CLE signal, I/O data, ALE signal, and WEn signal. A CADD signal 845 is also supplied to the die enable decoder block 846 that includes a CADD, for example, as described above in connection to Table 2. As noted above, the CADD may be an address hard coded into each respective memory die. The die enable decoder block 846, gated based on the CLE signal and ALE signal, decodes the address data from the signal 840 and the CADD from the CADD signal 845 and converts the data into form that is understood by the die enable decoder block 846. For example, die enable decoder block 846 converts a bit pattern encoded on the signal 840 into an address indicative of one or more selected memory dies of the memory array 801 for executing data operations. The die enable decoder block 846 also comprises circuitry and logic that converts the address data and CADD into a chip enable status (CHPSA) signal 850. An example circuit implementation of the die enable decoder block 846 is shown in FIG. 10, discussed below.

The CHPSA signal 850 may be an active-high signal, according to various embodiments, for enabling or disabling the pins of the memory die 804*a*. For example, the CHPSA signal 850 may be asserted by the die enable decoder block 846 at logic HIGH level in a case where the memory die identified by the CADD (e.g., CADD signal 845) matches a memory die identified by the address data encoded in the DQ signals (e.g., from signal 840). Respective memory dies are enabled for command/address sequencing and DIN/DOUT operations based on the CHPSA signal 850 set at the logic HIGH level. Conversely, the CHPSA signal 850 is asserted at logic LOW level in a case where the memory die identified by the CADD does not match a memory die indicated by the address data. In this case, the respective memory die can be disabled from further operations. The CHPSA signal 850 is then latched into a status register 848 (e.g., status register 266 of FIG. 2C), which temporality stores the CHPSA signal 850 as a die status state.

The above signal flow shown in FIGS. 8A-8C is performed in each memory die of the memory array 801, where memory die 804*a* is provide as an illustrative example. Thus, each memory die of the memory array 801 comprises a CHPSA signal 850 latched into a respective status register 848 as a respective die status state. As noted above, a first one or more memory dies may have a die status state at logic HIGH level indicating that the first one or more memory dies are enabled for subsequent data operations, while a second one or more memory dies may have die status state at a logic LOW level indicating that the second one or more memory dies are disabled for subsequent operations. In the case that the die switch opcode was a broadcast die switch opcode, all die would be enabled as part of the first one or more memory dies, and there would be no memory dies in the second one or more memory dies.

Figure 8D:
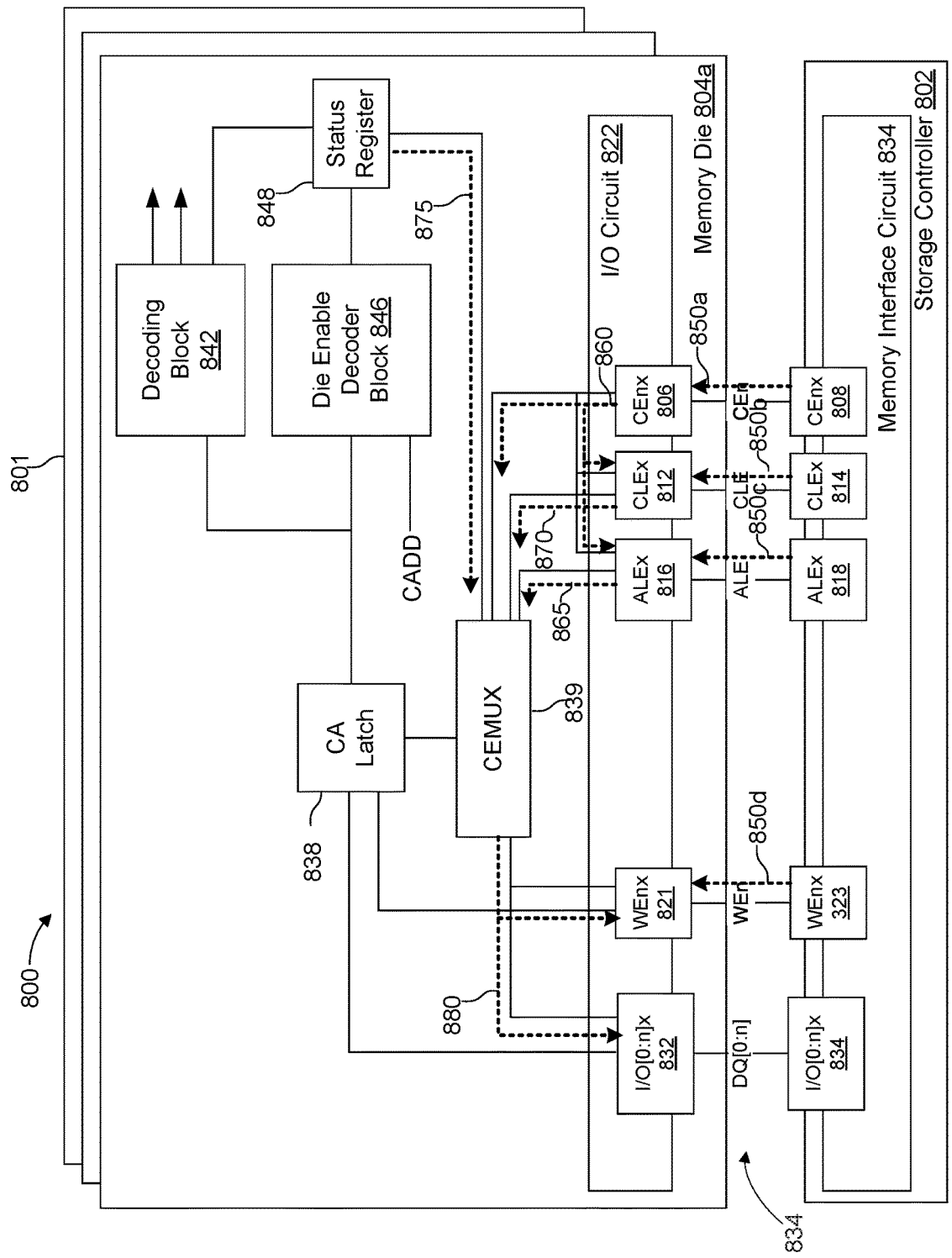

Referring to FIG. 8D, after storing the CHPSA signal 850 in the status register 848, the storage controller 834 transmits control signals 855 to initiate a command/address sequencing. In one example, control signals 855 may correspond to command/address sequencing as part of a data operation (e.g., read, write, program, etc.) associated immediately following the die switch opcode 803. In another example, control signals 855 may correspond to command/address sequencing of a subsequent data operation, for example, where the data operation associated with the die switch opcode 803 has been completed and the storage controller 802 issue a next data operation. In either case, to initiate the subsequent data operation, the storage controller 802 toggles the CEn signal from a logic HIGH level to a logic LOW level, which activates the CEnx pin 806 and sets internal CEn signal 660 to logic HIGH level.

Upon generating the CEn signal 860, the CLEx pin 812 and ALEx pin 816 are enabled as set forth herein. Upon activating the CLEx and ALEx, a CLE signal 850*b* and an ALE signal 850*c* may be received by the respective pins and diverted to the appropriate logic blocks. When the storage controller 802 asserts the ALE signal 850*c* at logic HIGH level, the memory die 804*a* is instructed that address sequencing is enabled and that address data (e.g., an address code) is encode on the DQ signals. When the storage controller 802 asserts the CLE signal 850*b* at logic HIGH level, the memory die 804*a* is instructed that command sequencing is enabled and that command data (e.g., a command code) is encoded on the DQ signals.

The ALEx pin 816 and CEnx pin 812 generate ALE signal 865 and CLE signal 870, which are directed to the CE multiplexer 839. The CE multiplexer 839 pulls the die status state from the status register 848 as die status signal 875 and, based on receiving the CEn signal 860 and at least one of the ALE signal 865 and the CLE signal 870. The CE multiplexer 839 generates a signal 880, gated by the die status signal 875, that activates or enables each of the I/O[0:n]x pins 826 and WEnx pin 821 of the memory die 804*a*. For example, I/O[0:n]x pins 826 and WEnx pin 821 are enabled or activated if the die status signal 875 set to logic HIGH level, otherwise the I/O[0:n]x pins 826 and WEnx pin 821 are disabled or deactivated. The CE multiplexer may include one or more AND gates utilized to gate enabling of the I/O[0:n]x pins 826 and WEnx pin 821, by ensuring that the CEn signal 860 is at logic HIGH level and at least the die status signal 875 is at logic HIGH level. The die status signal 875 at logic HIGH level indicates that memory die 804*a* is enabled. Otherwise, the die stat signal 875 at logic LOW level indicates the memory die 804*a* is not enabled and the CE multiplexer 839 generates signal 880 at logic LOW level, which disables or deactivates the I/O[0:n]x pins 826 and WEnx pins 821. Disabling or deactivating the I/O[0:n]x pins 826 and WEnx pins 821 ensures that the memory die 804a is in a standby state and power is not consumed.

In the case that the signal 880 is asserted at logic HIGH level, the I/O[0:n]x pins 826 detect the DQ signals, encoded with I/O data, from the storage controller 802. In the case where the I/O[0:n]x pins 826 are activated based on the CLE signal 870 and/or ALE signal 865, I/O[0:n]x pins 826 generate signals 885, which is provided to command/address (CA) latch 838 to temporarily store the I/O data before transmitting the I/O data to a decoding block 842 (which may be substantially similar to decoding block 642). The CA latch 838 may be enabled or be otherwise activated based on receiving the CLE signal 870 and/or ALE signal 865 from the CE multiplexer 839 gated according to the die status signal 875. The I/O data may comprise either command data or address data, as indicated by the storage controller 802 asserting the CLE signal or ALE signal at logic HIGH levels. In some embodiments, the CA latch 838 latches the command or address data at each rising and/or falling edge of the WEn signal 890 (generated based on WEnx pin 821 detecting WEn signal 850d).

The latched I/O data, comprising command and/or address data, is provided to the decoding block 842, along with the CLE signal 870, ALE signal 865, and WEn signal 890 as one or more internal signals 895. The decoding block 842 pulls the die status state from the status register 848 as modified CEn signal 894. In the case that the modified CEn signal 894 is asserted at logic HIGH level, the decoding block 842 decodes the command data and the address data from the signal 895 and generates a CMD signal 896 (e.g., CMD signal 635 of FIG. 6) responsive to decoding a command/address sequence from latched I/O data on signal 895, for example, as described in connection with FIG. 6. Additionally, if the modified CEn signal 894 is asserted at logic HIGH level, decoding block 842 generates a CHPSEL signal 897 (e.g., CHPSEL signal 640 of FIG. 6) responsive to decoding the address code from the latched I/O data on signal 895, for example, as described in connection with FIG. 6. The CMD signal 896 and CHPSEL signal 897 are used by the memory die 804a as described in connection with CMD signal 635 and CHPSEL signal 640 of FIG. 6. For example, in the case that the CHPSEL signal 897 is set to logic HIGH level for memory die 804a and, responsive to the CMD signal 896 and the CHPSEL signal 897, the CE multiplexer 839 activates or enables each of the I/O[0:n]x pins 826 and a DQSx pin (not shown) of the memory die 804a for performing the DIN/DOUT operation of the data operation.

Conversely, if the modified CEN signal 894 is asserted at logic LOW level, then the decoding block 842 is disabled. Thus, if the CHPSEL signal 897 is set to logic LOW level for memory die 804a, the CE multiplexer 839 disables the I/O[0:n]x pins 826 and the DQSx pin (not shown) for the DIN/DOUT operation of the data operation and saves idle power.

It is to be understood that only some elements are shown in FIGS. 8A-8E. However, other logic circuits and/or components that may be needed or considered desirable to have in performing the function described herein may be used in other embodiments.

Figure 9:
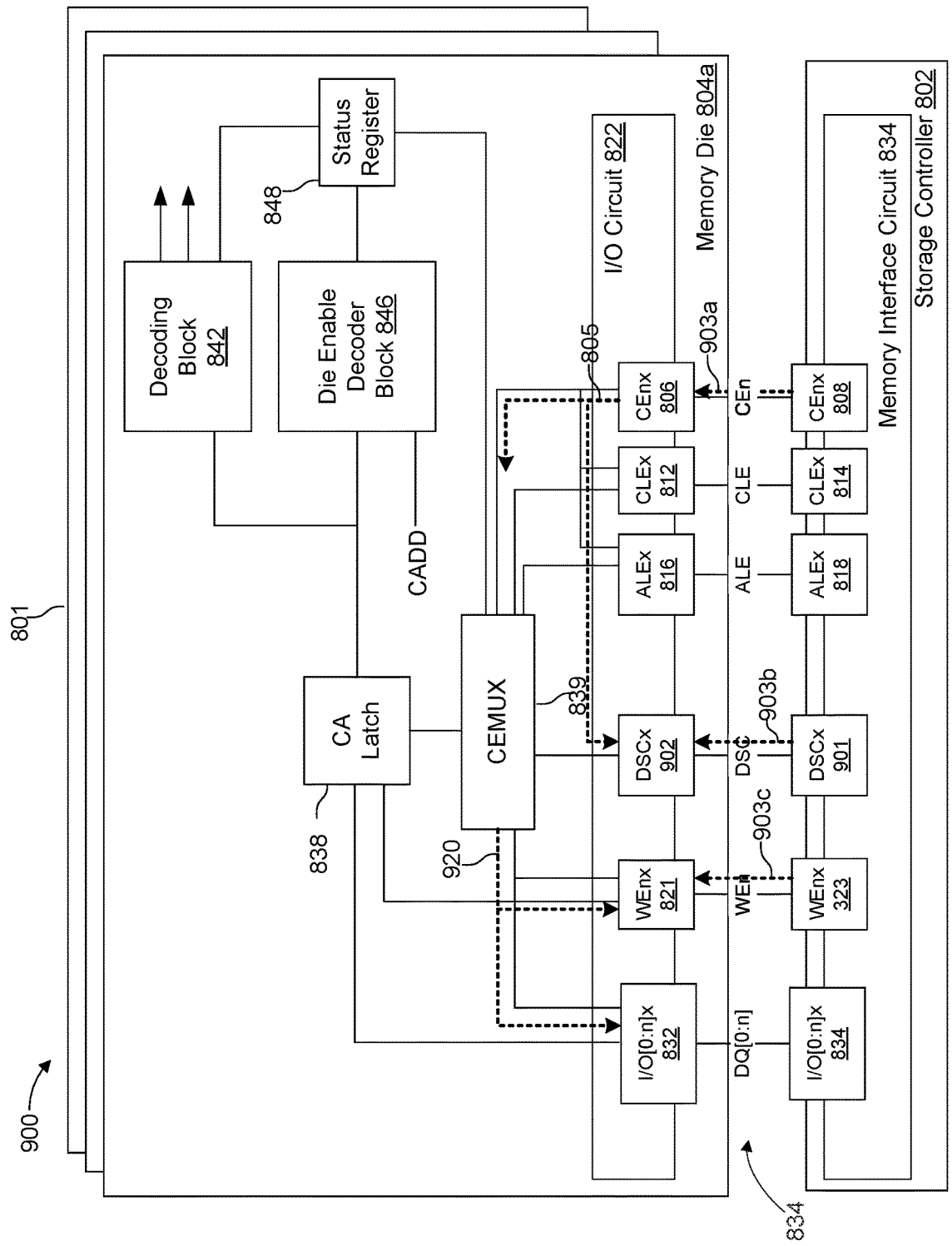
FIG. 9 illustrates a block diagram of another example architecture of a memory device in accordance with an embodiment disclosed herein.

Furthermore, as introduced above, some embodiments disclosed herein may include an optional DSOx pin on the memory dies of the memory array 801 for receiving a DSO signal from a DSOx pin on the storage controller 802. For example, FIG. 9 illustrates a block diagram of an example architecture of a memory device 900 in accordance with an embodiment disclosed herein using a DSO signal. FIG. 9 illustrates also illustrates a flow of control signal within the memory device 900, between storage controller 802 and memory die 804a, which are substantially the same as that described in connection with FIGS. 8A-8B.

However, in the embodiment shown in FIG. 9, to initiate a data operation on the memory die 804a, the storage controller 802 transmits a die switch opcode 903 from DSOx pin 901 to DSOx pin 902 on the memory die 804a. The die switch opcode 903 comprises a CEn signal 903a and a WEn signal 903c, similar to the die switch opcode 803. The die switch opcode 903 also includes the DSO signal 903b, instead of the CLE signal 803b and the ALE signal 803c. The DSO signal 903b may be similar to the DSO signal 730 of FIG. 7B, such that the DSO signal 903b may be asserted at logic HIGH level. In some embodiments, the DSOx pins 901 and 902 may be unused pins on the storage controller 802 and memory die 804a, respectively. In another embodiment, new pins may be physically manufactured into the memory die 804a and storage controller 802 for transmitting the DSO signal 903b.

Upon receiving the CEn signal 903a, the CEnx pin 806 is activated and generates an internal CEn signal 805, which activates other pins of the memory die 804a for responding to control signals received from the storage controller 802. In the embodiment shown in FIG. 9, upon generating the CEn signal 805, the memory die 804a activates or otherwise enables the DSOx pin 902, which detects the DSO signal from the storage controller 802. The DSOx pin 902 generates an internal DSO signal 910. The CEn signal 805 and DSO signal 910 are directed to the CE multiplexer 839. Based on receiving the CEn signal 805 and the DSO signal 910 at logic HIGH level, the CE multiplexer 839 generates a signal 920 that activates or enables each of the I/O[0:n]x pins 826 and the WEnx pin 821 of the memory die 804a, for example, in a manner that is substantially the same as that described in connection with FIG. 8B.

Figure 8E:
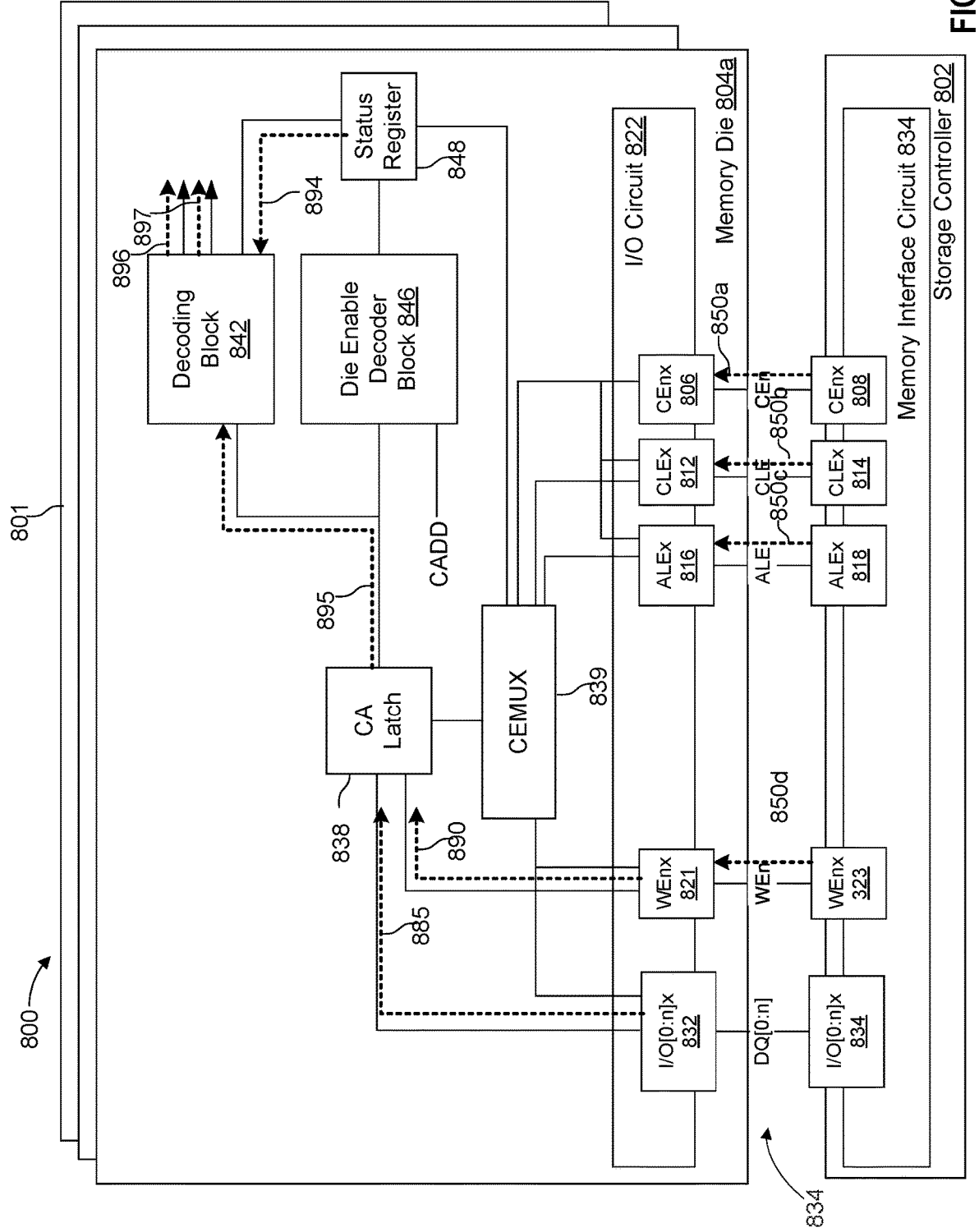

From this point forward, the signal flow proceeds in a manner similar to the flow described in connection with FIGS. 8C-8E, except that the DSO signal 910 asserted at logic HIGH enables the die enable decoder block 846 in place the ALE signal and CLE signal at logic HIGH levels. After storing the CHPSA signal 850 as the die state status in the status register 848, for subsequent data operations, the DSO signal and DSOx pins are not utilized, and the process proceeds as described in connection with FIGS. 8D and 8E.

FIG. 10 depicts a schematic diagram of an example circuit implementation 1000 of a die enable decoder block 846 block according to example embodiments of the disclosed technology. The circuit 1000 comprises a plurality of logic gates, for example, a comparison logic gate 1002 and a AND gate 1004 connected to input terminals of a flip-flop 1006. The output of the flip-flop 1006 is connected to an inverter 1008 arranged to logically invert the logic level of the output of the flip-flop 1006. The inverter 1008 outputs a CHPSA signal 1010, for example, to the status register 848, as described in connection with FIG. 8C. The CHPSA signal 1010 may be an example implementation of the CHPSA signal 850 of FIG. 8C.

In the example shown in FIG. 10, the comparison logic gate 1002 is an exclusive-OR (XOR) gate having inputs receiving a decoded chip address 1012 and an address code 1014. The XOR gate 1002 is arranged to output logic LOW level when the inputs match, otherwise the XOR gate 1002 outputs logic HIGH level. In another example, the comparison logic gate 1002 may comprise an exclusive-NOR (XNOR) gate and an inverter (not shown). In this case, the XNOR gate outputs logic LOW level when the inputs match, otherwise a logic HIGH level. The inverter logically inverts the logic HIGH level to logic LOW level as input into the flip-flop 1006.

The address code 1014 may be the address data included in the latched I/O data of signal 840 of FIG. 8C. For example, the address code may be a bit pattern encoded into the DQ signal that is latched at the CA latch 838 and provided to the die enable decoder block 846 as signal 840. The address code 1014 may be a bit pattern as shown, for example, in Table 2 above. The decoded chip address 1012 is the output of the decoder 1016, which has the chip address 1018 as an input. The chip address signal 1018 may be the CADD signal 845 as described in connection with FIG. 8C. The decoder 1016 may be configured to convert the chip address 1018 into a form that is understood by the die enable decoder block 846. For example, the decoder 1016 converts a 3-bit wide CADD (as described in Table 2) into an n-bit wide format that can be logically compared with the address code, where n is the number of memory dies on the memory array (e.g., in the case of an 8 die array from Table 2, the decoded CADD is 8-bits wide). In the illustrative example, the CADD is provided as 3-bit wide bit pattern, however other bit widths are possible within the scope of the disclosed technology. Furthermore, while 8-bit wide address codes are utilized in the present example, other bit widths are possible within the scope of the disclosed technology. Furthermore, the decoder 1016 converts the CADD into a bit width that matches the bit width of the address code such that the comparison logic gate 1002 can perform the comparison.

Accordingly, the comparison logic gate 1002 compares the decoded chip address 1012 to the address code 1014 bit by bit and outputs a first chip enable status (CHPSAn_pre) signal 1020 to the data input terminal of the flip-flop 1006. For example, as described above, the comparison logic gate 1002 may be implemented as an XOR gate, which compares the decoded chip address 1012 to the address code 1014 bit by bit, thereby applying the exclusive OR operation to each bit. For each matched bit in the comparison, the corresponding memory die is selected. For example, if the address code 1014 is 01000000 (e.g., identifying die 7) and the decoded chip address 1012 is 01000000, then die 7 is enabled. If the address code 1014 is 01000001 (e.g., identifying die 7 and die 0) and the decoded chip address 1012 is 01000000 (e.g., die 7), then die 7 is enabled. In this case, if the decoded chip address 1012 for another memory die is 00000001 (e.g., die 0), then die 0 is also enabled along with die 7.

If the comparison logic gate 1002 determines that the decoded chip address matches the address code, the comparison logic gate 1002 outputs logic LOW level as CHPSAn_pre signal 1020, otherwise it outputs logic HIGH level as CHPSAn_pre signal 1020. The CHPSAn_pre signal 1020 is connected to the data input terminal of the flip-flop 1006. Flip-flop 1006 be any type of flip-flop, for example, a D type flip-flop in various embodiments.

The AND gate 1004 is connected to an ALE signal 1022, a CLE signal 1024, and a WEn signal 1026 at the inputs. The AND gate 1004 is arranged to output the WEn signal responsive to the ALE signal 1022 and the CLE signal 1024 at logic HIGH levels. In an example embodiment, the ALE signal 1022, CLE signal 1024, and WEn signal 1026 are input from the one or more signals 840 of FIG. 8C. Thus, for example, when the storage controller 802 asserts the ALE signal and CLE signal at logic HIGH level and, for example, the AND gate 1004 outputs the WEn signal. In another example, where a DSO signal is utilized, the ALE signal 1022 and CLE signal 1024 may be replaced with a single DSO signal, for example, the DSO signal 903b of FIG. 9. In this example, when the DSO signal is asserted at logic HIGH level and, for example, the AND gate 1004 outputs the WEn signal.

The output of the AND gate 1004 is connected to a clock input terminal of the flip-flop 1006 to gate the flip-flop 1006 and the voltage drain connected to a reset (RST) operation. In operation, during a system reset or startup (e.g., RST operation), all memory dies are enabled, for example, CHPSA is set to logic HIGH level for all memory dies. Responsive to ALE signal 1022 and CLE signal 1024 asserted at logic HIGH level, the AND gate 1004 outputs the WEn signal 1026 to the clock terminal of the flip-flop 1006. If the ALE signal 1022 and CLE signal 1024 are not both set to logic HIGH level, then signal 1026 is set to logic LOW level to gate the flip-flop 1006, thereby gating the flip-flop 1006 and ensuring that the CHPSA signal 1010 is generated only when the ALE/CLE signals enable the circuit 1000 (or, in another example, a DSO signal is set to logic HIGH level).

If the comparison logic gate 1002 determines that the decoded CADD 1012 matches the address code 1014, the CHPSAn_pre signal 1020 is asserted at logic LOW level at the data terminal of the flip-flop 1006. Based on the gating at the clock input terminal, the flip-flop 1006 outputs the logic LOW level to the inverter 1008. The inverter 1008 logically inverts the logic LOW level to logic HIGH level and sets the CHPSA signal 1010 as logic HIGH level. The CHPSA signal 1010 is then latched in a register (e.g., status register 848) for enabling the memory die, for example, as explained in connection with FIGS. 8C-8E.

If the comparison logic gate 1002 determines that the decoded CADD 1012 does not match the address code 1014, the CHPSAn_pre signal 1020 is asserted at logic HIGH level, which resets the flip-flop 1006. Based on the gating at the clock input terminal, the flip-flop 1006 outputs the logic HIGH level to the inverter 1008. The inverter 1008 logically inverts the logic HIGH level to logic LOW level and sets the CHPSA signal 1010 as logic LOW level. The CHPSA signal 1010 is then latched in a register (e.g., status register 848) for disabling the memory die, for example, as explained in connection with FIGS. 8C-8E.

Figure 11:
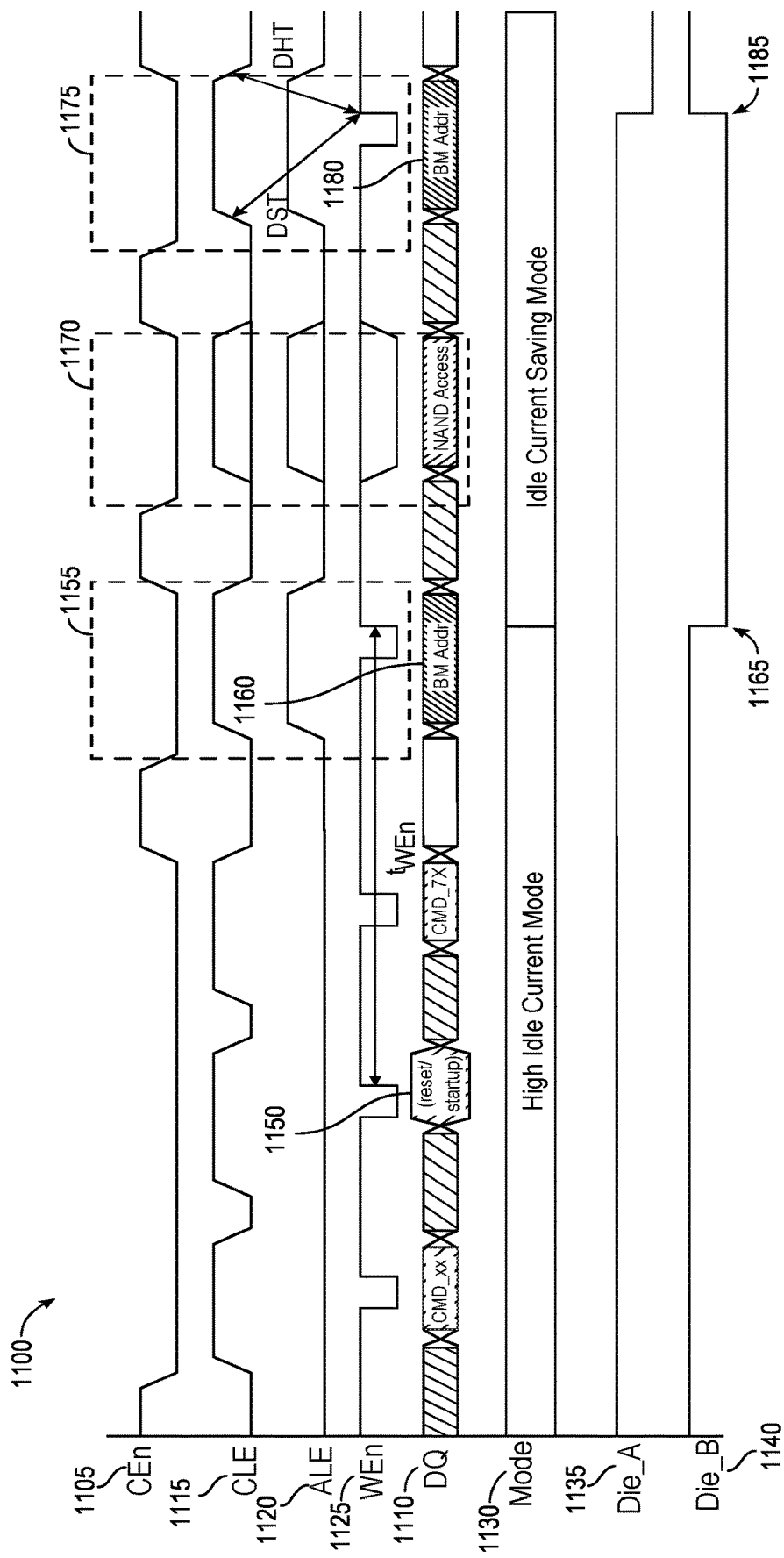
FIG. 11 is an example timing diagram illustrating embodiments of the present disclosure.

FIG. 11 is an example timing diagram 1100 illustrating embodiments of the present disclosure. Timing diagram 1100 may be implemented by elements of a memory device (e.g., memory device 800), for example, by the storage controller 802 and memory array 801. FIG. 11 includes a plurality of signals, such as CEn signal 1105, DQ signal 1110, CLE signal 1115, ALE signal 1120, WEn signal 1125, mode signal 1130, memory die A status signal 1135, and memory die B status signal 1140.

Timing diagram 1100 depicts the behavior of a memory dies of a memory array comprising multiple memory dies according to embodiments described above. For example, timing diagram 1100 depicts a die status states of a first memory die as memory die A status signal 1134 and a second memory die as memory die status signal 1140. The first and second memory dies are included in the memory array (e.g., memory array 800). While two memory dies are illustrated herein, more than two memory dies may be implemented. Each having its own memory die status signal indicating the die status state.

Initially, the storage controller may be sending one or more commands (e.g., CMD_xx) on the DQ signal 1110, during a high idle current mode. The commands CMD_xx, during this high idle current mode case, are transmitted to each memory die in the memory array. That is, as shown in signals 1135 and 1140, both the memory dies (e.g., all memory dies in the memory array) are enabled and are receiving the commands CMD_xx. During this time, each memory die is processing the commands CMD_xx regardless of whether the CMD_xx is intended for each respective memory die or not, for example, as described above in connection with FIG. 6. Thus, memory dies that are not necessary for executing the CMD_xx are consuming power to process each commands CMD_xx, resulting in a high idle current consumption mode.

Then, at a time 1150, a reset or startup command is issued to the memory device, followed by a die switch opcode 1155 from the storage controller, sampled according to the WEn signal 1125 (based in part on a die switch opcode setup time (DST) and hold time (DHT). After a period twEn elapses (e.g., a cycle of the WEn signal 1125), the die switch opcode 1155 is sampled at the rising edge of the WEn signal 1125, which instructs the memory dies to enable low idle current saving mode. The die switch opcode 1155 comprises an assertion of the CEn signal 1105 at logic LOW level, the CLE signal 1115 at logic HIGH level, and the ALE signal 1120 at logic HIGH level. At this time, the storage controller also sends address data on the DQ signal 1110 indicating which memory dies are to be enabled and which to be disabled.

Responsive to the CLE signal 1115 and the ALE signal 1120 set to logic HIGH level, the memory device switches to the idle current saving mode. The memory dies indicated in the address data on the DQ signal 1110 are enabled (e.g., as described in connection with FIGS. 8A-8E). In the illustrative example of FIG. 11, address data is sent on the DQ signal 1110 indicating that the first memory die is to be enabled and the second memory die is to be disabled. The address data is latched in the first memory die at the rising edge of the WEn signal 1125 and is used to enable the first memory die (e.g., the die status state is set to logic HIGH level), as shown in memory die A status signal 1135 at time 1165. Also, the address data is latched in the second memory die according to the WEn signal 1125 and is used to disable the second memory die (e.g., the die status state is set to logic LOW level), as shown in memory die B status signal 1140 at time 1165.

During time period 1170, the storage controller issues subsequent data operation(s) (e.g., command/address sequencing and/or DIN/DOUT operations) to the memory array, for example, as described above in connection with FIGS. 8D and 8E. The enabled memory dies (e.g., the first memory die in FIG. 11) are used to execute the data operations, while the disabled memory dies remain disabled and thus do not consume current unnecessarily. Accordingly, during the idle current saving mode, only enabled memory dies consume power to process commands, while disabled memory dies do not.

The die status state of each memory die is maintained until a second die switch opcode is transmitted by the storage controller. For example, as shown in FIG. 11, a second die switch opcode 1175 is transmitted with a second address code 1180 on the DQ signal 1110. In this case, the address code indicates that the first memory die is to be disabled and the second memory die is to be enabled. Thus, at time 1185, the first memory die is deactivated (e.g., time 1185 on signal 1135) and the second memory die is activated (e.g., time 1185 on signal 1140).

Figure 12A:
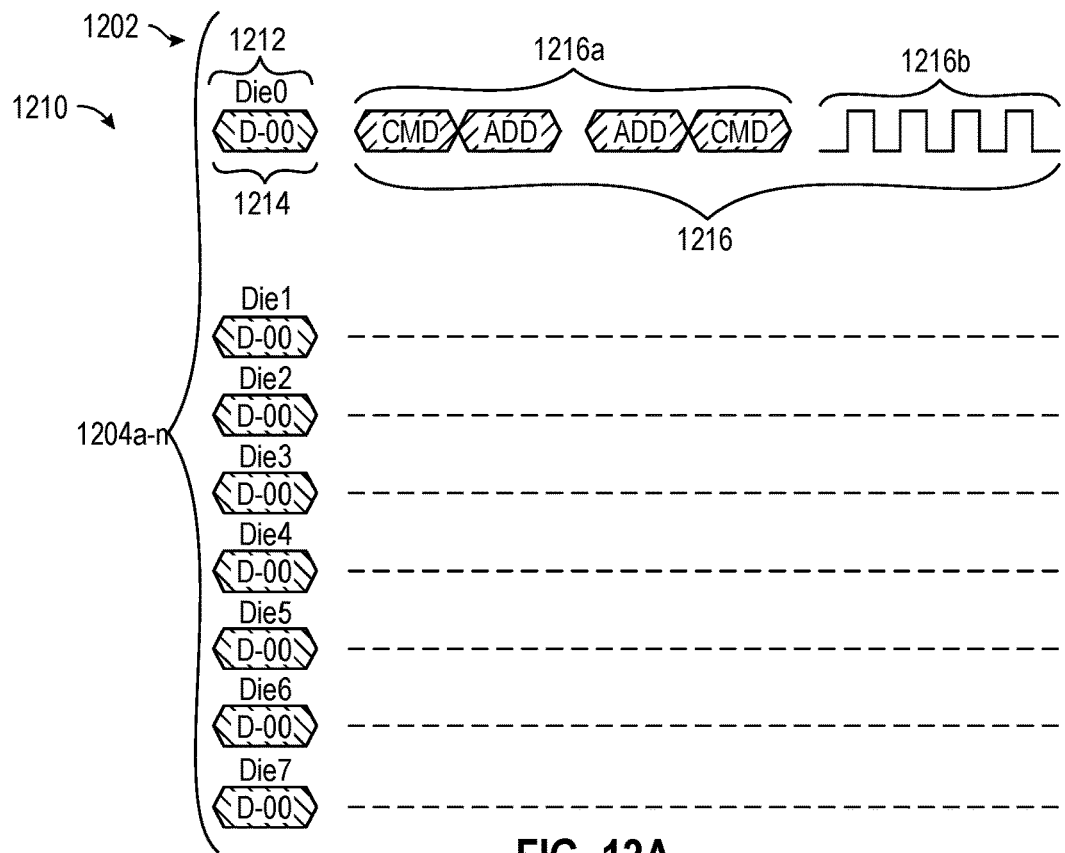
FIGS. 12A and 12B are schematic block diagrams for visualizing the embodiments disclose herein.
Figure 12B:
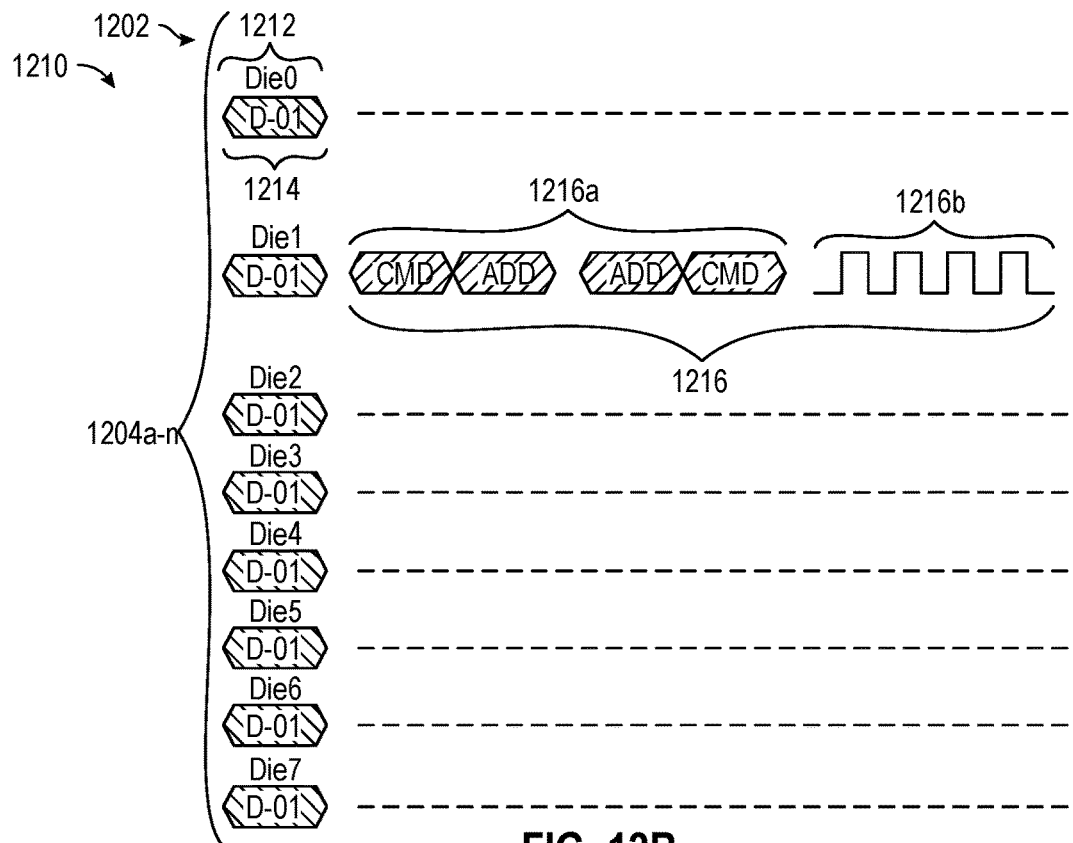

FIGS. 12A and 12B are schematic block diagrams 1210 and 1220 for visualizing the embodiments disclose herein. Diagrams 1210 and 1220 provide illustrative visualizations of switching enabling/disabling of memory dies 1204a-n (e.g., where memory die 804a is an example implementation) in a memory array 1202 (e.g., memory array 801), for example, based on a die switch opcodes 1212 and 1222, respectively, from a storage controller (e.g., storage controller 802). As illustrated in FIGS. 12A and 12B, the memory array 1202 comprises eight memory dies 1204a-n labeled as Die0 through Die7. However, any number of memory dies 1204a-n may be used, and eight dies are shown in FIGS. 12A and 12B as an illustrative example.

Referring to FIG. 12A, the die switch opcode 1212 may include at least an ALE signal and CLE signal asserted at logic HIGH level (or, in another example, a DSO signal asserted at logic HIGH level) and accompanied by an address code 1214. The address code 1214 may be encoded in a DQ signal as a bit pattern indicative of one or more memory dies to be selected. Table 2 above illustrates example bit patterns. In the example of FIG. 12A, the address code 1214 may indicate Die0 is selected. Responsive to the address code 1214 and the die switch opcode 1212, Die0 is enabled and Die1 through Die7 are disabled. Once selected, data operations 1216 (e.g., command sequencing 1216a and DIN/DOUT operations 1216b) are performed on Die0 only. All other dies do not process these commands, as shown by the dashed lines. Thus, Die0 through Die7 are disabled and do not consume current while idle.

The storage controller may issue a command to shift to a new one or more dies for data operations. That is, as shown in FIG. 12B, when the storage controller decides to switch which dies are enabled or disabled, the storage controller issues a second die switch opcode 1222. The die switch opcode 1222 may include an ALE signal and CLE signal asserted at logic HIGH level (or, in another example, a DSO signal asserted at logic HIGH level) and accompanied by address code 1224. In the example of FIG. 12B, the address code 1224 may indicate operations are to shift to Die1. Responsive to the address code 1224 and the die switch opcode 1222, Die1 is enabled and Die0 and Die2 through Die7 are disabled. Once selected, data operations 1226 (e.g., command sequencing 1226a and DIN/DOUT operations 1226b) are performed on Die1 only. All other dies do not process these commands, as shown by the dashed lines. Thus, Die0 and Die2 through Die7 are disabled and do not consume current while idle.

Figure 13:
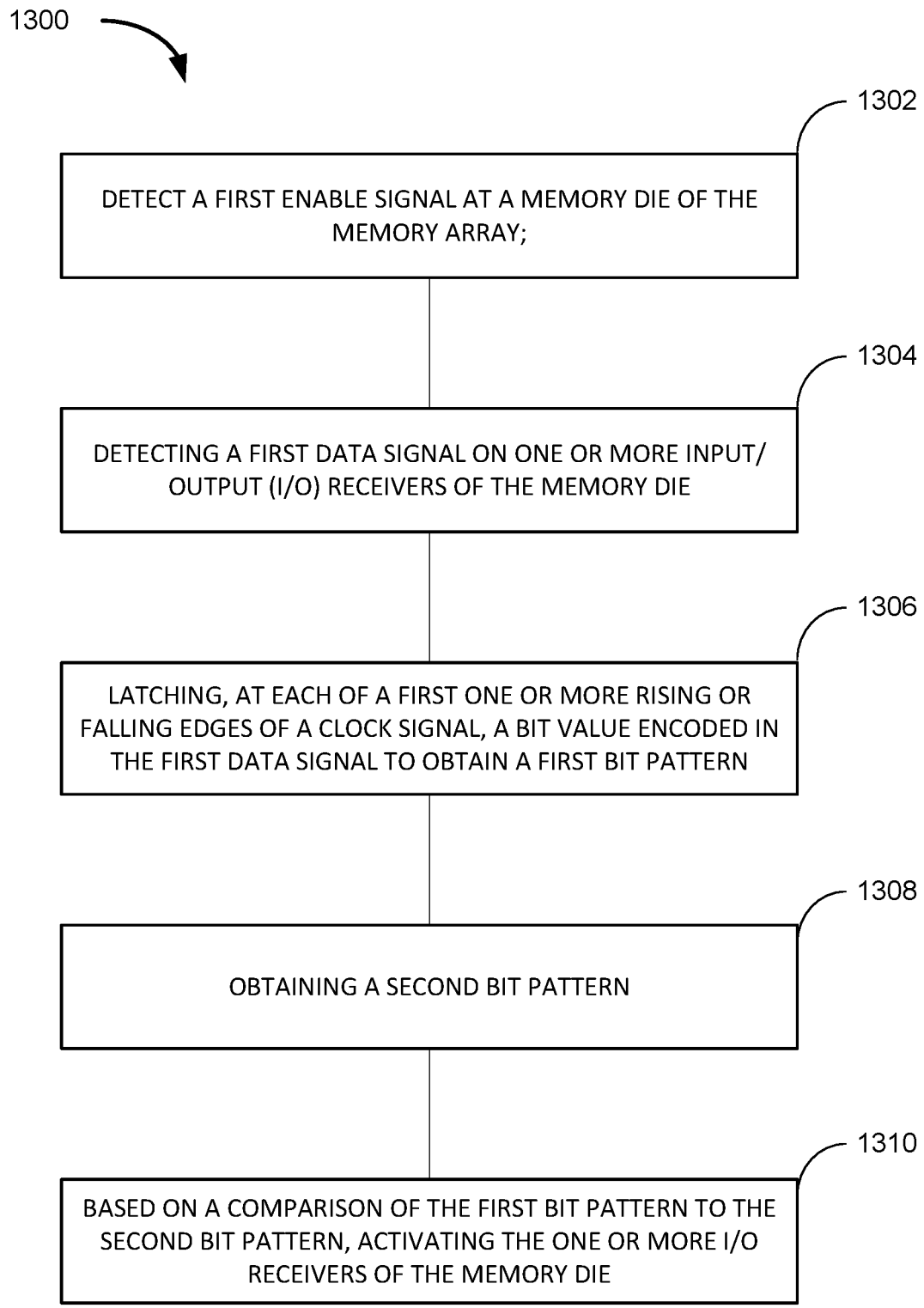
FIG. 13 is a flowchart illustrating an example method that can be performed to implement various features of example embodiments of the disclosed technology.

FIG. 13 shows example steps of a method 1300 that can be performed by a storage controller (e.g., the storage controller 102 (FIG. 1), the storage controller 802 (FIGS. 8 and 9) or an external controller) and/or memory dies (e.g., memory die 104a (FIG. 1) or memory die 804a (FIGS. 8A-9) to selectively activate or disable one or more memory dies of a memory array as described connection with FIGS. 8A-10. For example, the storage controller can fetch, decode, and/or execute one or more instructions for performing various steps of the method 1300. Various instructions (e.g., for performing one or more steps described herein) can be stored in non-transitory storage medium of storage controller and/or control circuit of memory dies (e.g., control circuit 214 of FIG. 2A), where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of the storage controller may be encoded with executable instructions, for example, instructions for executing steps of the method 1300. Non-transitory media is distinct from but may be used in conjunction with transmission media. Transmission media participates in transferring information between non-transitory media. For example, transmission media includes coaxial cables, copper wire and fiber optics, including the wires that comprise bus between the storage controller and a host. Transmission media can also take the form of acoustic or light waves, such as those generated during radio-wave and infra-red data communications.

The method 1300 may comprise a method selectively activate or disable one or more memory dies of a memory array. The memory array, such as memory array 202 of FIG. 2A, may include a plurality of memory dies. Each memory die can include pins or receivers, such as I/O[0:n] pins 826 and enable signal pins (e.g., CLE, ALE, etc.) of FIGS. 8A-9 to name of few examples, over which signals may be received from a storage controller and/or transmitted to the storage controller.

At step 1302 of the method 1300, a first enable signal is detected at a memory die of a memory array. For example, a memory die 804a detects at least one of a CLE signal and ALE or a DSO signal at logic HIGH level. In another example, the memory die 804a detects both the CLE and the ALE signal at logic high level.

At step 1304, a first data signal is detected on one or more I/O receivers of the memory die. For example, DQ signals may be detected on I/O[0:n]x pins (or receivers) 826 of the memory die 804a.

At step 1306, responsive to detecting at least the first enable signal, a bit value encoded in the first data signal is latched, at each of a first one or more rising or falling edges of a clock signal, to obtain a first bit pattern. For example, the DQ signals may be encoded with I/O data including at least address data as a first bit pattern and the memory die 804a may execute CA latch 838 to latch bit values encoded in the DQ signal. In some embodiments, the first enable signal is a DSO signal and the bit values are latched responsive to the DSO signal set to logic HIGH level. In another embodiment, detecting at least the first enable signal comprises detecting the CLE and ALE signal set to logic HIGH level. In this case, the bit values are latched responsive to at detecting at least one of the ALE and CLE signal. More particularly, bit values are latched responsive to detecting both ALE and ALE signals set to logic HIGH level, simultaneously.

At step 1308, a second bit pattern is obtained. For example, a CADD may be obtained as a second bit pattern. In various embodiments, the CADD is hard coded into the memory die 804a.

At step 1310, based on a comparison of the first bit pattern to the second bit pattern, the one or more I/O receivers of the memory die are activated. For example, the die enable decoder block 846 receives the first and second bit patterns (e.g., address code from the first data signal and the CADD), decodes the bit patterns into a form understood by the die enable decoder block 846, and compares the address code to the CADD. Based on the comparison, the I/O[0:n]x pins 826 of the memory die 804a are activated for data operations (e.g., command/address sequencing and/or DIN/DOUT operations), such as described in connection with FIGS. 8D and 8E. For example, where a determination is made that the memory die identified by the CADD is one of the one or more memory dies indicated in the address code, the I/O[0:n]x pins 826 are activated. Conversely, where a determination is made that the memory die identified by the CADD is different than the one or more memory dies indicated in the address code, the I/O[0:n]x pins 826 are deactivated.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system XYZ00.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method for selectively activating or deactivating one or more memory dies of a memory array, comprising:
    detecting a first enable signal at a memory die of the memory array;
    detecting a first data signal on one or more input/output (I/O) receivers of the memory die;
    responsive to detecting at least the first enable signal, latching, at each of a first one or more rising or falling edges of a clock signal, a bit value encoded in the first data signal to obtain a first bit pattern;
    obtaining a second bit pattern; and
    based on a comparison of the first bit pattern to the second bit pattern, activating the one or more I/O receivers of the memory die.

2. The method of claim 1, further comprising:
    detecting a second enable signal at the memory die,
    wherein latching the bit value encoded in the first data signal to obtain the first bit pattern is responsive to detecting the first and second enable signals.

3. The method of claim 2, wherein the first enable signal is a command latch enable signal asserted at a logic HIGH level and the second enable signal is an address latch enable signal asserted at a logic HIGH level.

4. The method of claim 2, further comprising comparing the first bit pattern to the second bit pattern responsive to detecting the first and second enable signals.

5. The method of claim 1, further comprising:
    decoding the first bit pattern to obtain an address code indicative of one or more memory dies of the memory array; and
    decoding the second bit pattern to obtain a chip address that identifies the memory die.

6. The method of claim 5, further comprising:
    determining that the memory die identified by the chip address is one of the one or more memory dies indicated in the address code by comparing the address code to the chip address,
    wherein activating the one or more I/O receivers of the memory die is responsive to the determination.

7. The method of claim 5, further comprising:
    determining that the memory die identified by the chip address is different than the one or more memory dies indicated in the address code by comparing the address code to the chip address; and
    deactivating the one or more I/O receivers of the memory die responsive to the determination.

8. The method of claim 1, wherein enabling the one or more I/O receivers comprises latching a status bit value into a register on the memory die, the method further comprising:
    detecting a third enable signal at the memory die;
    obtaining the status bit value from the register;
    responsive to detecting at least the third enable signal and obtaining the status bit value, detecting a second data signal on the I/O receivers; and
    decoding a bit pattern obtained from the second data signal as I/O data.

9. The method of claim 1, wherein the second bit pattern is hard coded into the memory die.

10. A memory die, comprising:
    one or more input/output (I/O) receivers;
    a first enable signal receiver; and
    a control circuit configured to:
        detect a first enable signal, receiver from a storage controller, on the first enable signal;
        detect a first data signal on the one or more input/output (I/O) receivers;
        responsive to detecting at least the first enable signal, latch, at each of a first one or more rising or falling edges of a clock signal, a bit value encoded in the first data signal to obtain a first bit pattern;
        obtain a second bit pattern; and
        based on a comparison of the first bit pattern to the second bit pattern, activate the one or more I/O receivers.

11. The memory die of claim 10, further comprising:
    a second enable signal receiver,
    wherein the control circuit is further configured to:
        detect a second enable signal, from the storage controller, on the second enable signal receiver,
        wherein latching the bit value encoded in the first data signal to obtain the first bit pattern is responsive to detecting the first and second enable signals.

12. The memory die of claim 11, wherein the first enable signal is a command latch enable signal asserted at a logic HIGH level and the second enable signal is an address latch enable signal asserted at a logic HIGH level.

13. The memory die of claim 11, wherein the control circuit is further configured to compare the first bit pattern to the second bit pattern responsive to detecting the first and second enable signals.

14. The memory die of claim 10, wherein the control circuit is further configured to:
    decode the first bit pattern to obtain an address code indicative of one or more memory dies; and
    decode the second bit pattern to obtain a chip address that identifies the memory die.

15. The memory die of claim 14, wherein the control circuit is further configured to:
    determine that the memory die identified by the chip address is one of the one or more memory dies indicated in the address code by comparing the address code to the chip address,
    wherein activating the one or more I/O receivers of the memory die is responsive to the determination.

16. The memory die of claim 14, wherein the control circuit is further configured to:
    determine that the memory die identified by the chip address is different than the one or more memory dies indicated in the address code by comparing the address code to the chip address; and
    deactivate the one or more I/O receivers of the memory die responsive to the determination.

17. The memory die of claim 10, wherein enabling the one or more I/O receivers comprises latching a status bit value into a register on the memory die, wherein the control circuit is further configured to:
    detect a third enable signal;
    obtain the status bit value from the register;
    responsive to detecting at least the third enable signal and obtaining the status bit value, detect a second data signal on the I/O receivers; and
    decode a bit pattern obtained from the second data signal as I/O data.

18. The memory die of claim 10, wherein the second bit pattern is hard coded into the memory die.

19. A memory device, comprising:
   one or more signal generators configured to generate a first enable signal and a clock signal; and
   a memory array comprising a plurality of memory dies, each memory die comprising a control circuit configured to:
      detect a first enable signal asserted at a first logic level and a second enable signal asserted at the first logic level;
      responsive to detecting the first and second enable signals:
         detect a first data signal over input/out (I/O) pins;
         decode a first bit pattern encoded into the first data signal to obtain an address code indicative of one or more memory dies of the memory array;
         decode a second bit pattern hardcoded into the respective memory die to obtain a chip address of the respective memory die;
         determine whether the respective memory die is one of the one or more memory dies indicated in the address code; and
         enable or disable the respective memory die based on the determination.

20. The memory device of claim 19, wherein enabling the respective memory die comprises activating the I/O pins for performing data operations on the memory die, and wherein disabling the respective memory die deactivating the I/O pins.

* * * * *